(12) United States Patent
Hoshino

(10) Patent No.: US 11,402,753 B2
(45) Date of Patent: Aug. 2, 2022

(54) POSITIVE RESIST COMPOSITION, RESIST FILM FORMATION METHOD, AND LAMINATE MANUFACTURING METHOD

(71) Applicant: ZEON CORPORATION, Chiyoda-ku Tokyo (JP)

(72) Inventor: Manabu Hoshino, Tokyo (JP)

(73) Assignee: ZEON CORPORATION, Chiyoda-ku Tokyo (JP)

( * ) Notice: Subject to any disclaimer, the term of this patent is extended or adjusted under 35 U.S.C. 154(b) by 151 days.

(21) Appl. No.: 16/643,846

(22) PCT Filed: Aug. 23, 2018

(86) PCT No.: PCT/JP2018/031212
§ 371 (c)(1),
(2) Date: Mar. 3, 2020

(87) PCT Pub. No.: WO2019/065017
PCT Pub. Date: Apr. 4, 2019

(65) Prior Publication Data
US 2020/0257198 A1    Aug. 13, 2020

(30) Foreign Application Priority Data

Sep. 29, 2017  (JP) .............................. JP2017-191620

(51) Int. Cl.
*G03F 7/039*  (2006.01)
*G03F 7/038*  (2006.01)
(Continued)

(52) U.S. Cl.
CPC ............ *G03F 7/0046* (2013.01); *G03F 7/038* (2013.01); *G03F 7/039* (2013.01); *G03F 7/20* (2013.01); *G03F 7/38* (2013.01)

(58) Field of Classification Search
CPC .......... G03F 7/004; G03F 7/0046; G03F 7/20; G03F 7/38
See application file for complete search history.

(56) References Cited

U.S. PATENT DOCUMENTS 4,454,222 A * 6/1984 Tada ....................... G03F 7/325
                                                        430/270.1
6,645,695 B2 * 11/2003 Zampini ............... G03F 7/0045
                                                        430/270.1
(Continued)

FOREIGN PATENT DOCUMENTS

JP  57-118243   * 7/1982
JP  61-170735   * 8/1986
(Continued)

OTHER PUBLICATIONS

Machine translation of WO 99/62964 (Dec. 1999).*
(Continued)

*Primary Examiner* — Martin J Angebranndt
(74) *Attorney, Agent, or Firm* — Kenja IP Law PC

(57) ABSTRACT

Provided is a positive resist composition capable of improving the adhesion between a resist film formed through pre-baking and a workpiece and reducing changes in the molecular weight of the polymer in the resist film before and after pre-baking step over broader ranges of heating temperature and heating time (at lower heating temperatures) during pre-baking. The positive resist composition comprises a polymer and a solvent, wherein the polymer has a monomer unit (A) represented by the following general formula (I) and a monomer unit (B) represented by the following general formula (II), and wherein the solvent is at
(Continued)

least one selected from the group consisting of isoamyl acetate, n-butyl formate, isobutyl formate, n-amyl formate, and isoamyl formate:

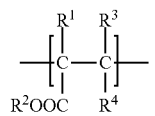

(I)

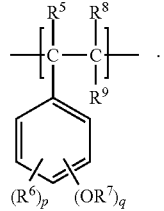

(II)

10 Claims, 11 Drawing Sheets

(51) Int. Cl.
*G03F 7/38* (2006.01)
*G03F 7/20* (2006.01)
*G03F 7/004* (2006.01)

(56) References Cited

U.S. PATENT DOCUMENTS

| 11,215,925 | B2* | 1/2022 | Hoshino | G03F 7/168 |
| 2010/0203450 | A1* | 8/2010 | Fujiwara | C08F 220/22 |
| | | | | 430/285.1 |
| 2017/0285482 | A1 | 10/2017 | Tsuchihashi et al. | |
| 2019/0056664 | A1* | 2/2019 | Hoshino | G03F 7/0046 |
| 2020/0073240 | A1* | 3/2020 | Hoshino | G03F 7/325 |
| 2021/0026244 | A1* | 1/2021 | Hoshino | C08F 212/20 |
| 2021/0072643 | A1* | 3/2021 | Hoshino | G03F 7/039 |
| 2021/0214481 | A1* | 7/2021 | Hoshino | G03F 7/039 |

FOREIGN PATENT DOCUMENTS

| JP | H083636 B2 | | 1/1996 |
| JP | 5938536 B | * | 5/2016 |
| TW | 201209092 A1 | | 3/2012 |
| TW | 201405249 A | | 2/2014 |
| TW | 201627780 A | | 8/2016 |
| WO | 99/62964 | * | 12/1999 |
| WO | 2016/132722 | * | 8/2016 |
| WO | 2017/130870 | * | 8/2017 |
| WO | 2018/069274 | * | 4/2018 |

OTHER PUBLICATIONS

Machine transalation of JP 61-170735 ( Aug. 1986).*
Machine translation of JP 5938536B (May 2016).*
Machine translation of WO 2016/132722 (Aug. 2016).*
Mar. 31, 2020, International Preliminary Report on Patentability issued in the International Patent Application No. PCT/JP2018/031212.

* cited by examiner

POSITIVE RESIST COMPOSITION, RESIST FILM FORMATION METHOD, AND LAMINATE MANUFACTURING METHOD

TECHNICAL FIELD

The present disclosure relates to a positive resist composition, a resist film formation method, and a laminate manufacturing method, and more particularly to a positive resist composition, a resist film formation method using the positive resist composition, and a laminate manufacturing method using the resin film formation method.

BACKGROUND

Polymers that display increased solubility in developers after undergoing main chain scission by irradiation with ionizing radiation such as electron beams or short-wavelength light such as ultraviolet light (hereinafter collectively referred to as "ionizing radiation etc.) have heretofore been used as main chain scission-type positive resists in fields such as semiconductor manufacturing.

PTL 1 discloses a highly sensitive main chain scission-type positive resist formed from an α-methylstyrene/methyl α-chloroacrylate copolymer which comprises an α-methylstyrene unit and a methyl α-chloroacrylate unit.

CITATION LIST

Patent Literature

PTL 1: JPH083636B

SUMMARY

Technical Problem

Resist film formation methods which use resist compositions may encounter the problems of an insufficient adhesion between the formed resist film and workpiece or reduced molecular weight of the polymer in the resist film in cases where the resist film has been formed by coating a resist composition onto a workpiece followed by pre-baking wherein the applied resist composition is heated. Failure to obtain a sufficient adhesion between the resist film and workpiece may cause separation of the resist film and reductions in the molecular weight of polymer may result in failure to form a pattern having a desired shape. Thus, resist film formation processes have been required to provide a sufficient adhesion between the resist film formed through pre-baking and the workpiece and to reduce changes in the molecular weight of the polymer in the resist film before and after pre-baking.

However, resist film formation methods which use a positive resist made of the α-methylstyrene/methyl α-chloroacrylate copolymer described in PTL 1 have the problems of failing to provide a sufficient adhesion between the resist film formed through pre-baking and the workpiece and/or to sufficiently reduce changes in the molecular weight of the polymer in the resist film before and after pre-baking.

In order to solve the above-mentioned problems, for example, it has been investigated to use n-hexyl acetate or other solvents to improve the adhesion between the resist film formed through pre-baking and the workpiece and to reduce changes in the molecular weight of the polymer in the resist film before and after pre-baking. Use of such solvents has been found to improve the adhesion between the resist film formed through pre-baking and the workpiece and to reduce changes in the molecular weight of the polymer in the resist film before and after pre-baking. Nevertheless, the ranges of heating temperature and heating time during pre-baking in which the adhesion can be improved and the changes in the molecular weight of polymer can be reduced are narrow.

It is therefore an object of the present disclosure to provide a positive resist composition capable of improving the adhesion between a resist film formed through pre-baking and a workpiece and reducing changes in the molecular weight of the polymer in the resist film before and after pre-baking over broader ranges of heating temperature and heating time (at lower heating temperatures) during pre-baking.

It is another object of the present disclosure to provide a resist film formation method capable of improving the adhesion between a resist film formed through pre-baking and a workpiece and reducing changes in the molecular weight of the polymer in the resist film before and after pre-baking.

It is another object of the present disclosure to provide a method for manufacturing a laminate in which the adhesion between a resist film formed through pre-baking and a light-shielding layer is high and in which reductions in the molecular weight of the polymer in resist film have been reduced.

Solution to Problem

The inventor conducted diligent investigation to achieve the objects set forth above. The present inventor has established that a main chain scission type positive resist composition which comprises a predetermined polymer having a predetermined monomer unit and a predetermined solvent can improve the adhesion between a resist film formed through pre-baking and a workpiece and reduce changes in the molecular weight of the polymer in the resist film before and after pre-baking over broader ranges of heating temperature and heating time (at lower heating temperatures) during pre-baking. The inventor thus completed the present disclosure.

The present disclosure aims to advantageously solve the above-mentioned problems, and a positive resist composition of the present disclosure is a positive resist composition which comprises a polymer and a solvent, wherein the polymer comprises a monomer unit (A) represented by the following general formula (I) and a monomer unit (B) represented by the following general formula (II):

where $R^1$ is a chlorine atom, a fluorine atom or an alkyl group substituted with a fluorine atom, $R^2$ is an unsubstituted alkyl group or an alkyl group substituted with a fluorine atom, $R^3$ and $R^4$ are a hydrogen atom, a fluorine atom, an unsubstituted alkyl group or an alkyl group substituted with a fluorine atom and may be the same or different,

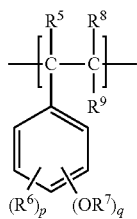

(II)

where $R^5$, $R^6$, $R^8$ and $R^9$ are a hydrogen atom, a fluorine atom, an unsubstituted alkyl group or an alkyl group substituted with a fluorine atom, and may be the same or different, $R^7$ is a hydrogen atom, an unsubstituted alkyl group or an alkyl group substituted with a fluorine atom, p and q are an integer of 0 or more and 5 or less, and p+q=5;

at least one of the monomer unit (A) and the monomer unit (B) has one or more fluorine atoms; and the solvent is at least one selected from the group consisting of isoamyl acetate, n-butyl formate, isobutyl formate, n-amyl formate, and isoamyl formate.

A main chain scission type positive resist composition which comprises a predetermined polymer having a predetermined monomer unit and a predetermined solvent can improve the adhesion between a resist film formed through pre-baking and a workpiece and reduce changes in the molecular weight of the polymer in the resist film before and after pre-baking over broader ranges of heating temperature and heating time (at lower heating temperatures) during pre-baking.

In present disclosure, when p in the formula (II) is 2 or more, a plurality of $R^6$ may be the same or different, and when q in the formula (II) is 2 or more, a plurality of $R^7$ may be the same or different.

In the positive resist composition of the present disclosure, it is preferable that $R^1$ is a chlorine atom. When $R^1$ of the monomer unit (A) is a chlorine atom, scission properties of the main chain of the polymer when irradiated with ionizing radiation etc. can be improved, whereby a favorable positive resist film can be obtained. Polymers in which $R^1$ of the monomer unit (A) is a chlorine atom are easy to prepare.

In the positive resist composition of the present disclosure, it is preferable that $R^2$ is an alkyl group substituted with a fluorine atom and $R^3$ and $R^4$ are a hydrogen atom or an unsubstituted alkyl group. When $R^2$ of the monomer unit (A) is an alkyl group substituted with a fluorine atom and $R^3$ and $R^4$ are a hydrogen atom or an unsubstituted alkyl group, scission properties of the main chain of the polymer when irradiated with ionizing radiation etc. can be improved, whereby a favorable positive resist film can be obtained. Note that $R^3$ and $R^4$ may be the same or different.

In the positive resist composition of the present disclosure, it is preferable that p is an integer of 1 or more and 5 or less, $R^5$ and $R^7$ to $R^9$ are a hydrogen atom or an unsubstituted alkyl group, and the monomer unit (A) has one or more fluorine atoms. When p of the monomer unit (B) is an integer of 1 or more and 5 or less, $R^5$ and $R^7$ to $R^9$ are a hydrogen atom or an unsubstituted alkyl group, and the monomer unit (A) comprises one or more fluorine atoms, the polymer can be easily prepared, and scission properties of the main chain of the polymer when irradiated with ionizing radiation etc. can be improved, whereby a favorable positive resist film can be obtained.

In the positive resist composition of the present disclosure, it is preferable that the number of fluorine atoms in the monomer unit (B) is 0 or 1. When the number of fluorine atoms in the monomer unit (B) is 0 or 1, a favorable positive resist film can be obtained.

In the positive resist composition of the present disclosure, it is preferable that $R^2$ is a pentafluoroalkyl group. When $R^2$ of the monomer unit (A) is a pentafluoroalkyl group, patterns with improved clarity can be formed while sufficiently improving sensitivity.

In the positive resist composition of the present disclosure, it is preferable that $R^2$ is 2,2,3,3,3-pentafluoropropyl group. When $R^2$ of the monomer unit (A) is 2,2,3,3,3-pentafluoropropyl group, patterns with further improved clarity can be formed while sufficiently improving sensitivity.

In the positive resist composition of the present disclosure, it is preferable that the monomer unit (B) is a structural unit derived from α-methylstyrene or a structural unit derived from 4-fluoro-α-methylstyrene. When the monomer unit (B) is a structural unit derived from α-methylstyrene, the ease of polymer preparation can be improved, and also favorable positive resist film can be obtained. When the monomer unit (B) is a structural unit derived from 4-fluoro-α-methylstyrene, patterns with a reduced likelihood of collapse can be formed.

The present disclosure aims to advantageously solve the above-mentioned problems, and a resist film formation method of the present disclosure is a resist film formation method for forming a resist film by using any of the above-mentioned positive resist compositions, the method comprising:

a coating step wherein the positive resist composition is applied onto a workpiece; and a pre-baking step wherein the positive resist composition applied is heated, wherein heating in the pre-baking step is performed at temperature T (° C.) for time t (min) which meet the following Expression (1):

$$(-\tfrac{1}{4}) \times T + 32.5 \le t \le (-\tfrac{1}{4}) \times T + 55 \qquad (1).$$

When the pre-baking step is performed under a predetermined condition using a predetermined polymer having predetermined monomer units and a predetermined solvent, it is possible to improve the adhesion between a resist film formed through the pre-baking step and a workpiece and to sufficiently reduce changes in the molecular weight of the polymer in the resist film before and after the pre-baking step.

In the resist film formation method of the present disclosure, it is preferable that the time is 1 minute or more and 30 minutes or less. When the time for heating in the pre-baking step is 1 minute or more and 30 minutes or less, the adhesion between the resist film formed through the pre-baking step and a workpiece can be more reliably improved, and also changes in the molecular weight of the polymer in resist film before and after the pre-baking step can be more reliably reduced.

The present disclosure aims to advantageously solve the above-mentioned problems, and a laminate manufacturing method of the present disclosure is a method of manufacturing a laminate which comprises a substrate, a light-shielding layer formed on the substrate, and a resist film formed on the light-shielding layer, wherein the resist film is formed by any of the resist formation methods described above. When the resist film is formed by any of the resist film formation methods described above, it is possible to obtain a laminate in which the adhesion between the resist film formed through the pre-baking step and the light-shielding layer is high and in which reductions in the molecular weight of the polymer in resist film have been prevented.

Advantageous Effect

According to the positive resist composition of the present disclosure, it is possible to improve the adhesion between a resist film formed through pre-baking and a workpiece and reduce changes in the molecular weight of the polymer in the resist film before and after pre-baking over broader ranges of heating temperature and heating time (at lower heating temperatures) during pre-baking.

According to the present disclosure, it is possible to improve the adhesion between a resist film formed through pre-baking and a workpiece and to reduce changes in the molecular weight of the polymer in the resist film before and after pre-baking.

According to the present disclosure, it is possible to improve the adhesion between a resist film formed through pre-baking and a light-shielding layer and to prevent reductions in the molecular weight of the polymer in resist film before and after pre-baking.

DETAILED DESCRIPTION

Figure 1:
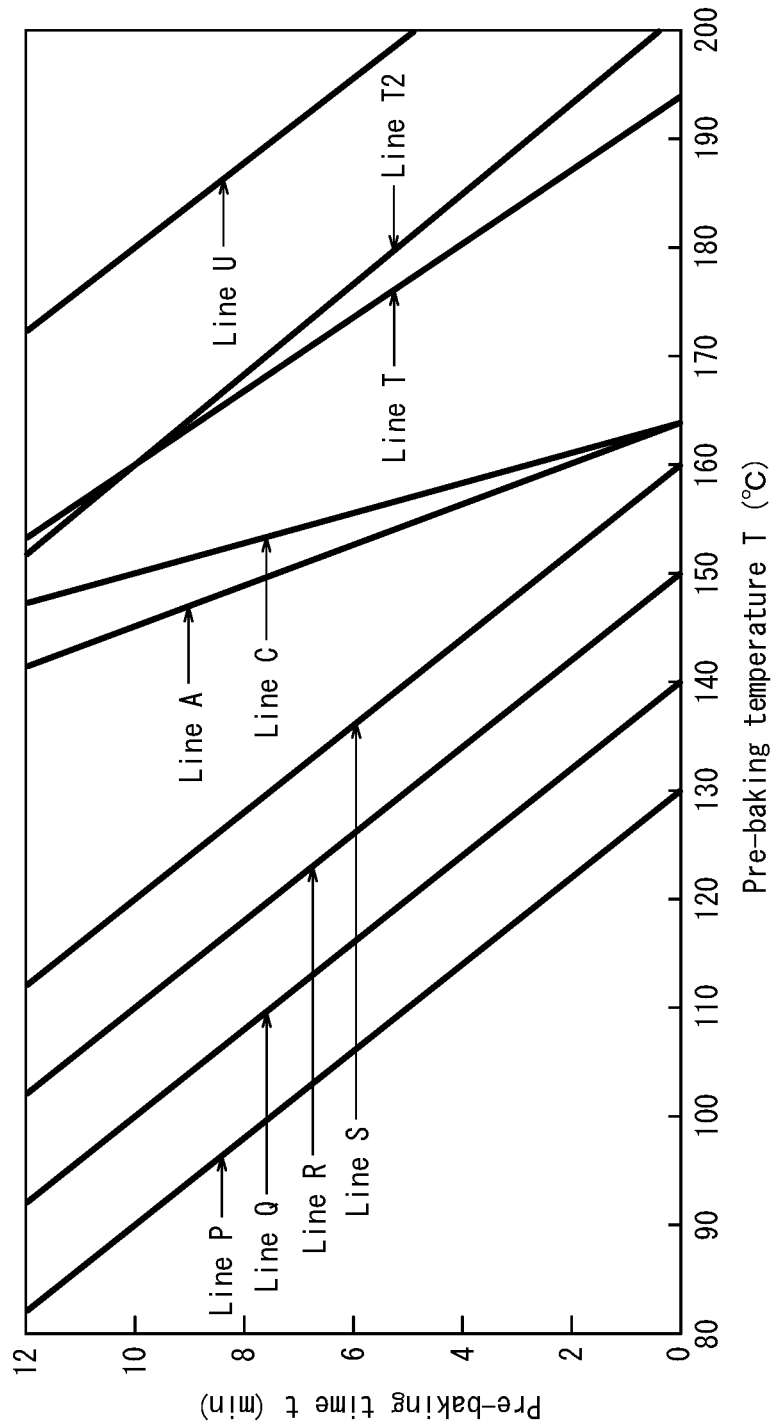
FIG. 1 shows a relationship between temperature T (° C.) and time t (min) in a pre-baking step in a resist film formation method using a positive resist composition of the present disclosure.

The following provides a detailed description of an embodiment of the present disclosure.

The resist composition of the present disclosure can be used in a resist film formation method of the present disclosure. The resist film formation method of the present disclosure enables to form a resist film used for forming a resist pattern in a manufacturing process of a printed board such as a build-up board. The laminate manufacturing method of the present disclosure enables to manufacture a laminate used for forming a resist pattern in a manufacturing process of a printed board such as a build-up board.

The polymer in the resist composition of the present disclosure can be suitably used as a main chain scission type positive resist in which the main chain of the polymer is cut by irradiation with ionizing radiation such as electron beams or extreme ultraviolet (EUV) laser or short-wavelength light such as ultraviolet light to reduce molecular weight.

(Positive Resist Composition)

The positive resist composition of the present disclosure contains a polymer and a solvent, and optionally further contains known additives which can be incorporated into resist compositions. Because the positive resist composition of the present disclosure contains a polymer described later as a positive resist, when used to form a resist pattern, it is possible to sufficiently reduce the generation of resist pattern collapse. In addition, by performing pre-baking under the condition described later, adhesion can be improved, so that decreases in the molecular weight of the polymer can be prevented.

The solid content concentration of the positive resist composition is preferably 1% by mass or more, more preferably 2% by mass or more, and particularly preferably 3% by mass or more, but preferably 20% by mass or less, more preferably 15% by mass or less, and particularly preferably 5% by mass or less.

<Polymer>

The polymer comprises a monomer unit (A) represented by the following general formula (I) and a monomer unit (B) represented by the following general formula (II):

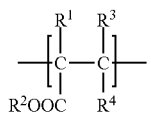

(I)

where $R^1$ is a chlorine atom, a fluorine atom or an alkyl group substituted with a fluorine atom, $R^2$ is an unsubstituted alkyl group or an alkyl group substituted with a fluorine atom, $R^3$ and $R^4$ are a hydrogen atom, a fluorine atom, an unsubstituted alkyl group or an alkyl group substituted with a fluorine atom and may be the same or different,

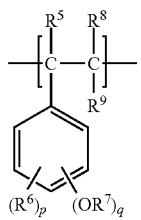

(II)

where $R^5$, $R^6$, $R^8$ and $R^9$ are a hydrogen atom, a fluorine atom, an unsubstituted alkyl group or an alkyl group substituted with a fluorine atom and may be the same or different, $R^7$ is a hydrogen atom, an unsubstituted alkyl group or an alkyl group substituted with a fluorine atom, p and q are an integer of 0 or more and 5 or less, and p+q=5.

In the polymer, at least one of the monomer unit (A) and the monomer unit (B) has one or more fluorine atoms. Specifically, in the polymer, the monomer unit (A) may have one or more fluorine atoms and the monomer unit (B) may not have a fluorine atom; the monomer unit (B) may have one or more fluorine atoms and the monomer unit (A) may not have a fluorine atom; or each of the monomer unit (A) and the monomer unit (B) may have one or more fluorine atoms.

The polymer may contain any monomer unit other than the monomer unit (A) and the monomer unit (B), but the proportion of the monomer unit (A) and the monomer unit (B) in the total monomer unit constituting the polymer is preferably 90 mol % or more, more preferably substantially 100 mol %, and more preferably 100 mol % (i.e., the polymer contains only the monomer unit (A) and the monomer unit (B)).

Because the polymer contains the predetermined monomer unit (A) and monomer unit (B), when irradiated with ionizing radiation etc. (e.g., electron beams, KrF laser, ArF laser, extreme ultraviolet (EUV) laser), the main chain of the polymer is cut and thereby the molecular weight is reduced. In addition, because at least one of the monomer unit (A) and the monomer unit (B) has one or more fluorine atoms in the polymer, when used as a resist, it exhibits high heat resistance at the time of pre-baking and therefore can be prevented from being decomposed, whereby its adhesion with a workpiece can be improved and the collapse of the resist pattern can be sufficiently prevented.

The reason why resist pattern collapse can be prevented by allowing at least one of the monomer unit (A) and the monomer unit (B) to have a fluorine atom is not clear. However, it is presumed that as a result of liquid repellency of the polymer being enhanced, it is possible to prevent pulling that arises between pattern lines during removal of a developer or rinsing liquid in the resist pattern formation process.

<Monomer Unit (A)>

The monomer unit (A) is a structural unit that is derived from a monomer (a) represented by the following general formula (III):

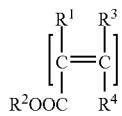

(III)

where $R^1$ to $R^4$ are as defined in the general formula (I) above.

The proportion of the monomer unit (A) in the total monomer unit constituting the polymer is not particularly limited and can be, for example, 30 mol % or more and 70 mol % or less, and is preferably 40 mol % or more and 60 mol % or less.

The alkyl group substituted with a fluorine atom, which can constitute $R^1$ to $R^4$ in the formula (I) and the formula (III), is not particularly limited and examples thereof include a group having a structure in which some or all of the hydrogen atoms of an alkyl group are replaced by fluorine atoms. The unsubstituted alkyl group which can constitute $R^2$ to $R^4$ in the formula (I) and the formula (III) is not particularly limited and examples thereof include an unsubstituted alkyl group having 1 to 10 carbon atoms. Among them, methyl group or ethyl group is preferable as the unsubstituted alkyl group which can constitute $R^2$ to $R^4$.

From the viewpoint of improving the main chain scission properties of the polymer when irradiated with ionizing radiation etc., R' in the formula (I) and the formula (III) is preferably a chlorine atom, a fluorine atom, or an alkyl group having 1 to 5 carbon atoms substituted with a chlorine atom or a fluorine atom, more preferably a chlorine atom, a fluorine atom or a perfluoromethyl group, even more preferably a chlorine atom or a fluorine atom, and particularly preferably a chlorine atom. The monomer (a) in which $R^1$ in the formula (III) is a chlorine atom is excellent in polymerizability, and a polymer having the monomer unit (A) in which $R^1$ in the formula (I) is a chlorine atom is also excellent in that it is easy to prepare.

In addition, from the viewpoint of improving the main chain scission properties of the polymer when irradiated with ionizing radiation etc., $R^2$ in the formula (I) and the formula (III) is preferably an alkyl group substituted with a fluorine atom, and more preferably an alkyl group having 1 to 10 carbons which is substituted with a fluorine atom.

Examples of alkyl groups having 1 to 10 carbon atoms substituted with a fluorine atom include 2,2,2-trifluoroethyl group, pentafluoroalkyl group such as 2,2,3,3,3-pentafluoropropyl group (5 fluorine atoms, 3 carbon atoms, structural formula X below), 2-(perfluorobutyl)ethyl group, 2-(perfluorohexyl)ethyl group, 1H,1H,3H-tetrafluoropropyl group, 1H,1H,5H-octafluoropentyl group, 1H,1H,7H-dodecafluoroheptyl group, 1H-1-(trifluoromethyl)trifluoroethyl group, 1H,1H,3H hexafluorobutyl group, and 1,2,2,2-tetrafluoro-1-(trifluoromethyl)ethyl group.

Among them, pentafluoroalkyl group is preferable, with 2,2,3,3,3-pentafluoropropyl group (5 fluorine atoms, 3 carbons, structural formula X below) being particularly preferable.

Structural Formula X

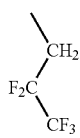

Furthermore, from the viewpoint of improving the main chain scission properties of the polymer when irradiated with ionizing radiation etc., $R^3$ and $R^4$ in the formulas (I) and (III) are each preferably a hydrogen atom or an unsubstituted alkyl group, more preferably a hydrogen atom or an unsubstituted alkyl group having 1 to 5 carbon atoms, and even more preferably a hydrogen atom.

The monomer (a) represented by the above formula (I) which can form the monomer unit (A) is not particularly limited and examples thereof include α-chloroacrylic acid fluoroalkyl esters such as 2,2,2-trifluoroethyl α-chloroacrylate, 2,2,3,3-pentafluoropropyl α-chloroacrylate, 2-(perfluorobutyl)ethyl α-chloroacrylate, 2-(perfluorohexyl)ethyl α-chloroacrylate, 1H, 1H,3H-tetrafluoropropyl α-chloroacrylate, 1H,1H,5H-octafluoropentyl α-chloroacrylate, 1H,1H,7H-dodecafluoroheptyl α-chloroacrylate, 1H-1-(trifluoromethyl)trifluoroethyl α-chloroacrylate, 1H, 1H,3H-hexafluorobutyl α-chloroacrylate, and 1,2,2,2-tetrafluoro-1-(trifluoromethyl)ethyl α-chloroacrylate; α-fluoroacrylic acid alkyl esters such as methyl α-fluoroacrylate and ethyl α-fluoroacrylate; α-fluoroalkyl acrylic acid alkyl esters such as methyl α-(trifluoromethyl)acrylate and ethyl α-(trifluoromethyl)acrylate; α-fluoroacrylic acid fluoroalkyl esters such as 2,2,2-trifluoroethyl α-fluoroacrylate, 2,2,3,3,3-pentafluoropropyl α-fluoroacrylate, 2-(perfluorobutyl)ethyl α-fluoroacrylate, 2-(perfluorohexyl)ethyl α-fluoroacrylate, 1H, 1H,3H-tetrafluoropropyl α-fluoroacrylate, 1H,1H,5H-octafluoropentyl α-fluoroacrylate, 1H,1H,7H-dodecafluoroheptyl α-fluoroacrylate, 1H-1-(trifluoromethyl) trifluoroethyl α-fluoroacrylate, 1H,1H,3H-hexafluorobutyl α-fluoroacrylate, and 1,2,2,2-tetrafluoro-1-(trifluoromethyl) ethyl α-fluoroacrylate.

From the viewpoint of further improving the main chain scission properties of the polymer when irradiated with ionizing radiation etc., the monomer unit (A) is preferably a structural unit derived from α-chloroacrylic acid fluoroalkyl ester, and is particularly preferably 2,2,3,3,3-pentafluoropropyl α-chloroacrylate. Thus, it is particularly preferred that $R^1$ to $R^4$ in the formulas (I) and (III) is an alkyl group in which $R^1$ is a chlorine atom, $R^2$ is an alkyl group substituted with a fluorine atom, and $R^3$ and $R^4$ are hydrogen atoms.

<Monomer Unit (B)>

The monomer unit (B) is a structural unit derived from a monomer (b) represented by the following general formula (IV):

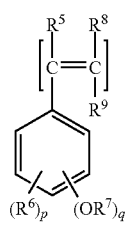

(IV)

wherein $R^5$ to $R^9$ and p and q are as defined in the formula (II).

The proportion of the monomer unit (B) in the total monomer unit constituting the polymer is not particularly limited and can be, for example, 30 mol % or more and 70 mol % or less, and preferably 40 mol % or more and 60 mol % or less.

The alkyl group substituted with a fluorine atom, which can constitute $R^5$ to $R^9$ in the formulas (II) and (IV) is not particularly limited and examples thereof include a group having a structure in which some or all of the hydrogen atoms of an alkyl group are replaced by fluorine atoms.

The unsubstituted alkyl group which can constitute $R^5$ to $R^9$ in the formula (II) and the formula (IV) is not particularly limited and examples thereof include an unsubstituted alkyl group having 1 to 5 carbon atoms. Among them, methyl group or ethyl group is preferable as an unsubstituted alkyl group which can constitute $R^5$ to $R^9$.

From the viewpoint of improving the ease of polymer preparation and the main chain scission properties of the polymer when irradiated with ionizing radiation etc., $R^5$ in the formulas (II) and (IV) is preferably a hydrogen atom or an unsubstituted alkyl group, more preferably an unsubstituted alkyl group having 1 to 5 carbon atoms, and even more preferably a methyl group.

All of the plurality of $R^7$ present in the formulas (II) and (IV) may be hydrogen atoms or unsubstituted alkyl groups, hydrogen atoms or unsubstituted alkyl groups having 1 to 5 carbon atoms, or hydrogen atoms. This makes it possible to improve the ease of polymer preparation and the main chain scission properties of the polymer when irradiated with ionizing radiation etc.

In the formulas (II) and (IV), p may be 5 and q may be 0, and all five $R^6$ may be hydrogen atoms or unsubstituted alkyl group, all five $R^6$ may be hydrogen atoms or unsubstituted alkyl groups having 1 to 5 carbons, or all five $R^6$ may be hydrogen atoms. This makes it possible to improve the ease of polymer preparation and the main chain scission properties of the polymer when irradiated with ionizing radiation etc.

On the other hand, from the viewpoint of further reducing the generation of resist pattern collapse when the polymer is used to form a resist pattern, it is preferable that the plurality of $R^6$ and/or $R^7$ present in the formula (II) and the formula (IV) has a fluorine atom or an alkyl group substituted with a fluorine atom, more preferably has a fluorine atom or an alkyl group having 1 to 5 carbons which is substituted with a fluorine atom. It is particularly preferable that the number of fluorine atoms in $R^6$ and/or $R^7$ is 1.

Further, from the viewpoint of improving the ease of polymer preparation and the main chain scission properties of the polymer when irradiated with ionizing radiation etc., $R^8$ and $R^9$ in the formulas (II) and (IV) are each preferably a hydrogen atom or an unsubstituted alkyl group, more preferably a hydrogen atom or an unsubstituted alkyl group having 1 to 5 carbons, and even more preferably a hydrogen atom.

The monomer (b) represented by the above formula (IV), which can form the monomer unit (B) represented by the above formula (II), is not particularly limited and examples thereof include α-methylstyrene and derivatives thereof such as the following (b-1) to (b-11).

The number of fluorine atoms in the monomer unit (B) is preferably 0 or 1.

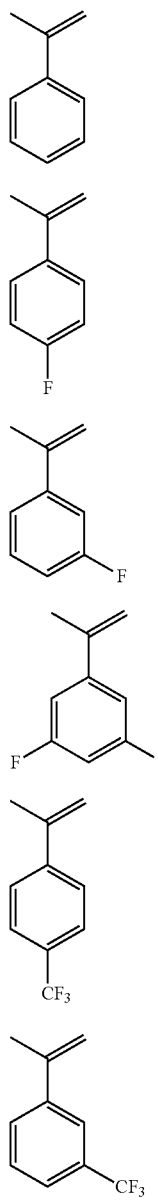

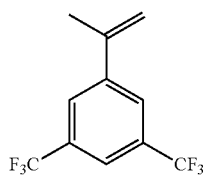

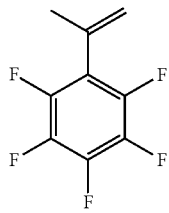

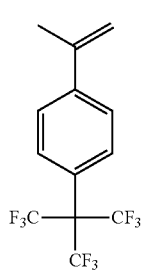

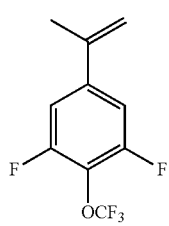

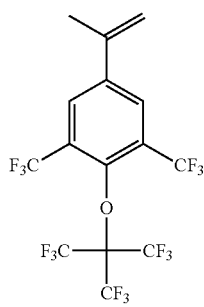

From the viewpoint of improving the ease of polymer preparation and the main chain scission properties of the polymer when irradiated with ionizing radiation etc., the monomer unit (B) preferably does not have a fluorine atom (i.e., only the monomer unit (A) has a fluorine atom), and more preferably is a structural unit derived from α-methylstyrene. That is, it is particularly preferred that $R^5$ to $R^9$ p and q in the formulas (II) and (IV) are such that p=5, q=0, $R^5$ is methyl group, all the five $R^6$ are hydrogen atoms, and $R^8$ and $R^9$ are hydrogen atoms.

On the other hand, from the viewpoint of further reducing the generation of resist pattern collapse when the polymer is used for forming a resist pattern, it is preferable that the monomer unit (B) has fluorine atom(s), more preferable that it has one fluorine atom, particularly preferable that it is a structural unit derived from fluoro-α-methyl styrene, and most preferable that it is a structural unit derived from 4-fluoro-α-methyl styrene, i.e., $R^5$ to $R^9$ and p and q in the formulas (II) and (IV) are such that p=5, q=0, $R^5$ is methyl group, among five $R^6$ only the para-position is fluorine with the other four $R^6$ being hydrogen atoms, and $R^8$ and $R^9$ are hydrogen atoms.

<<Properties of Polymer>>

Hereinafter, the properties of the polymer used in the resist film formation method of the present disclosure, i.e., the "weight average molecular weight (Mw)", "number average molecular weight (Mn)" and "molecular weight distribution (Mw/Mn)" of the polymer prior to heating in the pre-baking step will be described.

Herein, the "weight average molecular weight (Mw)" and "number average molecular weight (Mn)" can be measured by gel permeation chromatography. Herein, "molecular weight distribution (Mw/Mn)" refers to the ratio of weight average molecular weight (Mw) to number average molecular weight (Mn).

[Weight Average Molecular Weight]

The weight average molecular weight (Mw) of the polymer having the monomer unit (A) and the monomer unit (B) described above can be, for example, 20,000 or more and 150,000 or less. The weight average molecular weight of the polymer is preferably less than 100,000, more preferably less than 60,000, but preferably 30,000 or more. When the weight average molecular weight (Mw) of the polymer is not more than (less than) any of the upper limits set forth above, the solubility of the polymer in a developer can be increased through a comparatively low irradiation dose when the polymer is used as a positive resist, and consequently sensitivity can be improved to an appropriate level when the polymer is used as a positive resist. Moreover, when the weight average molecular weight (Mw) of the polymer is at least any of the lower limits set forth above, it is possible to prevent increases in the solubility of the resist film in a developer through an excessively low irradiation dose and prevent excessive γ value reduction."

[Number Average Molecular Weight]

The number average molecular weight (Mn) of the polymer cab be, for example, 10,000 or more and 100,000 or less. The number average molecular weight of the polymer is preferably less than 80,000, more preferably less than 50,000. When the number average molecular weight (Mn) of the polymer is not more than (less than) any of the upper limits set forth above, sensitivity can be further increased when a resist formed using a positive resist composition containing the polymer is used as a positive resist.

[Molecular Weight Distribution]

The molecular weight distribution (Mw/Mn) of the polymer can be, for example, 2.50 or less. Further, the molecular weight distribution (Mw/Mn) of the polymer is preferably 1.20 or more, more preferably 1.30 or more, particularly preferably 1.35 or more, but preferably 2.40 or less, more preferably 1.75 or less, still more preferably 1.60 or less, and still even more preferably 1.55 or less. When the molecular weight distribution (Mw/Mn) of the polymer is at least any of the lower limits set forth above, the polymer is easier to produce. Moreover, when the molecular weight distribution (Mw/Mn) of the polymer is not more than any of the upper limits set forth above, it is possible to increase the γ value when the polymer is used as a positive resist and increase the clarity of the resulting resist pattern.

<<Method of Preparing Polymer>>

The polymer including the monomer unit (A) and the monomer unit (B) set forth above can be produced, for example, by carrying out polymerization of a monomer composition that contains the monomer (a) and the monomer (b), and then optionally purifying the obtained polymerized product.

The composition, molecular weight distribution, weight average molecular weight, and number average molecular weight of the polymer can be adjusted by altering the polymerization conditions and the purification conditions. In one specific example, the composition of the polymer can be adjusted by altering the percentage content of each monomer in the monomer composition used in polymerization. In another example, the weight average molecular weight and the number average molecular weight can be reduced by raising the polymerization temperature. In yet another example, the weight average molecular weight and the number average molecular weight can be reduced by shortening the polymerization time.

[Polymerization of Monomer Composition]

The monomer composition used in production of the polymer may be a mixture containing a monomer component that includes the monomer (a) and the monomer (b), an optional solvent, a polymerization initiator, and optionally added additives. Polymerization of the monomer composition may be carried out by known methods. Cyclopentanone or the like is preferably used as the solvent and a radical polymerization initiator such as azobisisobutyronitrile is preferably used as the polymerization initiator.

A polymerized product obtained through polymerization of the monomer composition may, without any specific limitations, be collected by adding a good solvent such as tetrahydrofuran to a solution containing the polymerized product and subsequently dripping the solution to which the good solvent has been added into a poor solvent such as methanol to coagulate the polymerized product.

<<Purification of Polymer>>

The method of purification in a case in which the obtained polymerized product is purified may be, but is not specifically limited to, a known purification method such as re-precipitation or column chromatography. Of these purification methods, purification by re-precipitation is preferable.

Purification of the polymerized product may be repeated multiple times.

Purification of the polymerized product by re-precipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to precipitate a portion of the polymerized product. When purification of the polymerized product is carried out by dripping a solution of the polymerized product into a mixed solvent of a good solvent and a poor solvent as described above, the molecular weight distribution, weight average molecular weight, and number average molecular weight of the resultant polymer can easily be adjusted by altering the types and/or mixing ratio of the good solvent and the poor solvent. In one specific example, the molecular weight of polymer that precipitates in the mixed solvent can be increased by increasing the proportion of the good solvent in the mixed solvent.

When the polymerized product is purified by the reprecipitation method, a polymerized product precipitated in a mixed solvent of good solvent and poor solvent may be used as the polymer, or a polymerized product which was not precipitated in the mixed solvent (i.e., polymerized product dissolved in the mixed solvent) may be used as the polymer. The polymerized product not precipitated in the mixed solvent can be collected from the mixed solvent by known techniques such as concentration to dryness.

<Solvent>

As the solvent, at least one solvent selected from the group consisting of: isoamyl acetate (boiling point: 142° C.; surface tension: 24.6 mN/m); n-butyl formate (boiling point: 107° C.; surface tension: 25 mN/m); isobutyl formate (boiling point: 98.4° C.; surface tension: 23.7 mN/m); n-amyl formate (boiling point: 132° C.; surface tension: 26 mN/m); and isoamyl formate (boiling point: 124° C.; surface tension: 24.6 mN/m) can be used.

By using such a solvent, even when the polymer having the monomer unit (A) and the monomer unit (B) is used as a positive resist, the adhesion between a resist film formed through pre-baking and a workpiece can be improved and changes in the molecular weight of the polymer in the resist film before and after pre-baking can be reduced over broader ranges of heating temperature and heating time (at lower heating temperatures) during pre-baking.

Among the foregoing solvents, from the viewpoint of improving the film thickness accuracy of the formed resist film, a single or mixed solvent of amyl-based solvents (isoamyl acetate, n-amyl formate, and isoamyl formate) is preferable. From the viewpoint of generating no malodor, a single or mixed solvent of isoamyl-based solvents (isoamyl acetate and isoamyl formate) is more preferable, with isoamyl acetate being particularly preferable from the viewpoint of its availability.

As described above, the solvent may be a mixture, but from the viewpoint of ease of recovery and reuse of the solvent, it is preferable that the solvent is a single solvent composed of a single substance.

<<Boiling Point>>

The boiling point of the above-mentioned solvent is not particularly limited and can be appropriately selected according to the purpose. From the viewpoint of improving the film thickness accuracy of a resist film to be formed, however, it is preferable that the boiling point is 110° C. or above and 160° C. or below, and more preferably 120° C. or above and 150° C. or below.

The boiling point refers to a boiling point at 1 atm and is based on the general literature values described in Solvent Handbook (issued by Kodansha Co., Ltd.) or the like.

<<Surface Tension of Solvent>>

The surface tension of the above-mentioned solvent is not particularly limited and can be appropriately selected according to the purpose, but is preferably 32 mN/m or less from the viewpoint of improving the wettability of the resist composition to substrates and improving the film thickness accuracy of the formed resist film, and is more preferably 29 mN/m or less from the viewpoint of obtaining a positive resist solution having an appropriate viscosity and improving the coatability of the positive resist solution.

The surface tension is a value measured using Drop Master700 (manufactured by Kyowa Interface Science Co., Ltd.) at 23° C. based on the pendant drop method.

(Resist Film Formation Method)

The resist film formation method of the present disclosure is a method of forming a resist film using the positive resist composition of the present disclosure and includes: a coating step wherein the positive resist composition is applied onto a workpiece; and a pre-baking step wherein the positive resist composition applied is heated at temperature T (° C.) for time t (min) which meet the following Expression (1) (temperature and time in the area between lines P and U in the graph of FIG. 1):

$$(-\tfrac{1}{4}) \times T + 32.5 \leq t \leq (-\tfrac{1}{4}) \times T + 55 \qquad (1)$$

where t>0

<Coating Step>

In the coating step, the positive resist composition is applied onto a workpiece such as a substrate to be processed by utilizing a resist pattern. The coating method is not particularly limited and coating can be accomplished by any known coating method.

The workpiece to be coated with the positive resist composition may be a substrate or a "mask blank" having a light-shielding layer formed on a substrate.

<Pre-Baking Step>

In the pre-baking step, the applied positive resist composition is heated (pre-baked) to form a resist film.

Here, heating (pre-baking) is performed at temperature T (° C.) for time t (min) which meet Expression (1) given below. Here, the phrase "temperature T (° C.) and time t (min) meet Expression (1)" means that "temperature T (° C.) and time t (min) are present between lines P and U in the graph shown in FIG. 1. This improves the adhesion between the resist film and the workpiece and also reduces changes in the molecular weight of the polymer in the resist film before and after the pre-baking step.

$$(-\tfrac{1}{4}) \times T + 32.5 \leq t \leq (-\tfrac{1}{4}) \times T + 55 \qquad (1)$$

Temperature T (° C.) and time t (min) preferably meet the following Expression (2), more preferably meet the following Expression (3), particularly preferably meet the following Expression (4), preferably meet the following Expression (5), more preferably meet the following Expression (5-2), still more preferably meet the following Expression (6), and particularly preferably meet the following Expression (7):

$$(-\tfrac{1}{4})T + 35 \leq t \qquad (2)$$

$$(-\tfrac{1}{4})T + 37.5 \leq t \qquad (3)$$

$$(-\tfrac{1}{4})T + 40 \leq t \qquad (4)$$

$$t \leq (-\tfrac{7}{30})T + 142/3 \qquad (5)$$

$$t \leq (-\tfrac{3}{10})T + 58 \qquad (5\text{-}2)$$

$$t < (-\tfrac{7}{10})T + 115 \qquad (6)$$

$$t < (-\tfrac{8}{15})T + 262/3 \qquad (7)$$

When pre-baking (heating) is performed at temperature T (° C.) for time t (min) that meet the Expressions (1) and (6) (in the graph of FIG. 1, temperature T (° C.) and time t (min) exist between lines P and C), changes in the molecular weight of the polymer in the resist film before and after the pre-baking step can be reliably reduced while maintaining the adhesion between the resist film and the workpiece by heating at lower temperatures.

When pre-baking (heating) is performed at temperature T (° C.) for time t (min) that meet the Expressions (1) and (7) (in the graph of FIG. 1, temperature T (° C.) and time t (min) exist between lines P and A), changes in the molecular weight of the polymer in the resist film before and after the pre-baking step can be reliably reduced while maintaining the adhesion between the resist film and the workpiece by heating at even lower temperatures.

Lines A, C and P to U in FIGS. 1 to 3E represent the following formulas:

$t=(-8/15)T+262/3$      Line A:

$t=(-7/10)T+115$      Line C:

$t=(-1/4)T+32.5$      Line P:

$t=(-1/4)T+35$      Line Q:

$t=(-1/4)T+37.5$      Line R:

$t=(-1/4)T+40$      Line S:

$t=(-3/10)T+58$      Line T:

$t=(-7/30)T+142/3$      Line T2:

$t=(-1/4)T+55$      Line U:

Temperature T (° C.) is preferably 110° C. or above, more preferably 115° C. or above, still more preferably 120° C. or above from the viewpoint of the adhesion between the resist film formed through the pre-baking step and the workpiece, and is preferably 180° C. or below, and more preferably 170° C. or below from the viewpoint of reducing changes in the molecular weight of the polymer in the resist film before and after the pre-baking step. Time t (min) is preferably 1 minute or more, more preferably 3 minutes or more, still more preferably 5 minutes or more from the viewpoint of the adhesion between the resist film and the workpiece formed through the pre-baking step, and is preferably 30 minutes or less, and more preferably 10 minutes or less from the viewpoint of reducing changes in the molecular weight of the polymer in the resist film before and after the pre-baking step.

Hereinafter, the properties of the polymer after heated in the pre-baking step, i.e., "weight average molecular weight (Mw)", "number average molecular weight (Mn)" and "molecular weight distribution (Mw/Mn)" of the polymer will be described.

[Weight Average Molecular Weight]

The weight average molecular weight (Mw) of the polymer in the resist film formed by the resist film formation method using the positive resist composition of the present disclosure (i.e., resist film formed by the pre-baking step) can be, for example, 45,900 or more and 59,000 or less. Further, the weight average molecular weight of the polymer in the resist film formed through the pre-baking step is preferably 52,000 or less and is preferably 46,500 or more. When the weight average molecular weight (Mw) of the polymer in the resist film formed through the pre-baking step is not more than (less than) the upper limit, the sensitivity of resist film can be improved. When the weight average molecular weight of the polymer in the resist film formed through the pre-baking step is not less than the lower limit, dissolution in developer can be prevented.

[Number Average Molecular Weight]

The number average molecular weight (Mn) of the polymer in the resist film formed by the resist film formation method using the positive resist composition of the present disclosure (i.e., resist film formed by the pre-baking step) can be, for example, 34,400 or more and 43,500 or less. Further, the number average molecular weight (Mn) of the polymer in the resist film formed through the pre-baking step is preferably 41,600 or less and more preferably 36,500 or more. When the number average molecular weight (Mn) of the polymer in the resist film formed through the pre-baking step is not more than (less than) the upper limit, the sensitivity of the resist film can be improved. When the number average molecular weight (Mn) of the polymer in the resist film formed through the pre-baking step is not less than the lower limit, dissolution in developer can be prevented.

[Molecular Weight Distribution]

The molecular weight distribution (Mw/Mn) of the polymer in the resist film formed by the resist film formation method using the positive resist composition of the present disclosure (i.e., resist film formed by the pre-baking step) can be, for example, 1.50 or less. Further, the molecular weight distribution (Mw/Mn) of the polymer in the resist film formed through the pre-baking step is preferably 1.28 or more, more preferably 1.30 or more, preferably 1.45 or less, and more preferably 1.40 or less. When the molecular weight distribution (Mw/Mn) of the polymer in the resist film formed through the pre-baking step is not less than the lower limit, the pre-baking time can be shortened. When the molecular weight distribution (Mw/Mn) of the polymer is not more than the upper limit, a clear pattern can be obtained at the time of patterning.

The retention ratio of the weight average molecular weight of the polymer by heating in the pre-baking step (weight average molecular weight of the polymer after heating in the pre-baking step/weight average molecular weight of the polymer before heating in the pre-baking step) is preferably 95.7% or more, more preferably 96.0% or more, particularly preferably 97.0% or more, and most preferably 99.0% or more.

<Resist Pattern Formation Method>

The resist pattern formation method preferably includes the steps of: (1) forming a resist film using the resist film formation method described above; (2) exposing the resist film; and (3) developing the exposed resist film.

<<Exposing Step>>

In step (2), the resist film is irradiated with ionizing radiation or light to write a desired pattern. Irradiation with ionizing radiation or light can be carried out using a known writing device such as an electron beam writer or a laser writer.

<<Developing Step>>

In step (3), the resist film in which a pattern has been written is brought into contact with a developer to develop the resist film and form a resist pattern on the workpiece. The method by which the resist film and the developer are brought into contact may be, but is not specifically limited to, a method using a known technique such as immersion of the resist film in the developer or application of the developer onto the resist film. The developed resist film is then optionally rinsed with rinsing liquid.

In particular, as the developer and rinsing liquid, for example, fluorine-based solvents such as fluorocarbons containing $CF_3CFHCFHCF_2CF_3$, $CF_3CF_2CHCl_2$, $CClF_2CF_2CHClF$, $CF_3CF_2CF_2CF_2OCH$ or $C_8F_{18}$; alcohols such as methanol, ethanol, 1-propanol, and 2-propanol (isopropyl alcohol); alkyl-containing acetates such as amyl acetate, and hexyl acetate; mixtures of fluorine-based solvents with alcohols; mixtures of fluorine-based solvents with alkyl-containing acetates; mixtures of alcohols with alkyl-containing acetates; mixtures of fluorine-based solvents, alcohols, and alkyl-containing acetates; and the like can be used. The combination of developer and rinsing liquid may, for example, be set such that a solvent in which resist solubility is higher is used as a developer and a solvent in which resist solubility is lower is used as a rinsing liquid in consideration of solubility of a resist comprising the polymer set forth above, for example. In selection of the developer, it is preferable to select a developer that does not cause dissolution of the resist film prior to implementation of step (2). Moreover, in selection of the rinsing liquid, it is preferable to select a rinsing liquid that readily mixes with the developer such that the developer is readily replaced by the rinsing liquid.

(Laminate Manufacturing Method)

The laminate manufacturing method of the present disclosure is a method of manufacturing a laminate which comprises: a substrate; a light shielding layer formed on the substrate; and a resist film formed on the light shielding layer, wherein the resist film is formed by the resist film formation method of the present disclosure.

<Substrate>

As the substrate, a transparent substrate is usually used. Examples of materials of the substrate include transparent materials such as quartz and glass. These may be used alone or in combination. Preferred is quartz from the viewpoint of its transparency and weather resistance.

It is preferable that the substrate has a transparency that allows 90% to 95% of light having a wavelength of 200 nm or more and 300 nm or less to pass through.

The thickness of the substrate is preferably 0.5 mm or more, more preferably 1.0 mm or more, preferably 20 mm or less, and more preferably 15 mm or less.

<Light-Shielding Layer>

As the light shielding layer, any light shielding layer can be used. Preferred is a light shielding layer having a single- or a multi-layer structure having a metal layer. Examples of materials of layers other than metal layers which can constitute the light shielding layer include polypropylene, cyclic polyolefin, and polyvinyl chloride.

Examples of materials of metal layers include chromium, silicon, iron oxide, and molybdenum silicide. These may be used singly or in combination. Preferred is chromium from the viewpoint of its light shielding property.

The thickness of the light-shielding layer is preferably 5 nm or more, more preferably 10 nm or more, preferably 200 nm or less, and more preferably 100 nm or less.

<Resist Film>

The resist film is formed by the resist film formation method of the present disclosure. As a result, the adhesion between the resist film and the light-shielding layer can be improved, and also decreases in the molecular weight of the polymer in resist film can be prevented.

The thickness of the resist film is preferably 20 nm or more, more preferably 30 nm or more, preferably 200 nm or less, and more preferably 100 nm or less.

EXAMPLES

The following provides a more specific description of the present disclosure based on Examples. However, the present disclosure is not limited to the following Examples. In the following description, "%" and "parts" used in expressing quantities are by mass, unless otherwise specified."

In FIGS. 2A to 3E, the "o" symbol indicates that both (ii) "the retention ratio of weight average molecular weight of the polymer in the resist film formed through the pre-baking step" and (iii) "the adhesion between the resist film formed through the pre-baking step and the workpiece" are good, and the "x symbol indicates that either (ii) "the retention ratio of weight average molecular weight of the polymer in the resist film formed through the pre-baking step" and (iii) "the adhesion between the resist film formed through the pre-baking step and the workpiece" is not good, and the "numerical value" attached to the arrow to the "o" symbol or "x" symbol indicates the experimental example number.

In Experimental Examples 1-1 to 12-25, (i) weight average molecular weight, number average molecular weight and molecular weight distribution, (ii) the retention ratio of weight average molecular weight of the polymer in resist film formed through the pre-baking step, and (iii) the adhesion between resist film formed through the pre-baking step and the workpiece were measured and evaluated by the methods described below.

<Weight Average Molecular Weight, Number Average Molecular Weight, and Molecular Weight Distribution>

The weight average molecular weight (Mw) and number average molecular weight (Mn) of the polymer to be measured were measured by gel permeation chromatography, and the molecular weight distribution (Mw/Mn) was calculated.

Specifically, a gel-permeation chromatograph (HLC-8220, manufactured by Tosoh Corporation, Inc.) was used to measure the weight average molecular weight (Mw) and number average molecular weight (Mn) of the polymer in terms of standard polystyrene while using tetrahydrofuran as developing solvent. The molecular weight distribution (Mw/Mn) was then calculated.

<Retention Rate of Weight Average Molecular Weight of Polymer in Resist Film Formed Through Pre-Baking Step>

The percentage of the weight average molecular weight of the polymer in the resist film formed through the pre-baking step with respect to the weight average molecular weight (100%) of the polymer used for the preparation of the positive resist composition was calculated, and the retention rate of the weight average molecular weight of the polymer in the resist film formed through the pre-baking step was evaluated according to the following criteria:

A: The percentage of the weight average molecular weight of the polymer in the resist film formed through the pre-baking step with respect to the weight average molecular weight (100%) of the polymer used for the preparation of the positive resist composition is 95.7% or more (high retention rate: good).

B: The percentage of the weight average molecular weight in the resist film formed by the pre-baking step with respect to the weight average molecular weight (100%) of the polymer used for the preparation of positive resist composition is less than 95.7% (low retention ratio).

<Adhesion Between Resist Film Formed Through Pre-Baking Step and Workpiece>

Adhesion between the resist film and the workpiece was evaluated according to the following criteria by observing whether peeling of the formed resist pattern occurred A: No resist pattern peeling observed (adhesion is good)

B: Resist pattern peeling observed (adhesion is low)

Example 1

Experimental Example 1-1

<Preparation of Polymer (F5)>

A monomer composition containing 3.0 g of 2,2,3,3,3-pentafluoropropyl α-chloroacrylate (ACAPFP) as the monomer (a) and 3.4764 g of α-methylstyrene (AMS) as the monomer (b), 0.0055 g of azobisisobutyronitrile as a polymerization initiator and 1.6205 g of cyclopentanone as solvent were placed in a glass container. The glass container was sealed and purged with nitrogen, and the mixture was stirred in a thermostatic chamber at 78° C. for 6 hours in a nitrogen atmosphere. Thereafter, the glass container was returned to room temperature, the inside of the glass container was exposed to the atmosphere, and then 10 g of tetrahydrofuran (THF) was added to the resultant solution. The solution with THF was then added dropwise into 300 g of methanol to precipitate a polymerized product. Thereafter, the solution containing the polymerized product that had been precipitated was filtered using a Kiriyama funnel to obtain a white coagulated material (polymer). The resulting polymer (crude) was then dissolved in 100 g of THF, and the resulting solution was added dropwise to a mixed solvent of 100 g of THF and 900 g of methanol (MeOH) to precipitate a white coagulated material (polymer containing α-methylstyrene unit and 2,2,3,3,3-pentafluoropropyl α-chloroacrylate unit). Thereafter, the solution containing the polymer that had been precipitated was filtered using a Kiriyama funnel to obtain a white polymer. The obtained polymer contained 50 mol % of 2,2,3,3,3-pentafluoropropyl α-chloroacrylate unit and 50 mol % of α-methylstyrene unit.

The weight average molecular weight, number average molecular weight, and molecular weight distribution of the obtained polymer were measured. The measured weight average molecular weight and molecular weight distribution are given below.

<Production of Positive Resist Composition>

The obtained polymer was dissolved in isoamyl acetate as solvent to prepare a resist solution (positive resist composition) having a polymer concentration of 4% by mass.

<Formation of Resist Pattern>

Positive resist composition was applied onto a 4-inch-diameter mask blank (1.0 mm thick-quartz substrate with a 10 nm-thick chrome layer) using a spin coater (MS-A150). The positive resist composition thus applied was then heated (pre-baked) on a hot plate at 120° C. for 10 minutes to form a 50 nm-thick resist film on the mask blank. Then, the weight average molecular weight (Mw) and the number average molecular weight (Mn) of the obtained polymer in the resist film were measured by gel permeation chromatography, and the molecular weight distribution (Mw/Mn) was calculated. In addition, a pattern was drawn by exposing the resist film at an optimal exposure dose ($E_{op}$) using an electron beam writing device (ELS-S50, Elionix Inc.). Thereafter, the resist film was developed with a developer which is a fluorine-based solvent (Vertrel XF® (Vertrel is a registered trademark in Japan, other countries, or both), Mitsui-DuPont Fluorochemical Co., Ltd., $CF_3CFHCFHCF_2CF_3$) at 23° C. for 1 minute, followed by rinsing with a fluorine-based solvent (Vertrel, Mitsui-DuPont Fluorochemical Co., Ltd., $CF_3CFHCFHCF_2CF_3$) for 10 seconds to form a resist pattern. The adhesion between the resist film formed through the pre-baking step and the mask blank was evaluated. The optimal exposure dose ($E_{op}$) was appropriately set. The resist pattern lines (unexposed regions) and spaces (exposed regions) were each 20 nm.

<Measurement Evaluation Result>

Figure 2A:
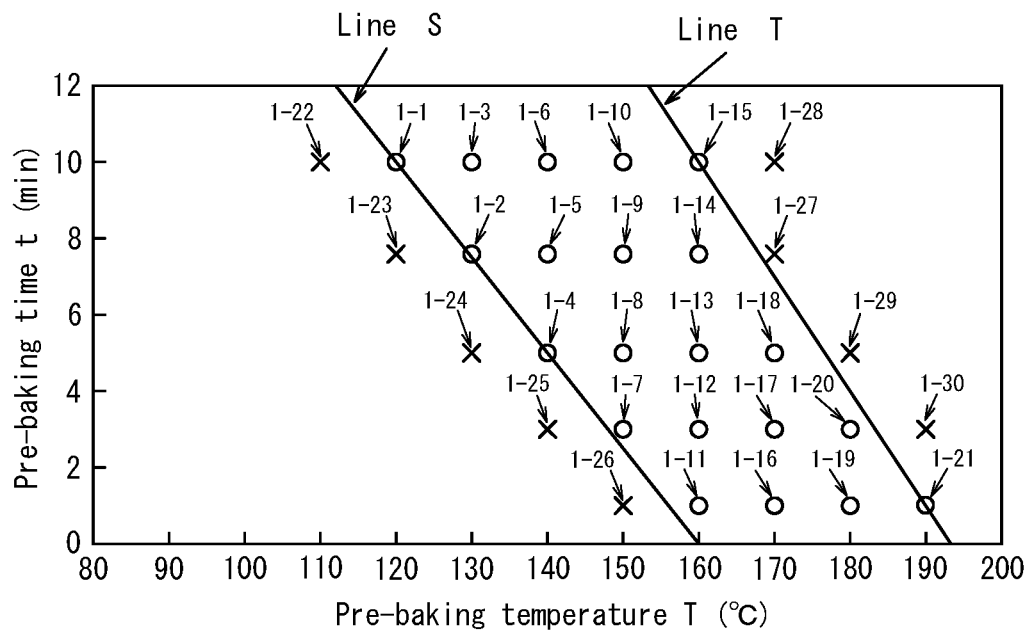
FIG. 2A shows a relationship between temperature T (° C.) and time t (min) in a pre-baking step in a resist film formation method using a positive resist composition containing polymer (F5) and isoamyl acetate (upper graph), and, as a comparison, a relationship between temperature T (° C.) and time t (min) in a pre-baking step in a resist film formation method using a positive resist composition containing polymer (F5) and n-hexyl acetate (lower graph)
Figure 2A:
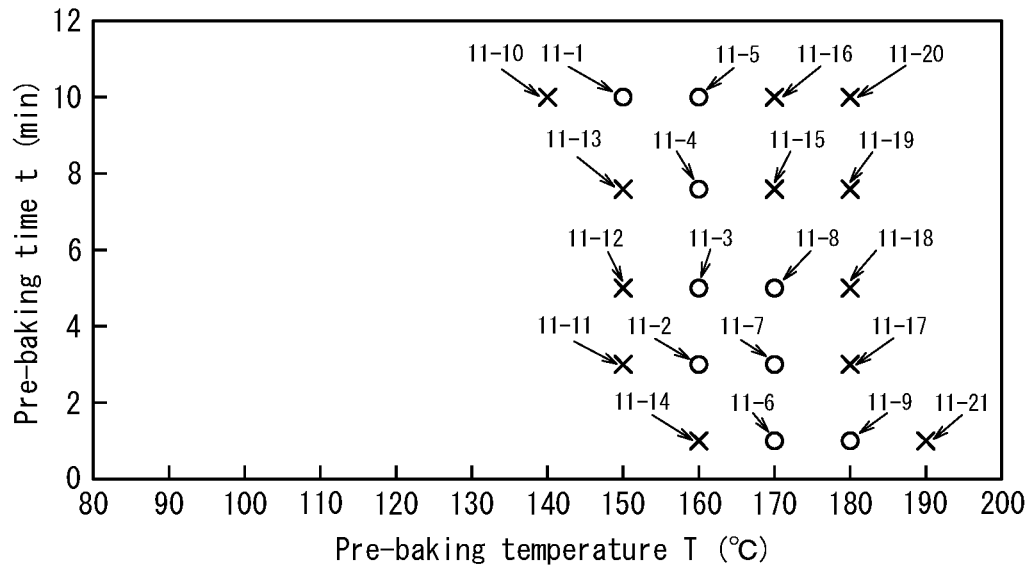
Figure 2B:
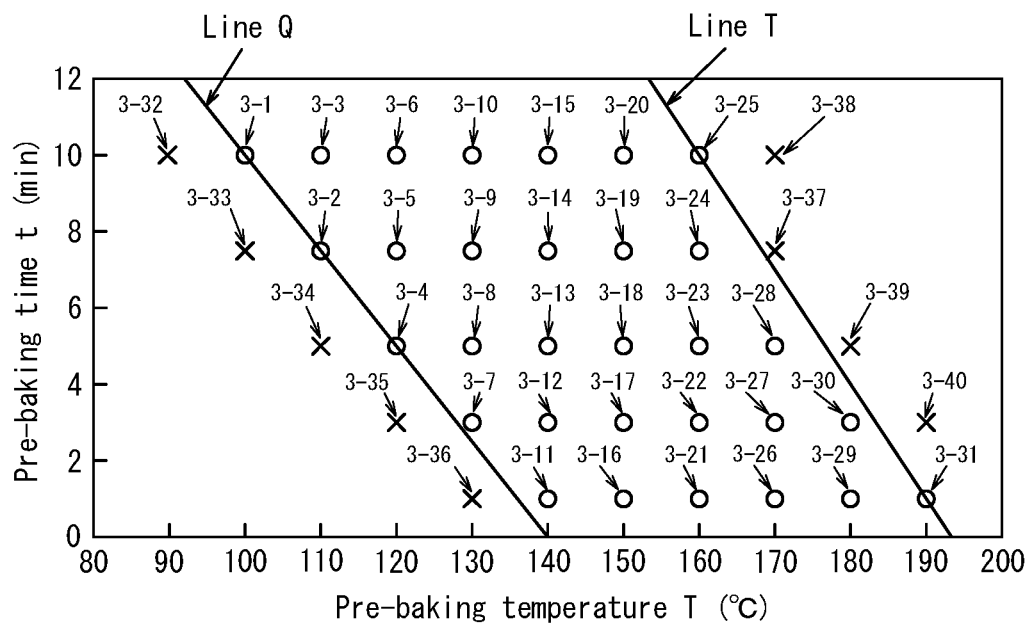
FIG. 2B shows a relationship between temperature T (° C.) and time t (min) in a pre-baking step in a resist film formation method using a positive resist composition containing polymer (F5) and n-butyl formate (upper graph), and, as a comparison, a relationship between temperature T (° C.) and time t (min) in a pre-baking step in a resist film formation method using a positive resist composition containing polymer (F5) and n-hexyl acetate (lower graph)
Figure 2B:
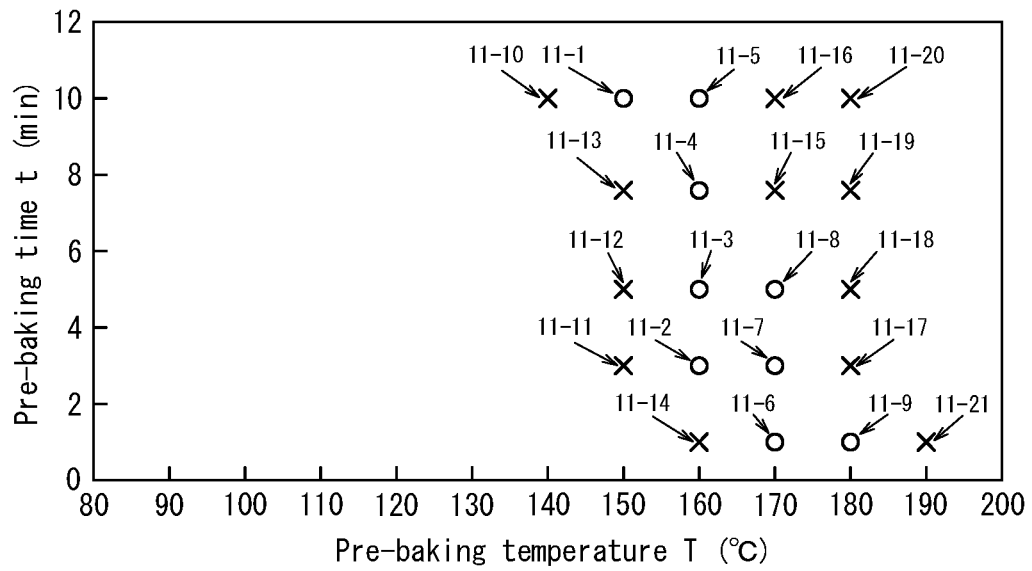

The measured weight average molecular weight and molecular weight distribution, the evaluation result of the retention rate of the weight average molecular weight, and the evaluation result of adhesion are given below and in FIG. 2A.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 51,581, molecular weight distribution: 1.400

(iii) Retention Rate of Weight Average Molecular Weight of Polymer in Resist Film Formed Through Pre-Baking Retention rate: 100.1%, Retention rate evaluation result: A (high retention rate: good)

(iv) Adhesion between resist film formed through pre-baking step and workpiece

Adhesion evaluation result: A (adhesion is good)

Experimental Examples 1-2 to 1-21

"Preparation of Polymer (F5)", "Preparation of Positive Resist Composition", and "Formation of Resist Pattern" were performed and similar measurements and evaluations were made as in Experimental Example 1-1 except the pre-baking step was performed at 130° C. for 7.5 minutes (Experimental Example 1-2); at 130° C. for 10 minutes (Experimental Example 1-3); at 140° C. for 5 minutes (Experimental Example 1-4); at 140° C. for 7.5 minutes (Experimental Example 1-5); at 140° C. for 10 minutes (Experimental Example 1-6); at 150° C. for 3 minutes (Experimental Example 1-7); at 150° C. for 5 minutes (Experimental Example 1-8); at 150° C. for 7.5 minutes (Experimental Example 1-9); at 150° C. for 10 minutes (Experimental Example 1-10); at 160° C. for 1 minute (Experimental Example 1-11); at 160° C. for 3 minutes (Experimental Example 1-12); at 160° C. for 5 minutes (Experimental Example 1-13); at 160° C. for 7.5 minutes (Experimental Example 1-14); at 160° C. for 10 minutes (Experimental Example 1-15); at 170° C. for 1 minute (Experimental Example 1-16); at 170° C. for 3 minutes (Experimental Example 1-7); at 170° C. for 5 minutes (Experimental Example 1-18); at 180° C. for 1 minute (Experimental Example 1-19); at 180° C. for 3 minutes (Experimental Example 1-20); and at 190° C. for 1 minute (Experimental Example 1-21). The results are given below and in FIG. 2A.

(i) Weight average molecular weights and molecular weight distributions of prepared polymer Weight average molecular weight: 51,522, molecular weight distribution: 1.403 (Experimental Examples 1-2 to 1-21)

(ii) Weight average molecular weight and molecular weight distribution of polymer in resist film formed through pre-baking step Weight average molecular weight: 50,877, molecular weight distribution: 1.406 (Experimental Example 1-2)

Weight average molecular weight: 50,722, molecular weight distribution: 1.402 (Experimental Example 1-3)

Weight average molecular weight: 50,810, molecular weight distribution: 1.404 (Experimental Example 1-4)

Weight average molecular weight: 50,462, molecular weight distribution: 1.407 (Experimental Example 1-5)

Weight average molecular weight: 50,411, molecular weight distribution: 1.410 (Experimental Example 1-6)

Weight average molecular weight: 50,914, molecular weight distribution: 1.401 (Experimental Example 1-7)

Weight average molecular weight: 50,974, molecular weight distribution: 1.412 (Experimental Example 1-8)

Weight average molecular weight: 50,682, molecular weight distribution: 1.436 (Experimental Example 1-9)

Weight average molecular weight: 50,509, molecular weight distribution: 1.432 (Experimental Example 1-10)

Weight average molecular weight: 51,106, molecular weight distribution: 1.403 (Experimental Example 1-11)

Weight average molecular weight: 50,679, molecular weight distribution: 1.413 (Experimental Example 1-12)

Weight average molecular weight: 50,532, molecular weight distribution: 1.414 (Experimental Example 1-13)

Weight average molecular weight: 50,279, molecular weight distribution: 1.417 (Experimental Example 1-14)

Weight average molecular weight: 50,307, molecular weight distribution: 1.416 (Experimental Example 1-15)

Weight average molecular weight: 51,106, molecular weight distribution: 1.403 (Experimental Example 1-16)

Weight average molecular weight: 49,767, molecular weight distribution: 1.418 (Experimental Example 1-17)

Weight average molecular weight: 50,448, molecular weight distribution: 1.415 (Experimental Example 1-18)

Weight average molecular weight: 51,106, molecular weight distribution: 1.403 (Experimental Example 1-19)

Weight average molecular weight: 50,246, molecular weight distribution: 1.417 (Experimental Example 1-20)

Weight average molecular weight: 51,106, molecular weight distribution: 1.403 (Experimental Example 1-21)

(iii) Retention rate of weight average molecular weight of polymer in resist film formed through pre-baking Retention rate: 98.7%, Retention rate evaluation result: A (High retention rate: good) (Experimental Example 1-2)

Retention rate: 98.4%, Retention rate evaluation result: A (High retention rate: good) (Experimental Example 1-3)

Retention rate: 98.6%, Retention rate evaluation result: A (High retention rate: good) (Experimental Example 1-4)

Retention rate: 97.9%, Retention rate evaluation result: A (High retention rate: good) (Experimental Example 1-5)

Retention rate: 97.8%, Retention rate evaluation result: A (High retention rate: good) (Experimental Example 1-6)

Retention rate: 98.8%, Retention rate evaluation result: A (High retention rate: good) (Experimental Example 1-7)

Retention rate: 98.9%, Retention rate evaluation result: A (High retention rate: good) (Experimental Example 1-8)

Retention rate: 98.4%, Retention rate evaluation result: A (High retention rate: good) (Experimental Example 1-9)

Retention rate: 98.0%, Retention rate evaluation result: A (High retention rate: good) (Experimental Example 1-10)

Retention rate: 99.2%, Retention rate evaluation result: A (High retention rate: good) (Experimental Example 1-11)

Retention rate: 98.4%, Retention rate evaluation result: A (High retention rate: good) (Experimental Example 1-12)

Retention rate: 98.1%, Retention rate evaluation result: A (High retention rate: good) (Experimental Example 1-13)

Retention rate: 97.6%, Retention rate evaluation result: A (High retention rate: good) (Experimental Example 1-14)

Retention rate: 97.6%, Retention rate evaluation result: A (High retention rate: good) (Experimental Example 1-15)

Retention rate: 99.2%, Retention rate evaluation result: A (High retention rate: good) (Experimental Example 1-16)

Retention rate: 96.6%, Retention rate evaluation result: A (High retention rate: good) (Experimental Example 1-17)

Retention rate: 97.9%, Retention rate evaluation result: A (High retention rate: good) (Experimental Example 1-18)

Retention rate: 99.2%, Retention rate evaluation result: A (High retention rate: good) (Experimental Example 1-19)

Retention rate: 97.5%, Retention rate evaluation result: A (High retention rate: good) (Experimental Example 1-20)

Retention rate: 99.2%, Retention rate evaluation result: A (High retention rate: good) (Experimental Example 1-21)

(iv) Adhesion between resist film formed through pre-baking step and workpiece

Adhesion evaluation result: A (adhesion is good) (Experimental Examples 1-2 to 1-21)

Experimental Examples 1-22 to 1-26

"Preparation of Polymer (F5)", "Preparation of Positive Resist Composition", and "Formation of Resist Pattern" were performed and similar measurements and evaluations were made as in Experimental Example 1-1 except that the pre-baking step was performed at 120° C. for 10 minutes (Experimental Example 1-22); at 110° C. for 10 minutes (Experimental Example 1-22); at 120° C. for 7.5 minutes (Experimental Example 1-23); at 130° C. for 5 minutes (Experimental Example 1-24); at 140° C. for 3 minutes (Experimental Example 1-25); and at 150° C. for 1 minute (Experimental Example 1-26). The results are given below and in FIG. 2A.

(i) Weight average molecular weight and molecular weight distribution of prepared polymer Weight average molecular weight: 51,522, molecular weight distribution: 1.403 (Experimental Examples 1-22 to 1-26)

(ii) Weight average molecular weight and molecular weight distribution of polymer in resist film formed through pre-baking step Weight average molecular weight: 51,068, molecular weight distribution: 1.400 (Experimental Example 1-22)

Weight average molecular weight: 51,584, molecular weight distribution: 1.400 (Experimental Example 1-23)

Weight average molecular weight: 50,668, molecular weight distribution: 1.404 (Experimental Example 1-24)

Weight average molecular weight: 50,120, molecular weight distribution: 1.400 (Experimental Example 1-25)

Weight average molecular weight: 51,106, molecular weight distribution: 1.403 (Experimental Example 1-26)

(iii) Retention rate of weight average molecular weight of polymer in resist film formed through pre-baking Retention rate: 99.1%, Retention rate evaluation result: A (High retention rate: good) (Experimental Example 1-22)

Retention rate: 100.1%, Retention rate evaluation result: A (High retention rate: good) (Experimental Example 1-23)

Retention rate: 98.3%, Retention rate evaluation result: A (High retention rate: good) (Experimental Example 1-24)

Retention rate: 97.3%, Retention rate evaluation result: A (High retention rate: good) (Experimental Example 1-25)

Retention rate: 99.2%, Retention rate evaluation result: A (High retention rate: good) (Experimental Example 1-26)

(iv) Adhesion between resist film formed through pre-baking step and workpiece

Adhesion evaluation result: B (adhesion is low) (Experimental Examples 1-22 to 1-26)

Experimental Examples 1-27 to 1-30

"Preparation of Polymer (F5)", "Preparation of Positive Resist Composition", and "Formation of Resist Pattern" were performed and similar measurements and evaluations were made as in Experimental Example 1-1 except that the pre-baking step was performed at 170° C. for 7.5 minutes (Experimental Example 1-27); at 170° C. for 10 minutes (Experimental Example 1-28); at 180° C. for 5 minutes (Experimental Example 1-29); and at 190° C. for 3 minutes (Experimental Example 1-30). The results are given below and in FIG. 2A.

(i) Weight average molecular weight and molecular weight distribution of prepared polymer Weight average molecular weight: 51,522, molecular weight distribution: 1.403 (Experimental Example 1-27 to 1-30)

(ii) Weight average molecular weight and molecular weight distribution of polymer in resist film formed through pre-baking step Weight average molecular weight: 48,993, molecular weight distribution: 1.437 (Experimental Example 1-27)

Weight average molecular weight: 48,632, molecular weight distribution: 1.452 (Experimental Example 1-28)

Weight average molecular weight: 48,821, molecular weight distribution: 1.413 (Experimental Example 1-29)

Weight average molecular weight: 48,400, molecular weight distribution: 1.437 (Experimental Example 1-30)

(iii) Retention rate of weight average molecular weight of polymer in resist film formed through pre-baking Retention rate: 95.1%, Retention rate evaluation result: B (Retention rate: low) (Example 1-27)

Retention rate: 94.4%, Retention rate evaluation result: B (Retention rate: low) (Experiment example 1-28)

Retention rate: 94.8%, Retention rate evaluation result: B (Retention rate: low) (Example 1-29)

Retention rate: 93.9%, Retention rate evaluation result: B (Retention rate: low) (Example 1-30)

(iv) Adhesion between resist film formed through pre-baking step and workpiece

Adhesion evaluation result: A (adhesion is good) (Experimental Examples 1-27 to 1-30)

Example 2

Experimental Example 2-1

<Preparation of Polymer (F6)>

A monomer composition containing 3.0 g of 2,2,3,3,3-pentafluoropropyl α-chloroacrylate (ACAPFP) as monomer (a), 3.23483 g of 4-fluoro-α-methylstyrene (4FAMS) as monomer (b) and 0.00521 g of azobisisobutyronitrile as a polymerization initiator were placed in a glass container. The glass container was sealed and purged with nitrogen, and the mixture was stirred in a thermostatic chamber at 78° C. for 6 hours in a nitrogen atmosphere. Thereafter, the glass container was returned to room temperature, the inside of the glass container was exposed to the atmosphere, and then 10 g of tetrahydrofuran (THF) was added to the resultant solution. The solution with THF was then added dropwise into 300 g of methanol to precipitate a polymerized product. Thereafter, the solution containing the polymerized product that had been precipitated was filtered using a Kiriyama funnel to obtain a white coagulated material (polymer). The resulting polymer (crude) was then dissolved in 100 g of THF, and the resulting solution was added dropwise to a mixed solvent of 50 g of THF and 950 g of methanol (MeOH) to precipitate a white coagulated material (polymer containing 4-fluoro-α-methyl styrene unit and 2,2,3,3,3-pentafluoropropyl α-chloroacrylate unit). Thereafter, the solution containing the polymer that had been precipitated was filtered using a Kiriyama funnel to obtain a white polymer. The obtained polymer contained 50 mol % of 2,2,3,3,3-pentafluoropropyl α-chloroacrylate unit and 50 mol % of 4-fluoro-α-methylstyrene unit.

The weight average molecular weight, number average molecular weight, and molecular weight distribution of the obtained polymer were measured. The measured weight average molecular weight and molecular weight distribution are given below.

<Production of Positive Resist Composition>

The obtained polymer was dissolved in isoamyl acetate as solvent to prepare a resist solution (positive resist composition) having a polymer concentration of 4% by mass.

<Formation of Resist Pattern>

Positive resist composition was applied onto a 4-inch-diameter mask blank (1.0 mm thick-quartz substrate with a 10 nm-thick chrome layer) using a spin coater (MS-A150). The positive resist composition thus applied was then heated (pre-baked) on a hot plate at 120° C. for 10 minutes to form a 50 nm-thick resist film on the mask blank. Then, the weight average molecular weight (Mw) and the number average molecular weight (Mn) of the obtained polymer in the resist film were measured by gel permeation chromatography, and the molecular weight distribution (Mw/Mn) was calculated. In addition, a pattern was drawn by exposing the resist film at an optimal exposure dose ($E_{op}$) using an electron beam writing device (ELS-S50, Elionix Inc.). Thereafter, the resist film was developed with a developer which is a fluorine-based solvent (Vertrel XF®, Mitsui-DuPont Fluorochemical Co., Ltd., $CF_3CFHCFHCF_2CF_3$) at 23° C. for 1 minute, followed by rinsing with a fluorine-based solvent (Vertrel, Mitsui-DuPont Fluorochemical Co., Ltd., $CF_3CFHCFHCF_2CF_3$) for 10 seconds to form a resist pattern. The adhesion between the resist film formed through the pre-baking step and the mask blank was evaluated. The optimal exposure dose ($E_{op}$) was appropriately set. The resist pattern lines (unexposed regions) and spaces (exposed regions) were each 20 nm.

<Measurement Evaluation Result>

The measured weight average molecular weight and molecular weight distribution, the evaluation result of the retention rate of the weight average molecular weight, and the evaluation result of adhesion are given below and in FIG. 3A.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 48,511, molecular weight distribution: 1.283

(iii) Retention rate of weight average molecular weight of polymer in resist film formed through pre-baking Retention rate: 102.5%, Retention rate evaluation result: A (High retention rate: good)

(iv) Adhesion between resist film formed through pre-baking step and workpiece

Adhesion evaluation Result: A (adhesion is good)

Experimental Examples 2-2 to 2-29

"Preparation of Polymer (F6)", "Preparation of Positive Resist Composition", and "Formation of Resist Pattern" were performed and similar measurements and evaluations were made as in Experimental Example 2-1 except the pre-baking step was performed at 130° C. for 7.5 minutes (Experimental Example 2-2); at 130° C. for 10 minutes (Experimental Example 2-3); at 140° C. for 5 minutes (Experimental Example 2-4); at 140° C. for 7.5 minutes (Experimental Example 2-5); at 140° C. for 10 minutes (Experimental Example 2-6); at 150° C. for 3 minutes (Example 2-7); at 150° C. for 5 minutes (Experimental Example 2-8); at 150° C. for 7.5 minutes (Experimental Example 2-9); at 150° C. for 10 minutes (Experimental Example 2-10); at 160° C. for 1 minute (Experimental Example 2-11); at 160° C. for 3 minutes (Experimental Example 2-12); at 160° C. for 5 minutes (Experimental Example 2-13); at 160° C. for 7.5 minutes (Experimental Example 2-14); at 160° C. for 10 minutes; at 170° C. for 1 minute (Experimental Example 2-16); at 170° C. for 3 minutes (Experimental Example 2-17); at 170° C. for 5 minutes (Experimental Example 2-18); at 170° C. for 7.5 minutes (Experimental Example 2-19); at 170° C. for 10 minutes (Experimental Example 2-20); at 180° C. for 1 minute (Experimental Example 2-21); at 180° C. for 3 minutes (Experimental Example 2-22); at 180° C. for 5 minutes (Experimental Example 2-23); at 180° C. for 7.5 minutes (Experimental Example 2-24); at 180° C. for 10 minutes (Experimental Example 2-25); at 190° C. for 1 minute (Experimental Example 2-26); at 190° C. for 3 minutes (Experimental Example 2-27); at 190° C. for 5 minutes (Experimental Example 2-28); and at 190° C. for 7.5 minutes (Experimental Example 2-29). The results are given below and in FIG. 3A.

(i) Weight average molecular weights and molecular weight distributions of prepared polymer Weight average molecular weight: 47,311, molecular weight distribution: 1.284 (Experimental Examples 2-2 to 2-29)

(ii) Weight average molecular weight and molecular weight distribution of polymer in resist film formed through pre-baking step Weight average molecular weight: 48,583, molecular weight distribution: 1.285 (Experimental Example 2-2)

Weight average molecular weight: 48,511, molecular weight distribution: 1.282 (Experimental Example 2-3)

Weight average molecular weight: 48,111, molecular weight distribution: 1.283 (Experimental Example 2-4)

Weight average molecular weight: 47,610, molecular weight distribution: 1.285 (Experimental Example 2-5)

Weight average molecular weight: 47,351, molecular weight distribution: 1.284 (Experimental Example 2-6)

Weight average molecular weight: 47,974, molecular weight distribution: 1.288 (Experimental Example 2-7)

Weight average molecular weight: 48,381, molecular weight distribution: 1.285 (Experimental Example 2-8)

Weight average molecular weight: 47,692, molecular weight distribution: 1.288 (Experimental Example 2-9)

Weight average molecular weight: 47,829, molecular weight distribution: 1.291 (Experimental Example 2-10)

Weight average molecular weight: 46,929, molecular weight distribution: 1.284 (Experimental Example 2-11)

Weight average molecular weight: 47,739, molecular weight distribution: 1.282 (Experimental Example 2-12)

Weight average molecular weight: 47,968, molecular weight distribution: 1.288 (Experimental Example 2-13)

Weight average molecular weight: 47,262, molecular weight distribution: 1.292 (Experimental Example 2-14)

Weight average molecular weight: 47,068, molecular weight distribution: 1.300 (Experimental Example 2-15)

Weight average molecular weight: 46,929, molecular weight distribution: 1.284 (Experimental Example 2-16)

Weight average molecular weight: 46,900, molecular weight distribution: 1.284 (Experimental Example 2-17)

Weight average molecular weight: 47,754, molecular weight distribution: 1.293 (Experimental Example 2-18)

Weight average molecular weight: 46,746, molecular weight distribution: 1.302 (Experimental Example 2-19)

Weight average molecular weight: 47,502, molecular weight distribution: 1.313 (Experimental Example 2-20)

Weight average molecular weight: 46,929, molecular weight distribution: 1.284 (Experimental Example 2-21)

Weight average molecular weight: 47,730, molecular weight distribution: 1.291 (Experimental Example 2-22)

Weight average molecular weight: 47,275, molecular weight distribution: 1.301 (Experimental Example 2-23)

Weight average molecular weight: 45,765, molecular weight distribution: 1.318 (Experimental Example 2-24)

Weight average molecular weight: 45,769, molecular weight distribution: 1.317 (Experimental Example 2-25)

Weight average molecular weight: 46,929, molecular weight distribution: 1.284 (Experimental Example 2-26)

Weight average molecular weight: 47,656, molecular weight distribution: 1.299 (Experimental Example 2-27)

Weight average molecular weight: 46,846, molecular weight distribution: 1.306 (Experimental Example 2-28)

Weight average molecular weight: 45,478, molecular weight distribution: 1.318 (Experimental Example 2-29)

(iii) Retention rate of weight average molecular weight of polymer in resist film formed through pre-baking Retention rate: 102.7%, Retention rate evaluation result: A (High retention rate: good) (Experimental Example 2-2)

Retention rate: 102.5%, Retention rate evaluation result: A (High retention rate: good) (Experimental Example 2-3)

Retention rate: 101.7%, Retention rate evaluation result: A (High retention rate: good) (Experimental Example 2-4)

Retention rate: 100.6%, Retention rate evaluation result: A (High retention rate: good) (Experimental Example 2-5)

Retention rate: 100.1%, Retention rate evaluation result: A (High retention rate: good) (Experimental Example 2-6)

Retention rate: 101.4%, Retention rate evaluation result: A (High retention rate: good) (Experimental Example 2-7)

Retention rate: 102.3%, Retention rate evaluation result: A (High retention rate: good) (Experimental Example 2-8)

Retention rate: 100.8%, Retention rate evaluation result: A (High retention rate: good) (Experimental Example 2-9)

Retention rate: 101.1%, Retention rate evaluation result: A (High retention rate: good) (Experimental Example 2-10)

Retention rate: 99.2%, Retention rate evaluation result: A (High retention rate: good) (Experimental Example 2-11)

Retention rate: 100.9%, Retention rate evaluation result: A (High retention rate: good) (Experimental Example 2-12)

Retention rate: 101.4%, Retention rate evaluation result: A (High retention rate: good) (Experimental Example 2-13)

Retention rate: 99.9%, Retention rate evaluation result: A (High retention rate: good) (Experimental Example 2-14)

Retention rate: 99.5%, Retention rate evaluation result: A (High retention rate: good) (Experimental Example 2-15)

Retention rate: 99.2%, Retention rate evaluation result: A (High retention rate: good) (Experimental Example 2-16)

Retention rate: 99.1%, Retention rate evaluation result: A (High retention rate: good) (Experimental Example 2-17)

Retention rate: 100.9%, Retention rate evaluation result: A (High retention rate: good) (Experimental Example 2-18)

Retention rate: 98.8%, Retention rate evaluation result: A (High retention rate: good) (Experimental Example 2-19)

Retention rate: 98.3%, Retention rate evaluation result: A (High retention rate: good) (Experimental Example 2-20)

Retention rate: 99.2%, Retention rate evaluation result: A (High retention rate: good) (Experimental Example 2-21)

Retention rate: 100.9%, Retention rate evaluation result: A (High retention rate: good) (Experimental Example 2-22)

Retention rate: 99.9%, Retention rate evaluation result: A (High retention rate: good) (Experimental Example 2-23)

Retention rate: 96.7%, Retention rate evaluation result: A (High retention rate: good) (Experimental Example 2-24)

Retention rate: 96.7%, Retention rate evaluation result: A (High retention rate: good) (Experimental Example 2-25)

Retention rate: 99.2%, Retention rate evaluation result: A (High retention rate: good) (Experimental Example 2-26)

Retention rate: 100.7%, Retention rate evaluation result: A (High retention rate: good) (Experimental Example 2-27)

Retention rate: 99.0%, Retention rate evaluation result: A (High retention rate: good) (Experimental Example 2-28)

Retention rate: 96.1%, Retention rate evaluation result: A (High retention rate: good) (Experimental Example 2-29)

(iv) Adhesion between resist film formed through pre-baking step and workpiece

Adhesion evaluation result: A (adhesion is good) (Experimental Examples 2-2 to 2-29)

Experimental Examples 2-30 to 2-34

Figure 3A:
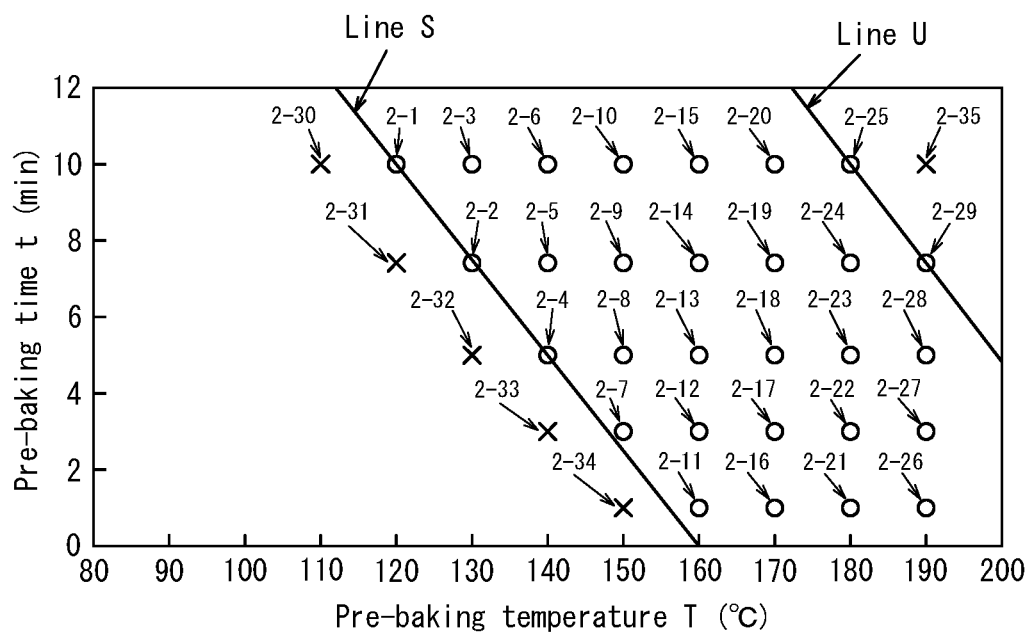
FIG. 3A shows a relationship between temperature T (° C.) and time t (min) in a pre-baking step in a resist film formation method using a positive resist composition containing polymer (F6) and isoamyl acetate (upper graph), and, as a comparison, a relationship between temperature T (° C.) and time t (min) in a pre-baking step in a resist film formation method using a positive resist composition containing polymer (F6) and n-hexyl acetate (lower graph)
Figure 3A:
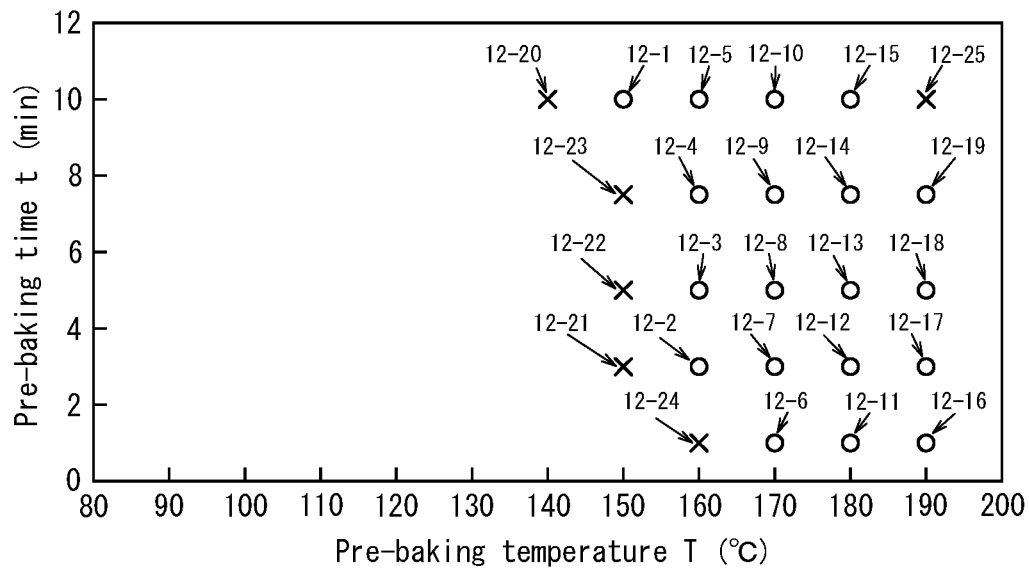

"Preparation of Polymer (F6)", "Preparation of Positive Resist Composition", and "Formation of Resist Pattern" were performed and similar measurements and evaluations were made as in Experimental Example 2-1 except that the pre-baking step was performed at 110° C. for 10 minutes (Experimental Example 2-30); at 120° C. for 7.5 minutes (Experimental Example 2-31); at 130° C. for 5 minutes (Experimental Example 2-32); at 140° C. for 3 minutes (Experimental Example 2-33); and at 150° C. for 1 minute (Experimental Example 2-34) The results are given below and in FIG. 3A.

(i) Weight average molecular weights and molecular weight distributions of prepared polymer Weight average molecular weight: 47,311, molecular weight distribution: 1.284 (Experimental Examples 2-30 to 2-34)

(ii) Weight average molecular weight and molecular weight distribution of polymer in resist film formed through pre-baking step Weight average molecular weight: 48,511, molecular weight distribution: 1.283 (Experimental Example 2-30)

Weight average molecular weight: 48,564, molecular weight distribution: 1.286 (Experimental Example 2-31)

Weight average molecular weight: 47,869, molecular weight distribution: 1.276 (Experimental Example 2-32)

Weight average molecular weight: 47,271, molecular weight distribution: 1.285 (Experimental Example 2-33)

Weight average molecular weight: 46,929, molecular weight distribution: 1.284 (Experimental Example 2-34)

(iii) Retention rate of weight average molecular weight of polymer in resist film formed through pre-baking Retention rate: 102.5%, Retention rate evaluation result: A (High retention rate: good) (Experimental Example 2-30)

Retention rate: 102.6%, Retention rate evaluation result: A (High retention rate: good) (Experimental Example 2-31)

Retention rate: 101.2%, Retention rate evaluation result: A (High retention rate: good) (Experimental Example 2-32)

Retention rate: 99.9%, Retention rate evaluation result: A (High retention rate: good) (Experimental Example 2-33)

Retention rate: 99.2%, Retention rate evaluation result: A (High retention rate: good) (Experimental Example 2-34)

(iv) Adhesion between resist film formed through pre-baking step and workpiece

Adhesion evaluation Result: B (adhesion is low) (Experimental Examples 2-30 to 2-34)

Experimental Example 2-35

"Preparation of Polymer (F6)", "Preparation of Positive Resist Composition", and "Formation of Resist Pattern" were performed and similar measurements and evaluations were made as in Experimental Example 2-1 except that the pre-baking step was performed at 190° C. for 10 minutes. The results are given below and in FIG. 3A.

(i) Weight average molecular weights and molecular weight distributions of prepared polymer Weight average molecular weight: 47,311, molecular weight distribution: 1.284

(ii) Weight average molecular weight and molecular weight distribution of polymer in resist film formed through pre-baking step Weight average molecular weight: 45,087, molecular weight distribution: 1.323

(iii) Retention rate of weight average molecular weight of polymer in resist film formed through pre-baking Retention rate: 95.3%, Retention rate evaluation result: B (Retention rate: low)

(iv) Adhesion between resist film formed through pre-baking step and workpiece

Adhesion evaluation result: A (adhesion is good)

Example 3

Experimental Example 3-1

"Preparation of Polymer (F5)", "Preparation of Positive Resist Composition", and "Formation of Resist Pattern" were performed and similar measurements and evaluations were made as in Experimental Example 1-1 except that n-butyl formate was used instead of isoamyl acetate and that the pre-baking step was performed at 100° C. for 10 minutes. The results are given below and in FIG. 2B.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 51,701, molecular weight distribution: 1.400

(iii) Retention rate of weight average molecular weight of polymer in resist film formed through pre-baking Retention rate: 100.3%, Retention rate evaluation result: A (High retention rate: good)

(iv) Adhesion between resist film formed through pre-baking step and workpiece

Adhesion evaluation result: A (adhesion is good)

Experimental Examples 3-2 to 3-31

"Preparation of Polymer (F5)", "Preparation of Positive Resist Composition", and "Formation of Resist Pattern" were performed and similar measurements and evaluations were made as in Experimental Example 3-1 except that the pre-baking step was performed at 110° C. for 7.5 minutes (Experimental Example 3-2); at 110° C. for 10 minutes (Experimental Example 3-3); at 120° C. for 5 minutes Experimental (Example 3-4); at 120° C. for 7.5 minutes (Experimental Example 3-5); at 120° C. for 10 minutes (Experimental Example 3-6); at 130° C. for 3 minutes (Experimental Example 3-7); at 130° C. for 5 minutes (Experimental Example 3-8); at 130° C. for 7.5 minutes (Experimental Example 3-9); at 130° C. for 10 minutes (Experimental Example 3-10); at 140° C. for 1 minute (Experimental Example 3-11); at 140° C. for 3 minutes (Experimental Example 3-12); at 140° C. for 5 minutes (Experimental Example 3-13); at 140° C. for 7.5 minutes (Experimental Example 3-14); at 140° C. for 10 minutes (Experimental Example 3-15); at 150° C. for 1 minute (Experimental Example 3-16); at 150° C. for 3 minutes (Experimental Example 3-17); at 150° C. for 5 minutes (Experimental Example 3-18); at 150° C. for 7.5 minutes (Experimental Example 3-19); at 150° C. for 10 minutes (Experimental Example 3-20); at 160° C. for 1 minute (Experimental Example 3-21); at 160° C. for 3 minutes (Experimental Example 3-22); at 160° C. for 5 minutes (Experimental Example 3-23); at 160° C. for 7.5 minutes (Experimental Example 3-24); at 160° C. for 10 minutes (Experimental Example 3-25); at 170° C. for 1 minute (Experimental Example 3-26); at 170° C. for 3 minutes (Experimental Example 3-27); at 170° C. for 5 minutes (Experimental Example 3-28); at 180° C. for 1 minute (Experimental Example 3-29); at 180° C. for 3 minutes (Experimental Example 3-30); and at 190° C. for 1 minute (Experimental Example 3-31). The results are given below and in FIG. 2B.

(i) Weight average molecular weight and molecular weight distribution of prepared polymer Weight average molecular weight: 51,522, molecular weight distribution: 1.403 (Experimental Example 3-2 to 3-31)

(ii) Weight average molecular weight and molecular weight distribution of polymer in resist film formed through pre-baking step Weight average molecular weight: 51,693, molecular weight distribution: 1.400 (Experimental Example 3-2)

Weight average molecular weight: 51,701, molecular weight distribution: 1.400 (Experimental Example 3-3)

Weight average molecular weight: 51,352, molecular weight distribution: 1.400 (Experimental Example 3-4)

Weight average molecular weight: 51,693, molecular weight distribution: 1.400 (Experimental Example 3-5)

Weight average molecular weight: 51,701, molecular weight distribution: 1.400 (Experimental Example 3-6)

Weight average molecular weight: 50,919, molecular weight distribution: 1.404 (Experimental Example 3-7)

Weight average molecular weight: 50,621, molecular weight distribution: 1.406 (Experimental Example 3-8)

Weight average molecular weight: 50,985, molecular weight distribution: 1.406 (Experimental Example 3-9)

Weight average molecular weight: 50,839, molecular weight distribution: 1.403 (Experimental Example 3-10)

Weight average molecular weight: 51,125, molecular weight distribution: 1.400 (Experimental Example 3-11)

Weight average molecular weight: 50,125, molecular weight distribution: 1.404 (Experimental Example 3-12)

Weight average molecular weight: 50763, molecular weight distribution: 1.407 (Experimental Example 3-13)

Weight average molecular weight: 50,569, molecular weight distribution: 1.407 (Experimental Example 3-14)

Weight average molecular weight: 50,528, molecular weight distribution: 1.405 (Experimental Example 3-15)

Weight average molecular weight: 51,125, molecular weight distribution: 1.401 (Experimental Example 3-16)

Weight average molecular weight: 50,919, molecular weight distribution: 1.412 (Experimental Example 3-17)

Weight average molecular weight: 50,926, molecular weight distribution: 1.436 (Experimental Example 3-18)

Weight average molecular weight: 50,790, molecular weight distribution: 1.436 (Experimental Example 3-19)

Weight average molecular weight: 50,626, molecular weight distribution: 1.416 (Experimental Example 3-20)

Weight average molecular weight: 51,125, molecular weight distribution: 1.413 (Experimental Example 3-21)

Weight average molecular weight: 50,684, molecular weight distribution: 1.414 (Experimental Example 3-22)

Weight average molecular weight: 50,485, molecular weight distribution: 1.417 (Experimental Example 3-23)

Weight average molecular weight: 50,386, molecular weight distribution: 1.417 (Experimental Example 3-24)

Weight average molecular weight: 50,424, molecular weight distribution: 1.422 (Experimental Example 3-25)

Weight average molecular weight: 51,125, molecular weight distribution: 1.418 (Experimental Example 3-26)

Weight average molecular weight: 49,772, molecular weight distribution: 1.415 (Experimental Example 3-27)

Weight average molecular weight: 50,400, molecular weight distribution: 1.437 (Experimental Example 3-28)

Weight average molecular weight: 51,125, molecular weight distribution: 1.417 (Experimental Example 3-29)

Weight average molecular weight: 50,251, molecular weight distribution: 1.448 (Experimental Example 3-30)

Weight average molecular weight: 51,125, molecular weight distribution: 1.437 (Experimental Example 3-31)

(iii) Retention rate of weight average molecular weight of polymer in resist film formed through pre-baking Retention rate: 100.3%, Retention rate evaluation result: A (High retention rate: good) (Experimental Example 3-2)

Retention rate: 100.3%, Retention rate evaluation result: A (High retention rate: good) (Experimental Example 3-3)

Retention rate: 99.7%, Retention rate evaluation result: A (High retention rate: good) (Experimental Example 3-4)

Retention rate: 100.3%, Retention rate evaluation result: A (High retention rate: good) (Experimental Example 3-5)

Retention rate: 100.3%, Retention rate evaluation result: A (High retention rate: good) (Experimental Example 3-6)

Retention rate: 98.8%, Retention rate evaluation result: A (High retention rate: good) (Experimental Example 3-7)

Retention rate: 98.3%, Retention rate evaluation result: A (High retention rate: good) (Experimental Example 3-8)

Retention rate: 99.0%, Retention rate evaluation result: A (High retention rate: good) (Experimental Example 3-9)

Retention rate: 98.7%, Retention rate evaluation result: A (High retention rate: good) (Experimental Example 3-10)

Retention rate: 99.2%, Retention rate evaluation result: A (High retention rate: good) (Experimental Example 3-11)

Retention rate: 97.3%, Retention rate evaluation result: A (High retention rate: good) (Experimental Example 3-12)

Retention rate: 98.5%, Retention rate evaluation result: A (High retention rate: good) (Experimental Example 3-13)

Retention rate: 98.2%, Retention rate evaluation result: A (High retention rate: good) (Experimental Example 3-14)

Retention rate: 98.1%, Retention rate evaluation result: A (High retention rate: good) (Experimental Example 3-15)

Retention rate: 99.2%, Retention rate evaluation result: A (High retention rate: good) (Experimental Example 3-16)

Retention rate: 98.8%, Retention rate evaluation result: A (High retention rate: good) (Experimental Example 3-17)

Retention rate: 98.8%, Retention rate evaluation result: A (High retention rate: good) (Experimental Example 3-18)

Retention rate: 98.6%, Retention rate evaluation result: A (High retention rate: good) (Experimental Example 3-19)

Retention rate: 98.3%, Retention rate evaluation result: A (High retention rate: good) (Experimental Example 3-20)

Retention rate: 99.2%, Retention rate evaluation result: A (High retention rate: good) (Experimental Example 3-21)

Retention rate: 98.4%, Retention rate evaluation result: A (High retention rate: good) (Experimental Example 3-22)

Retention rate: 98.0%, Retention rate evaluation result: A (High retention rate: good) (Experimental Example 3-23)

Retention rate: 97.8%, Retention rate evaluation result: A (High retention rate: good) (Experimental Example 3-24)

Retention rate: 97.9%, Retention rate evaluation result: A (High retention rate: good) (Experimental Example 3-25)

Retention rate: 99.2%, Retention rate evaluation result: A (High retention rate: good) (Experimental Example 3-26)

Retention rate: 96.6%, Retention rate evaluation result: A (High retention rate: good) (Experimental Example 3-27)

Retention rate: 97.8%, Retention rate evaluation result: A (High retention rate: good) (Experimental Example 3-28)

Retention rate: 99.2%, Retention rate evaluation result: A (High retention rate: good) (Experimental Example 3-29)

Retention rate: 97.5%, Retention rate evaluation result: A (High retention rate: good) (Experimental Example 3-30)

Retention rate: 99.2%, Retention rate evaluation result: A (High retention rate: good) (Experimental Example 3-31)

(iv) Adhesion between resist film formed through pre-baking step and workpiece

Adhesion evaluation result: A (adhesion is good) (Experimental Examples 3-2 to 3-31)

Experimental Examples 3-32 to 3-36

"Preparation of Polymer (F5)", "Preparation of Positive Resist Composition", and "Formation of Resist Pattern" were performed and similar measurements and evaluations were made as in Experimental Example 3-1 except that pre-baking step was performed at 90° C. for 10 minutes (Experimental Example 3-32); at 100° C. for 7.5 minutes (Experimental Example 3-33); at 110° C. for 5 minutes (Experimental Example 3-34); at 120° C. for 3 minutes (Experimental Example 3-35); and at 130° C. for 1 minute (Experimental Example 3-36). The results are given below and in FIG. 2B.

(i) Weight average molecular weight and molecular weight distribution of prepared polymer Weight average molecular weight: 51,522, molecular weight distribution: 1.403 (Experimental Example 3-32 to 3-36)

(ii) Weight average molecular weight and molecular weight distribution of polymer in resist film formed through pre-baking step Weight average molecular weight: 51,701, molecular weight distribution: 1.400 (Experimental Example 3-32)

Weight average molecular weight: 51,693, molecular weight distribution: 1.400 (Experimental Example 3-33)

Weight average molecular weight: 51,352, molecular weight distribution: 1.400 (Experimental Example 3-34)

Weight average molecular weight: 51,185, molecular weight distribution: 1.402 (Experimental Example 3-35)

Weight average molecular weight: 51,125, molecular weight distribution: 1.404 (Experimental Example 3-36)

(iii) Retention rate of weight average molecular weight of polymer in resist film formed through pre-baking Retention rate: 100.3%, Retention rate evaluation result: A (High retention rate: good) (Experimental Example 3-32)

Retention rate: 100.3%, Retention rate evaluation result: A (High retention rate: good) (Experimental Example 3-33)

Retention rate: 99.7%, Retention rate evaluation result: A (High retention rate: good) (Experimental Example 3-34)

Retention rate: 99.3%, Retention rate evaluation result: A (High retention rate: good) (Experimental Example 3-35)

Retention rate: 99.2%, Retention rate evaluation result: A (High retention rate: good) (Experimental Example 3-36)

(iv) Adhesion between resist film formed through pre-baking step and workpiece

Adhesion evaluation result: B (adhesion is low) (Experimental Examples 3-32 to 3-36)

Experimental Examples 3-37 to 3-40

"Preparation of Polymer (F5)", "Preparation of Positive Resist Composition", and "Formation of Resist Pattern" were performed and similar measurements and evaluations were made as in Experimental Example 3-1 except that the pre-baking step was performed at 170° C. for 7.5 minutes (Experimental Example 3-37); at 170° C. for 10 minutes (Experimental Example 3-38); at 180° C. for 5 minutes (Experimental Example 3-39); and at 190° C. for 3 minutes (Experimental Example 3-40). The results are given below and in FIG. 2B.

(i) Weight average molecular weight and molecular weight distribution of prepared polymer Weight average molecular weight: 51,522, molecular weight distribution: 1.403 (Experimental Examples 3-37 to 3-40)

(ii) Weight average molecular weight and molecular weight distribution of polymer in resist film formed through pre-baking step Weight average molecular weight: 49,097, molecular weight distribution: 1.437 (Experimental Example 3-37)

Weight average molecular weight: 48,745, molecular weight distribution: 1.451 (Experimental Example 3-38)

Weight average molecular weight: 47,836, molecular weight distribution: 1.456 (Experimental Example 3-39)

Weight average molecular weight: 48,405, molecular weight distribution: 1.462 (Experimental Example 3-40)

(iii) Retention rate of weight average molecular weight of polymer in resist film formed through pre-baking Retention rate: 95.3%, Retention rate evaluation result: B (Retention rate: low) (Experimental Example 3-37)

Retention rate: 94.6%, Retention rate evaluation result: B (Retention rate: low) (Experimental Example 3-38)

Retention rate: 92.8%, Retention rate evaluation result: B (Retention rate: low) (Experimental Example 3-39)

Retention rate: 93.9%, Retention rate evaluation result: B (Retention rate: low) (Experimental Example 3-40)

(iv) Adhesion between resist film formed through pre-baking step and workpiece

Adhesion evaluation result: A (adhesion is good) (Experimental Examples 3-37 to 3-40)

Example 4

Experimental Example 4-1

"Preparation of Polymer (F6)", "Preparation of Positive Resist Composition", and "Formation of Resist Pattern"

were performed and similar measurements and evaluations were made as in Experimental Example 2-1 except that n-butyl formate was used instead of isoamyl acetate and that the pre-baking step was performed at 100° C. for 10 minutes. The results are given below and in FIG. 3B.

<Measurement Evaluation Result>

Figure 3B:
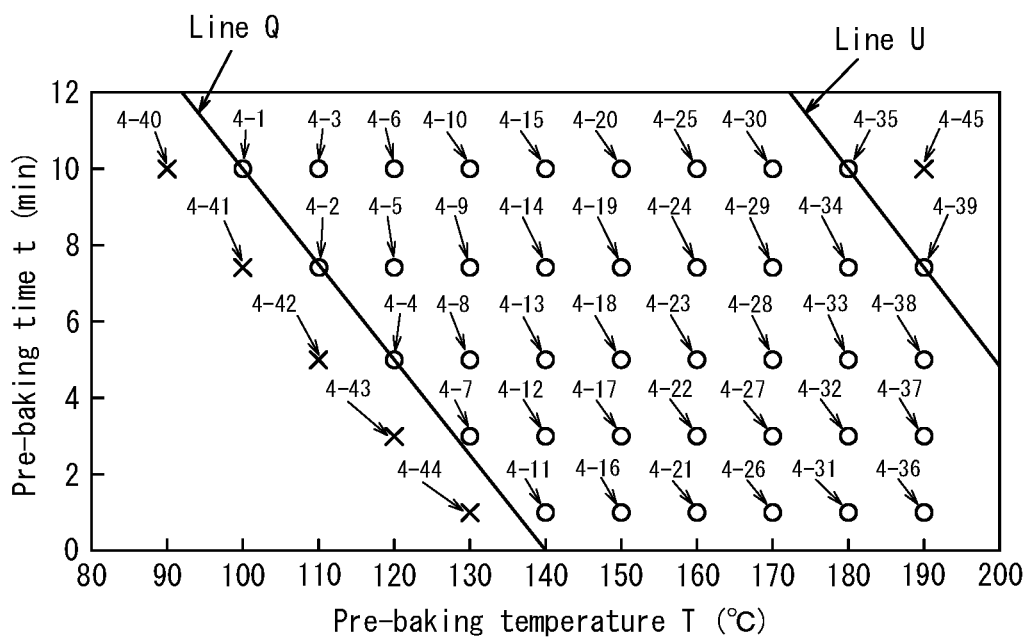
FIG. 3B shows a relationship between temperature T (° C.) and time t (min) in a pre-baking step in a resist film formation method using a positive resist composition containing polymer (F6) and n-butyl formate (upper graph), and, as a comparison, a relationship between temperature T (° C.) and time t (min) in a pre-baking step in a resist film formation method using a positive resist composition containing polymer (F6) and n-hexyl acetate (lower graph)
Figure 3B:
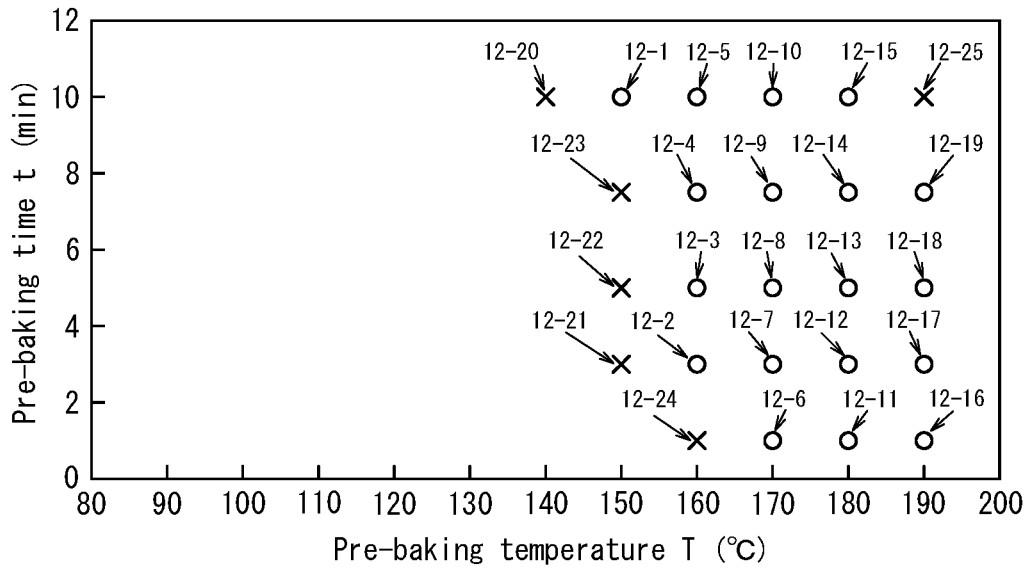

The measured weight average molecular weight and molecular weight distribution, the evaluation result of the retention rate of the weight average molecular weight, and the evaluation result of adhesion are given below and in FIG. 3B.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 48,624, molecular weight distribution: 1.283

(iii) Retention rate of weight average molecular weight of polymer in resist film formed through pre-baking Retention rate: 102.8%, Retention rate evaluation result: A (High retention rate: good)

(iv) Adhesion between resist film formed through pre-baking step and workpiece

Adhesion evaluation result: A (adhesion is good)

Experimental Examples 4-2 to 4-39

"Preparation of Polymer (F6)", "Preparation of Positive Resist Composition", and "Formation of Resist Pattern" were performed and similar measurements and evaluations were made as in Experimental Example 4-1 except the pre-baking step was performed at 110° C. for 7.5 minutes (Experimental Example 4-2); at 110° C. for 10 minutes (Experimental Example 4-3); at 120° C. for 5 minutes (Experimental Example 4-4); at 120° C. for 7.5 minutes (Experimental Example 4-5); at 120° C. for 10 minutes (Experimental Example 4-6); at 130° C. for 3 minutes (Experimental Example 4-7); at 130° C. for 5 minutes (Experimental Example 4-8); at 130° C. for 7.5 minutes (Experimental Example 4-9); at 130° C. for 10 minutes (Experimental Example 4-10); at 140° C. for 1 minute (Experimental Example 4-11); at 140° C. for 3 minutes (Experimental Example 4-12); at 140° C. for 5 minutes (Experimental Example 4-13); at 140° C. for 7.5 minutes (Experimental Example 4-14); at 140° C. for 10 minutes (Experimental Example 4-15); 150° C. for 1 minute (Experimental Example 4-16); at 150° C. for 3 minutes (Experimental Example 4-17); at 150° C. for 5 minutes (Experimental Example 4-18); at 150° C. for 7.5 minutes (Experimental Example 4-19); at 150° C. for 10 minutes (Experimental Example 4-20); at 160° C. for 1 minute (Experimental Example 4-21); at 160° C. for 3 minutes (Experimental Example 4-22); at 160° C. for 5 minutes (Experimental Example 4-23); at 160° C. for 7.5 minutes (Experimental Example 4-24); at 160° C. for 10 minutes (Experimental Example 4-25); at 170° C. for 1 minute (Experimental Example 4-26); at 170° C. for 3 minutes (Experimental Example 4-27); at 170° C. for 5 minutes (Experimental Example 4-28); at 170° C. for 7.5 minutes (Experimental Example 4-29); at 170° C. for 10 minutes (Experimental Example 4-30); at 180° C. for 1 minute (Experimental Example 4-31); at 180° C. for 3 minutes (Experimental Example 4-32); at 180° C. for 5 minutes (Experimental Example 4-33); at 180° C. for 7.5 minutes (Experimental Example 4-34); at 180° C. for 10 minutes (Experimental Example 4-35); at 190° C. for 1 minute (Experimental Example 4-36); at 190° C. for 3 minutes (Experimental Example 4-37); at 190° C. for 5 minutes (Experimental Example 4-38); and at 190° C. for 7.5 minutes (Experimental Example 4-39). The results are given below and in FIG. 3B.

(i) Weight average molecular weight and molecular weight distribution of prepared polymer Weight average molecular weight: 47,311, molecular weight distribution: 1.284 (Experimental Examples 4-2 to 4-39)

(ii) Weight average molecular weight and molecular weight distribution of polymer in resist film formed through pre-baking step Weight average molecular weight: 48,667, molecular weight distribution: 1.286 (Experimental Example 4-2)

Weight average molecular weight: 48,624, molecular weight distribution: 1.283 (Experimental Example 4-3)

Weight average molecular weight: 48,622, molecular weight distribution: 1.288 (Experimental Example 4-4)

Weight average molecular weight: 48,667, molecular weight distribution: 1.286 (Experimental Example 4-5)

Weight average molecular weight: 48,624, molecular weight distribution: 1.283 (Experimental Example 4-6)

Weight average molecular weight: 47,276, molecular weight distribution: 1.289 (Experimental Example 4-7)

Weight average molecular weight: 47,824, molecular weight distribution: 1.276 (Experimental Example 4-8)

Weight average molecular weight: 48,686, molecular weight distribution: 1.285 (Experimental Example 4-9)

Weight average molecular weight: 48,624, molecular weight distribution: 1.282 (Experimental Example 4-10)

Weight average molecular weight: 46,947, molecular weight distribution: 1.284 (Experimental Example 4-11)

Weight average molecular weight: 47,276, molecular weight distribution: 1.285 (Experimental Example 4-12)

Weight average molecular weight: 48,066, molecular weight distribution: 1.283 (Experimental Example 4-13)

Weight average molecular weight: 47,711, molecular weight distribution: 1.285 (Experimental Example 4-14)

Weight average molecular weight: 47,461, molecular weight distribution: 1.284 (Experimental Example 4-15)

Weight average molecular weight: 46,947, molecular weight distribution: 1.284 (Experimental Example 4-16)

Weight average molecular weight: 47,979, molecular weight distribution: 1.288 (Experimental Example 4-17)

Weight average molecular weight: 48,335, molecular weight distribution: 1.285 (Experimental Example 4-18)

Weight average molecular weight: 47,793, molecular weight distribution: 1.288 (Experimental Example 4-19)

Weight average molecular weight: 47,940, molecular weight distribution: 1.291 (Experimental Example 4-20)

Weight average molecular weight: 46,947, molecular weight distribution: 1.284 (Experimental Example 4-21)

Weight average molecular weight: 47,744, molecular weight distribution: 1.282 (Experimental Example 4-22)

Weight average molecular weight: 47,923, molecular weight distribution: 1.288 (Experimental Example 4-23)

Weight average molecular weight: 47,362, molecular weight distribution: 1.292 (Experimental Example 4-24)

Weight average molecular weight: 47,177, molecular weight distribution: 1.300 (Experimental Example 4-25)

Weight average molecular weight: 46,947, molecular weight distribution: 1.284 (Experimental Example 4-26)

Weight average molecular weight: 46,905, molecular weight distribution: 1.284 (Experimental Example 4-27)

Weight average molecular weight: 47,709, molecular weight distribution: 1.293 (Experimental Example 4-28)
Weight average molecular weight: 46,845, molecular weight distribution: 1.302 (Experimental Example 4-29)
Weight average molecular weight: 46,610, molecular weight distribution: 1.313 (Experimental Example 4-30)
Weight average molecular weight: 46,947, molecular weight distribution: 1.284 (Experimental Example 4-31)
Weight average molecular weight: 47,734, molecular weight distribution: 1.291 (Experimental Example 4-32)
Weight average molecular weight: 47,231, molecular weight distribution: 1.301 (Experimental Example 4-33)
Weight average molecular weight: 45,862, molecular weight distribution: 1.318 (Experimental Example 4-34)
Weight average molecular weight: 45,875, molecular weight distribution: 1.317 (Experimental Example 4-35)
Weight average molecular weight: 46,947, molecular weight distribution: 1.284 (Experimental Example 4-36)
Weight average molecular weight: 47,661, molecular weight distribution: 1.299 (Experimental Example 4-37)
Weight average molecular weight: 46,802, molecular weight distribution: 1.306 (Experimental Example 4-38)
Weight average molecular weight: 45,574, molecular weight distribution: 1.318 (Experimental Example 4-39)
(iii) Retention rate of weight average molecular weight of polymer in resist film formed through pre-baking
Retention rate: 102.9%, Retention rate evaluation result: A (High retention rate: good) (Experimental Example 4-2)
Retention rate: 102.8%, Retention rate evaluation result: A (High retention rate: good) (Experimental Example 4-3)
Retention rate: 102.8%, Retention rate evaluation result: A (High retention rate: good) (Experimental Example 4-4)
Retention rate: 102.9%, Retention rate evaluation result: A (High retention rate: good) (Experimental Example 4-5)
Retention rate: 102.8%, Retention rate evaluation result: A (High retention rate: good) (Experimental Example 4-6)
Retention rate: 99.9%, Retention rate evaluation result: A (High retention rate: good) (Experimental Example 4-7)
Retention rate: 101.1%, Retention rate evaluation result: A (High retention rate: good) (Experimental Example 4-8)
Retention rate: 102.9%, Retention rate evaluation result: A (High retention rate: good) (Experimental Example 4-9)
Retention rate: 102.8%, Retention rate evaluation result: A (High retention rate: good) (Experimental Example 4-10)
Retention rate: 99.2%, Retention rate evaluation result: A (High retention rate: good) (Experimental Example 4-11)
Retention rate: 99.9%, Retention rate evaluation result: A (High retention rate: good) (Experimental Example 4-12)
Retention rate: 101.6%, Retention rate evaluation result: A (High retention rate: good) (Experimental Example 4-13)
Retention rate: 100.8%, Retention rate evaluation result: A (High retention rate: good) (Experimental Example 4-14)
Retention rate: 100.3%, Retention rate evaluation result: A (High retention rate: good) (Experimental Example 4-15)
Retention rate: 99.2%, Retention rate evaluation result: A (High retention rate: good) (Experimental Example 4-16)
Retention rate: 101.4%, Retention rate evaluation result: A (High retention rate: good) (Experimental Example 4-17)
Retention rate: 102.2%, Retention rate evaluation result: A (High retention rate: good) (Experimental Example 4-18)
Retention rate: 101.0%, Retention rate evaluation result: A (High retention rate: good) (Experimental Example 4-19)
Retention rate: 101.3%, Retention rate evaluation result: A (High retention rate: good) (Experimental Example 4-20)
Retention rate: 99.2%, Retention rate evaluation result: A (High retention rate: good) (Experimental Example 4-21)
Retention rate: 100.9%, Retention rate evaluation result: A (High retention rate: good) (Experimental Example 4-22)
Retention rate: 101.3%, Retention rate evaluation result: A (High retention rate: good) (Experimental Example 4-23)
Retention rate: 100.1%, Retention rate evaluation result: A (High retention rate: good) (Experimental Example 4-24)
Retention rate: 99.7%, Retention rate evaluation result: A (High retention rate: good) (Experimental Example 4-25)
Retention rate: 99.2%, Retention rate evaluation result: A (High retention rate: good) (Experimental Example 4-26)
Retention rate: 99.1%, Retention rate evaluation result: A (High retention rate: good) (Experimental Example 4-27)
Retention rate: 100.8%, Retention rate evaluation result: A (High retention rate: good) (Experimental Example 4-28)
Retention rate: 99.0%, Retention rate evaluation result: A (High retention rate: good) (Experimental Example 4-29)
Retention rate: 98.5%, Retention rate evaluation result: A (High retention rate: good) (Experimental Example 4-30)
Retention rate: 99.2%, Retention rate evaluation result: A (High retention rate: good) (Experimental Example 4-31)
Retention rate: 100.9%, Retention rate evaluation result: A (High retention rate: good) (Experimental Example 4-32)
Retention rate: 99.8%, Retention rate evaluation result: A (High retention rate: good) (Experimental Example 4-33)
Retention rate: 96.9%, Retention rate evaluation result: A (High retention rate: good) (Experimental Example 4-34)
Retention rate: 97.0%, Retention rate evaluation result: A (High retention rate: good) (Experimental Example 4-35)
Retention rate: 99.2%, Retention rate evaluation result: A (High retention rate: good) (Experimental Example 4-36)
Retention rate: 100.7%, Retention rate evaluation result: A (High retention rate: good) (Experimental Example 4-37)
Retention rate: 98.9%, Retention rate evaluation result: A (High retention rate: good) (Experimental Example 4-38)
Retention rate: 96.3%, Retention rate evaluation result: A (High retention rate: good) (Experimental Example 4-39)
(iv) Adhesion between resist film formed through pre-baking step and workpiece
Adhesion evaluation result: A (adhesion is good) (Experimental Examples 4-2 to 4-39)

Experimental Examples 4-40 to 4-44

"Preparation of Polymer (F6)", "Preparation of Positive Resist Composition", and "Formation of Resist Pattern" were performed and similar measurements and evaluations were made as in Experimental Example 4-1 except that the pre-baking step was performed at 90° C. for 10 minutes (Experimental Example 4-40); at 100° C. for 7.5 minutes (Experimental Example 4-41); at 110° C. for 5 minutes (Experimental Example 4-42); at 120° C. for 3 minutes (Experimental Example 4-43); and at 130° C. for 1 minute (Experimental Example 4-44). The results are given below and in FIG. 3B.
(i) Weight average molecular weight and molecular weight distribution of prepared polymer
Weight average molecular weight: 47,311, molecular weight distribution: 1.284
(ii) Weight average molecular weight and molecular weight distribution of polymer in resist film formed through pre-baking step
Weight average molecular weight: 48,624, molecular weight distribution: 1.283 (Experimental Example 4-40)
Weight average molecular weight: 48,667, molecular weight distribution: 1.286 (Experimental Example 4-41)
Weight average molecular weight: 48,622, molecular weight distribution: 1.288 (Experimental Example 4-42)

Weight average molecular weight: 47,044, molecular weight distribution: 1.285 (Experimental Example 4-43)

Weight average molecular weight: 46,947, molecular weight distribution: 1.284 (Experimental Example 4-44)

(iii) Retention rate of weight average molecular weight of polymer in resist film formed through pre-baking Retention rate: 102.8%, Retention rate evaluation result: A (High retention rate: good) (Experimental Example 4-40)

Retention rate: 102.9%, Retention rate evaluation result: A (High retention rate: good) (Experimental Example 4-41)

Retention rate: 102.8%, Retention rate evaluation result: A (High retention rate: good) (Experimental Example 4-42)

Retention rate: 99.4%, Retention rate evaluation result: A (High retention rate: good) (Experimental Example 4-43)

Retention rate: 99.2%, Retention rate evaluation result: A (High retention rate: good) (Experimental Example 4-44)

(iv) Adhesion between resist film formed through pre-baking step and workpiece

Adhesion evaluation result: B (adhesion is low) (Experimental Examples 4-40 to 4-44)

Experimental Example 4-45

"Preparation of Polymer (F6)", "Preparation of Positive Resist Composition", and "Formation of Resist Pattern" were performed and similar measurements and evaluations were made as in Experimental Example 4-1 except that the pre-baking step was performed at 190° C. for 10 minutes The results are given below and in FIG. 3B.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 45,191, molecular weight distribution: 1.323

(iii) Retention rate of weight average molecular weight of polymer in resist film formed through pre-baking Retention rate: 95.5%, Retention rate evaluation result: B (Retention rate: low)

(iv) Adhesion between resist film formed through pre-baking step and workpiece

Adhesion evaluation result: A (adhesion is good)

Example 5

Experimental Example 5-1

"Preparation of Polymer (F5)", "Preparation of Positive Resist Composition", and "Formation of Resist Pattern" were performed and similar measurements and evaluations were made as in Experimental Example 1-1 except that isobutyl formate was used instead of isoamyl acetate and that the pre-baking step was performed at 90° C. for 10 minutes. The results are given below and in FIG. 2C.

<Measurement Evaluation Result>

Figure 2C:
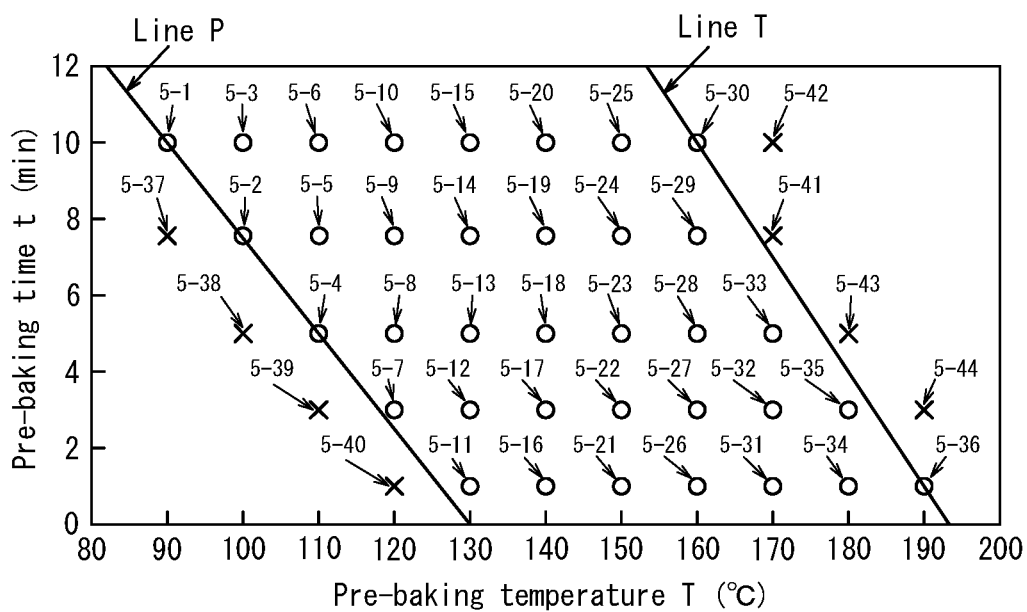
FIG. 2C shows a relationship between temperature T (° C.) and time t (min) in a pre-baking step in a resist film formation method using a positive resist composition containing polymer (F5) and isobutyl formate (upper graph), and, as a comparison, a relationship between temperature T (° C.) and time t (min) in a pre-baking step in a resist film formation method using a positive resist composition containing polymer (F5) and n-hexyl acetate (lower graph)
Figure 2C:
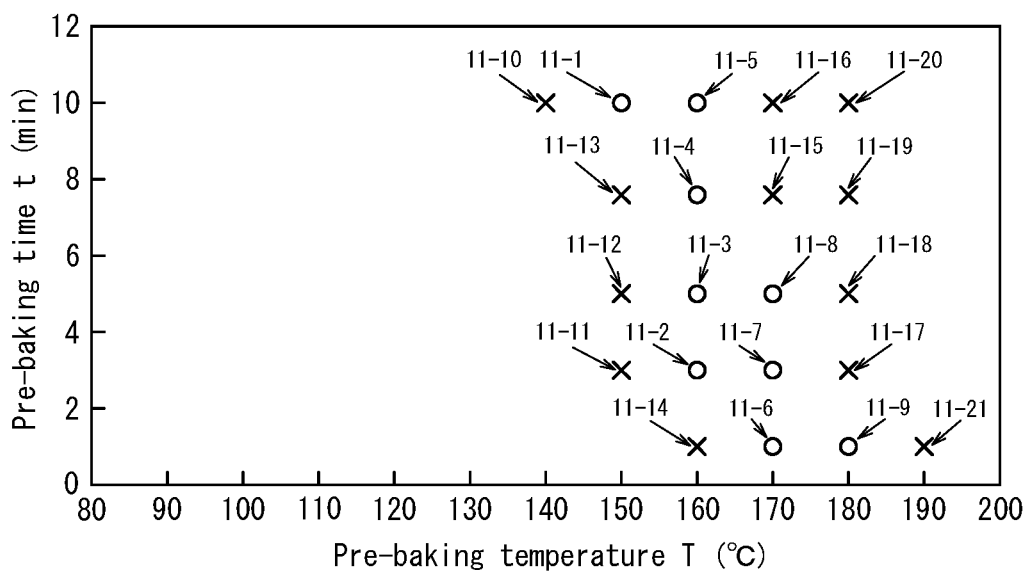

The measured weight average molecular weight and molecular weight distribution, the evaluation result of the retention rate of the weight average molecular weight, and the evaluation result of adhesion are given below and in FIG. 2C.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 51,685, molecular weight distribution: 1.400

(iii) Retention rate of weight average molecular weight of polymer in resist film formed through pre-baking Retention rate: 100.3%, Retention rate evaluation result: A (High retention rate: good)

(iv) Adhesion between resist film formed through pre-baking step and workpiece

Adhesion evaluation result: A (adhesion is good)

Experimental Example 5-2 to 5-36

"Preparation of Polymer (F5)", "Preparation of Positive Resist Composition", and "Formation of Resist Pattern" were performed and similar measurements and evaluations were made as in Experimental Example 5-1 except the pre-baking step was performed at 100° C. for 7.5 minutes (Experimental Example 5-2); at 100° C. for 10 minutes (Experimental Example 5-3); at 110° C. for 5 minutes (Experimental Example 5-4); at 110° C. for 7.5 minutes (Experimental Example 5-5); at 110° C. for 10 minutes (Experimental Example 5-6); at 120° C. for 3 minutes (Experimental Example 5-7); at 120° C. for 5 minutes (Experimental Example 5-8); at 120° C. for 7.5 minutes (Experimental Example 5-9); at 120° C. for 10 minutes (Experimental Example 5-10); at 130° C. for 1 minute (Experimental Example 5-11); at 130° C. for 3 minutes (Experimental Example 5-12); at 130° C. for 5 minutes (Experimental Example 5-13); at 130° C. for 7.5 minutes (Experimental Example 5-14); at 130° C. for 10 minutes (Experimental Example 5-15); at 140° C. for 1 minute (Experimental Example 5-16); at 140° C. for 3 minutes (Experimental Example 5-17); at 140° C. for 5 minutes (Experimental Example 5-18); at 140° C. for 7.5 minutes (Experimental Example 5-19); at 140° C. for 10 minutes (Experimental Example 5-20); at 150° C. for 1 minute (Experimental Example 5-21); at 150° C. for 3 minutes (Experimental Example 5-22); at 150° C. for 5 minutes (Experimental Example 5-23); at 150° C. for 7.5 minutes (Experimental Example 5-24); at 150° C. for 10 minutes (Experimental Example 5-25); at 160° C. for 1 minute (Experimental Example 5-26); at 160° C. for 3 minutes (Experimental Example 5-27); at 160° C. for 5 minutes (Experimental Example 5-28); at 160° C. for 7.5 minutes (Experimental Example 5-29); at 160° C. for 10 minutes (Experimental Example 5-30); at 170° C. for 1 minute (Experimental Example 5-31); at 170° C. for 3 minutes (Experimental Example 5-32); at 170° C. for 5 minutes (Experimental Example 5-33); at 180° C. for 1 minute (Experimental Example 5-34); at 180° C. for 3 minutes (Experimental Example 5-35); and at 190° C. for 1 minute (Experimental Example 5-36). The results are given below and in FIG. 2C.

(i) Weight average molecular weight and molecular weight distribution of prepared polymer Weight average molecular weight: 51,522, molecular weight distribution: 1.403 (Experimental Examples 5-2 to 5-36)

(ii) Weight average molecular weight and molecular weight distribution of polymer in resist film formed through pre-baking step Weight average molecular weight: 51,745, molecular weight distribution: 1.400 (Experimental Example 5-2)

Weight average molecular weight: 51,745, molecular weight distribution: 1.400 (Experimental Example 5-3)
Weight average molecular weight: 51,284, molecular weight distribution: 1.402 (Experimental Example 5-4)
Weight average molecular weight: 51,745, molecular weight distribution: 1.400 (Experimental Example 5-5)
Weight average molecular weight: 51,685, molecular weight distribution: 1.400 (Experimental Example 5-6)
Weight average molecular weight: 51,082, molecular weight distribution: 1.409 (Experimental Example 5-7)
Weight average molecular weight: 51,284, molecular weight distribution: 1.402 (Experimental Example 5-8)
Weight average molecular weight: 51,745, molecular weight distribution: 1.400 (Experimental Example 5-9)
Weight average molecular weight: 51,685, molecular weight distribution: 1.400 (Experimental Example 5-10)
Weight average molecular weight: 51,007, molecular weight distribution: 1.403 (Experimental Example 5-11)
Weight average molecular weight: 50,817, molecular weight distribution: 1.404 (Experimental Example 5-12)
Weight average molecular weight: 50,554, molecular weight distribution: 1.404 (Experimental Example 5-13)
Weight average molecular weight: 51,036, molecular weight distribution: 1.406 (Experimental Example 5-14)
Weight average molecular weight: 50,824, molecular weight distribution: 1.402 (Experimental Example 5-15)
Weight average molecular weight: 51,007, molecular weight distribution: 1.403 (Experimental Example 5-16)
Weight average molecular weight: 50,024, molecular weight distribution: 1.400 (Experimental Example 5-17)
Weight average molecular weight: 50,696, molecular weight distribution: 1.404 (Experimental Example 5-18)
Weight average molecular weight: 50,620, molecular weight distribution: 1.407 (Experimental Example 5-19)
Weight average molecular weight: 50,513, molecular weight distribution: 1.410 (Experimental Example 5-20)
Weight average molecular weight: 51,007, molecular weight distribution: 1.403 (Experimental Example 5-21)
Weight average molecular weight: 50,817, molecular weight distribution: 1.401 (Experimental Example 5-22)
Weight average molecular weight: 50,859, molecular weight distribution: 1.412 (Experimental Example 5-23)
Weight average molecular weight: 50,841, molecular weight distribution: 1.436 (Experimental Example 5-24)
Weight average molecular weight: 50,611, molecular weight distribution: 1.432 (Experimental Example 5-25)
Weight average molecular weight: 51,007, molecular weight distribution: 1.403 (Experimental Example 5-26)
Weight average molecular weight: 50,582, molecular weight distribution: 1.413 (Experimental Example 5-27)
Weight average molecular weight: 50,418, molecular weight distribution: 1.414 (Experimental Example 5-28)
Weight average molecular weight: 50,437, molecular weight distribution: 1.417 (Experimental Example 5-29)
Weight average molecular weight: 50,408, molecular weight distribution: 1.416 (Experimental Example 5-30)
Weight average molecular weight: 51,007, molecular weight distribution: 1.403 (Experimental Example 5-31)
Weight average molecular weight: 49,672, molecular weight distribution: 1.418 (Experimental Example 5-32)
Weight average molecular weight: 50,334, molecular weight distribution: 1.415 (Experimental Example 5-33)
Weight average molecular weight: 51,007, molecular weight distribution: 1.403 (Experimental Example 5-34)
Weight average molecular weight: 50,150, molecular weight distribution: 1.417 (Experimental Example 5-35)
Weight average molecular weight: 51,007, molecular weight distribution: 1.403 (Experimental Example 5-36)

(iii) Retention rate of weight average molecular weight of polymer in resist film formed through pre-baking Retention rate: 100.4%, Retention rate evaluation result: A (High retention rate: good) (Experimental Example 5-2)
Retention rate: 100.3%, Retention rate evaluation result: A (High retention rate: good) (Experimental Example 5-3)
Retention rate: 99.5%, Retention rate evaluation result: A (High retention rate: good) (Experimental Example 5-4)
Retention rate: 100.4%, Retention rate evaluation result: A (High retention rate: good) (Experimental Example 5-5)
Retention rate: 100.3%, Retention rate evaluation result: A (High retention rate: good) (Experimental Example 5-6)
Retention rate: 99.1%, Retention rate evaluation result: A (High retention rate: good) (Experimental Example 5-7)
Retention rate: 99.5%, Retention rate evaluation result: A (High retention rate: good) (Experimental Example 5-8)
Retention rate: 100.4%, Retention rate evaluation result: A (High retention rate: good) (Experimental Example 5-9)
Retention rate: 100.3%, Retention rate evaluation result: A (High retention rate: good) (Experimental Example 5-10)
Retention rate: 99.0%, Retention rate evaluation result: A (High retention rate: good) (Experimental Example 5-11)
Retention rate: 98.6%, Retention rate evaluation result: A (High retention rate: good) (Experimental Example 5-12)
Retention rate: 98.1%, Retention rate evaluation result: A (High retention rate: good) (Experimental Example 5-13)
Retention rate: 99.1%, Retention rate evaluation result: A (High retention rate: good) (Experimental Example 5-14)
Retention rate: 98.6%, Retention rate evaluation result: A (High retention rate: good) (Experimental Example 5-15)
Retention rate: 99.0%, Retention rate evaluation result: A (High retention rate: good) (Experimental Example 5-16)
Retention rate: 97.1%, Retention rate evaluation result: A (High retention rate: good) (Experimental Example 5-17)
Retention rate: 98.4%, Retention rate evaluation result: A (High retention rate: good) (Experimental Example 5-18)
Retention rate: 98.2%, Retention rate evaluation result: A (High retention rate: good) (Experimental Example 5-19)
Retention rate: 98.0%, Retention rate evaluation result: A (High retention rate: good) (Experimental Example 5-20)
Retention rate: 99.0%, Retention rate evaluation result: A (High retention rate: good) (Experimental Example 5-21)
Retention rate: 98.6%, Retention rate evaluation result: A (High retention rate: good) (Experimental Example 5-22)
Retention rate: 98.7%, Retention rate evaluation result: A (High retention rate: good) (Experimental Example 5-23)
Retention rate: 98.7%, Retention rate evaluation result: A (High retention rate: good) (Experimental Example 5-24)
Retention rate: 98.2%, Retention rate evaluation result: A (High retention rate: good) (Experimental Example 5-25)
Retention rate: 99.0%, Retention rate evaluation result: A (High retention rate: good) (Experimental Example 5-26)
Retention rate: 98.2%, Retention rate evaluation result: A (High retention rate: good) (Experimental Example 5-27)
Retention rate: 97.9%, Retention rate evaluation result: A (High retention rate: good) (Experimental Example 5-28)
Retention rate: 97.9%, Retention rate evaluation result: A (High retention rate: good) (Experimental Example 5-29)
Retention rate: 97.8%, Retention rate evaluation result: A (High retention rate: good) (Experimental Example 5-30)
Retention rate: 99.0%, Retention rate evaluation result: A (High retention rate: good) (Experimental Example 5-31)
Retention rate: 96.4%, Retention rate evaluation result: A (High retention rate: good) (Experimental Example 5-32)

Retention rate: 97.7%, Retention rate evaluation result: A (High retention rate: good) (Experimental Example 5-33)

Retention rate: 99.0%, Retention rate evaluation result: A (High retention rate: good) (Experimental Example 5-34)

Retention rate: 97.3%, Retention rate evaluation result: A (High retention rate: good) (Experimental Example 5-35)

Retention rate: 99.0%, Retention rate evaluation result: A (High retention rate: good) (Experimental Example 5-36)

(iv) Adhesion between resist film formed through pre-baking step and workpiece

Adhesion evaluation result: A (adhesion is good) (Experimental Examples 5-2 to 5-36)

Experimental Examples 5-37 to 5-40

"Preparation of Polymer (F5)", "Preparation of Positive Resist Composition", and "Formation of Resist Pattern" were performed and similar measurements and evaluations were made as in Experimental Example 5-1 except that the pre-baking step was performed at 90° C. for 7.5 minutes (Experimental Example 5-37); at 100° C. for 5 minutes (Experimental Example 5-38); at 110° C. for 3 minutes (Experimental Example 5-39); and at 120° C. for 1 minute (Experimental Example 5-40). The results are given below and in FIG. 2C.

(i) Weight average molecular weight and molecular weight distribution of prepared polymer Weight average molecular weight: 51,522, molecular weight distribution: 1.403 (Experimental Examples 5-37 to 5-40)

(ii) Weight average molecular weight and molecular weight distribution of polymer in resist film formed through pre-baking step Weight average molecular weight: 51,745, molecular weight distribution: 1.400 (Experimental Example 5-37)

Weight average molecular weight: 51,284, molecular weight distribution: 1.402 (Experimental Example 5-38)

Weight average molecular weight: 51,082, molecular weight distribution: 1.409 (Experimental Example 5-39)

Weight average molecular weight: 51,007, molecular weight distribution: 1.403 (Experimental Example 5-40)

(iii) Retention rate of weight average molecular weight of polymer in resist film formed through pre-baking Retention rate: 100.4%, Retention rate evaluation result: A (High retention rate: good) (Experimental Example 5-37)

Retention rate: 99.5%, Retention rate evaluation result: A (High retention rate: good) (Experimental Example 5-38)

Retention rate: 99.1%, Retention rate evaluation result: A (High retention rate: good) (Experimental Example 5-39)

Retention rate: 99.0%, Retention rate evaluation result: A (High retention rate: good) (Experimental Example 5-40)

(iv) Adhesion between resist film formed through pre-baking step and workpiece

Adhesion evaluation result: B (adhesion is low) (Experimental Example 5-37 to 5-40)

Experimental Examples 5-41 to 5-44

"Preparation of Polymer (F5)", "Preparation of Positive Resist Composition", and "Formation of Resist Pattern" were performed and similar measurements and evaluations were made as in Experimental Example 5-1 except that the pre-baking step was performed at 170° C. for 7.5 minutes (Experimental Example 5-41); at 170° C. for 10 minutes (Experimental Example 5-42); at 180° C. for 5 minutes (Experimental example 5-43); and at 190° C. for 3 minutes (Experimental Example 5-44). The results are given below and in FIG. 2C.

(i) Weight average molecular weight and molecular weight distribution of prepared polymer Weight average molecular weight: 51,522, molecular weight distribution: 1.403 (Experimental Examples 5-41 to 5-44)

(ii) Weight average molecular weight and molecular weight distribution of polymer in resist film formed through pre-baking step Weight average molecular weight: 49,012, molecular weight distribution: 1.441 (Experimental Example 5-41)

Weight average molecular weight: 48,023, molecular weight distribution: 1.454 (Experimental Example 5-42)

Weight average molecular weight: 48,121, molecular weight distribution: 1.435 (Experimental Example 5-43)

Weight average molecular weight: 48,307, molecular weight distribution: 1.437 (Experimental Example 5-44)

(iii) Retention rate of weight average molecular weight of polymer in resist film formed through pre-baking Retention rate: 95.1%, Retention rate evaluation result: B (Retention rate: low) (Example 5-41)

Retention rate: 93.2%, Retention rate evaluation result: B (Retention rate: low) (Example 5-42)

Retention rate: 93.4%, Retention rate evaluation result: B (Retention rate: low) (Example 5-43)

Retention rate: 93.8%, Retention rate evaluation result: B (Retention rate: low) (Example 5-44)

(iv) Adhesion between resist film formed through pre-baking step and workpiece

Adhesion evaluation result: A (adhesion is good) (Experimental Examples 5-41 to 5-44)

Example 6

Experimental Example 6-1

"Preparation of Polymer (F6)", "Preparation of Positive Resist Composition", and "Formation of Resist Pattern" were performed and similar measurements and evaluations were made as in Experimental Example 2-1 except that isobutyl formate was used instead of isoamyl acetate and that the pre-baking step was performed at 90° C. for 10 minutes. The results are given below and in FIG. 3C.

<Measurement Evaluation Result>

Figure 3C:
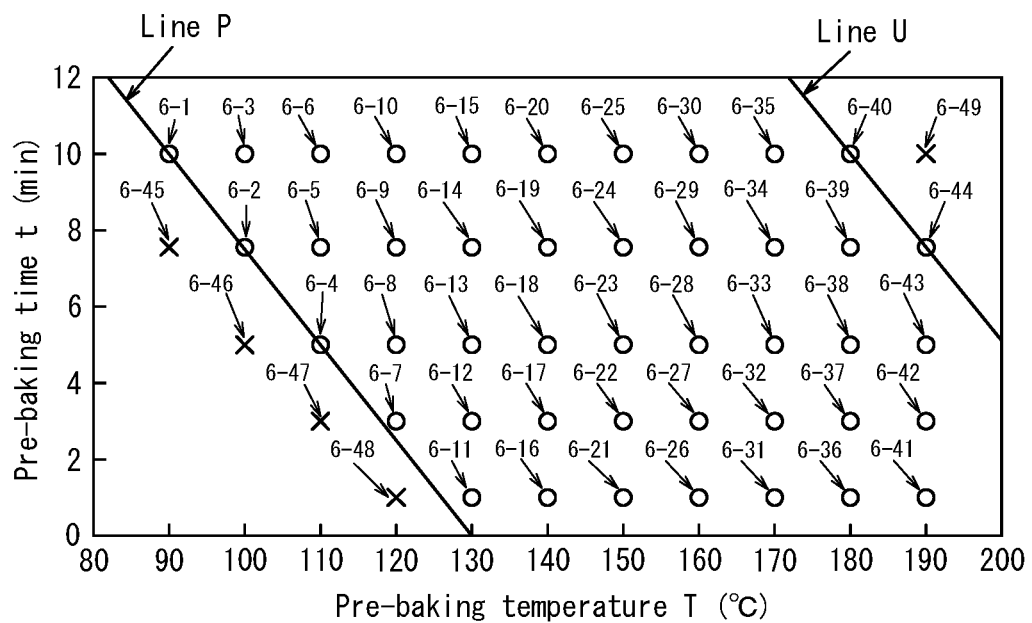
FIG. 3C shows a relationship between temperature T (° C.) and time t (min) in a pre-baking step in a resist film formation method using a positive resist composition containing polymer (F6) and isobutyl formate (upper graph), and, as a comparison, a relationship between temperature T (° C.) and time t (min) in a pre-baking step in a resist film formation method using a positive resist composition containing polymer (F6) and n-hexyl acetate (lower graph)
Figure 3C:
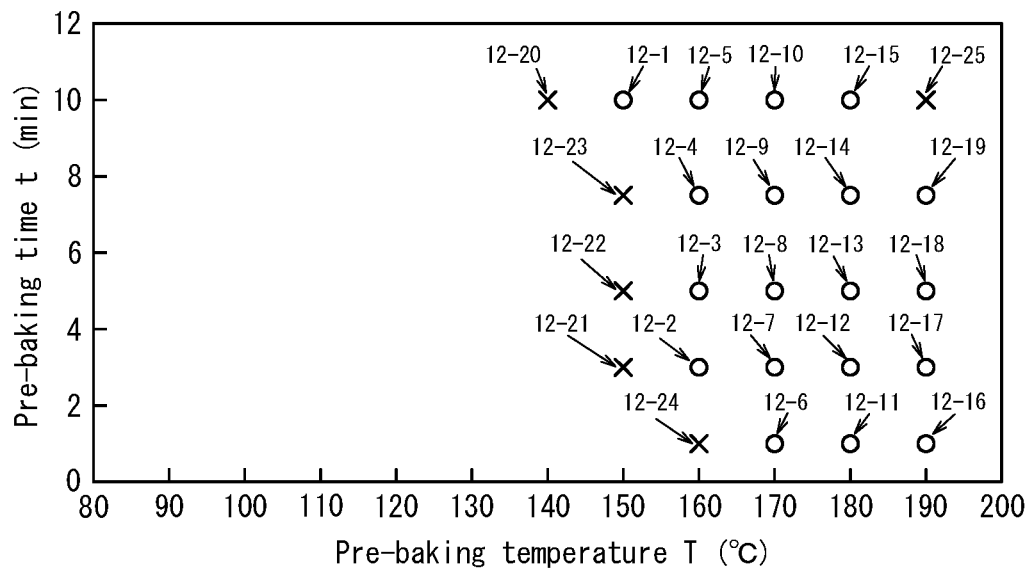

The measured weight average molecular weight and molecular weight distribution, the evaluation result of the retention rate of the weight average molecular weight, and the evaluation result of adhesion are given below and in FIG. 3C.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 48,980, molecular weight distribution: 1.283

(iii) Retention rate of weight average molecular weight of polymer in resist film formed through pre-baking Retention rate: 103.5%, Retention rate evaluation result: A (High retention rate: good)

(iv) Adhesion between resist film formed through pre-baking step and workpiece

Adhesion evaluation result: A (adhesion is good)

Experimental Examples 6-2 to 6-44

"Preparation of Polymer (F6)", "Preparation of Positive Resist Composition", and "Formation of Resist Pattern" were performed and similar measurements and evaluations were made as in Experimental Example 6-1 except the pre-baking step was performed at 100° C. for 7.5 minutes (Experimental Example 6-2); at 100° C. for 10 minutes (Experimental Example 6-3); at 110° C. for 5 minutes (Experimental Example 6-4); at 110° C. for 7.5 minutes (Experimental Example 6-5); at 110° C. for 10 minutes (Experimental Example 6-6); at 120° C. for 3 minutes (Experimental Example 6-7); at 120° C. for 5 minutes (Experimental Example 6-8); at 120° C. for 7.5 minutes (Experimental Example 6-9); at 120° C. for 10 minutes (Experimental Example 6-10); at 130° C. for 1 minute (Experimental Example 6-11); at 130° C. for 3 minutes (Experimental Example 6-12); at 130° C. for 5 minutes (Experimental Example 6-13); at 130° C. for 7.5 minutes (Experimental Example 6-14); at 130° C. for 10 minutes (Experimental Example 6-15); at 140° C. for 1 minute (Experimental Example 6-16); at 140° C. for 3 minutes (Experimental Example 6-17); at 140° C. for 5 minutes (Experimental Example 6-18); at 140° C. for 7.5 minutes (Experimental Example 6-19); at 140° C. for 10 minutes (Experimental Example 6-20); at 150° C. for 1 minute (Experimental Example 6-21); at 150° C. for 3 minutes (Experimental Example 6-22); at 150° C. for 5 minutes (Experimental Example 6-23); at 150° C. for 7.5 minutes (Experimental Example 6-24); at 150° C. for 10 minutes (Experimental Example 6-25); at 160° C. for 1 minute (Experimental Example 6-26); at 160° C. for 3 minutes (Experimental Example 6-27); at 160° C. for 5 minutes (Experimental Example 6-28); at 160° C. for 7.5 minutes (Experimental Example 6-29); at 160° C. for 10 minutes (Experimental Example 6-30); at 170° C. for 1 minute (Experimental Example 6-31); at 170° C. for 3 minutes (Experimental Example 6-32); at 170° C. for 5 minutes (Experimental Example 6-33); at 170° C. for 7.5 minutes (Experimental Example 6-34); at 170° C. for 10 minutes (Experimental Example 6-35); at 180° C. for 1 minute (Experimental Example 6-36); at 180° C. for 3 minutes (Experimental Example 6-37); at 180° C. for 5 minutes (Experimental Example 6-38); at 180° C. for 7.5 minutes (Experimental Example 6-39); at 180° C. for 10 minutes (Experimental Example 6-40); at 190° C. for 1 minute (Experimental Example 6-41); at 190° C. for 3 minutes (Experimental Example 6-42); at 190° C. for 5 minutes (Experimental Example 6-43); and at 190° C. for 7.5 minutes (Experimental Example 6-44). The results are given below and in FIG. 3C.

(i) Weight average molecular weight and molecular weight distribution of prepared polymer Weight average molecular weight: 47,311, molecular weight distribution: 1.284 (Experimental Examples 6-2 to 6-44)

(ii) Weight average molecular weight and molecular weight distribution of polymer in resist film formed through pre-baking step Weight average molecular weight: 49,001, molecular weight distribution: 1.283 (Experimental Example 6-2)

Weight average molecular weight: 48,980, molecular weight distribution: 1.283 (Experimental Example 6-3)

Weight average molecular weight: 49,055, molecular weight distribution: 1.286 (Experimental Example 6-4)

Weight average molecular weight: 49,001, molecular weight distribution: 1.283 (Experimental Example 6-5)

Weight average molecular weight: 48,980, molecular weight distribution: 1.283 (Experimental Example 6-6)

Weight average molecular weight: 48,999, molecular weight distribution: 1.288 (Experimental Example 6-7)

Weight average molecular weight: 49055, molecular weight distribution: 1.286 (Experimental Example 6-8)

Weight average molecular weight: 49,001, molecular weight distribution: 1.283 (Experimental Example 6-9)

Weight average molecular weight: 48,980, molecular weight distribution: 1.283 (Experimental Example 6-10)

Weight average molecular weight: 47,547, molecular weight distribution: 1.289 (Experimental Example 6-11)

Weight average molecular weight: 48,195, molecular weight distribution: 1.276 (Experimental Example 6-12)

Weight average molecular weight: 49,074, molecular weight distribution: 1.285 (Experimental Example 6-13)

Weight average molecular weight: 49,001, molecular weight distribution: 1.282 (Experimental Example 6-14)

Weight average molecular weight: 48,552, molecular weight distribution: 1.284 (Experimental Example 6-15)

Weight average molecular weight: 47,547, molecular weight distribution: 1.285 (Experimental Example 6-16)

Weight average molecular weight: 48,438, molecular weight distribution: 1.283 (Experimental Example 6-17)

Weight average molecular weight: 48,091, molecular weight distribution: 1.285 (Experimental Example 6-18)

Weight average molecular weight: 47,829, molecular weight distribution: 1.284 (Experimental Example 6-19)

Weight average molecular weight: 47,664, molecular weight distribution: 1.285 (Experimental Example 6-20)

Weight average molecular weight: 48,254, molecular weight distribution: 1.288 (Experimental Example 6-21)

Weight average molecular weight: 48,710, molecular weight distribution: 1.285 (Experimental Example 6-22)

Weight average molecular weight: 48,174, molecular weight distribution: 1.288 (Experimental Example 6-23)

Weight average molecular weight: 48,312, molecular weight distribution: 1.291 (Experimental Example 6-24)

Weight average molecular weight: 48,317, molecular weight distribution: 1.289 (Experimental Example 6-25)

Weight average molecular weight: 48,018, molecular weight distribution: 1.282 (Experimental Example 6-26)

Weight average molecular weight: 48,294, molecular weight distribution: 1.288 (Experimental Example 6-27)

Weight average molecular weight: 47,739, molecular weight distribution: 1.292 (Experimental Example 6-28)

Weight average molecular weight: 47,543, molecular weight distribution: 1.300 (Experimental Example 6-29)

Weight average molecular weight: 47,127, molecular weight distribution: 1.299 (Experimental Example 6-30)

Weight average molecular weight: 47,174, molecular weight distribution: 1.284 (Experimental Example 6-31)

Weight average molecular weight: 48,079, molecular weight distribution: 1.293 (Experimental Example 6-32)

Weight average molecular weight: 47,218, molecular weight distribution: 1.302 (Experimental Example 6-33)

Weight average molecular weight: 46,972, molecular weight distribution: 1.313 (Experimental Example 6-34)
Weight average molecular weight: 46,546, molecular weight distribution: 1.310 (Experimental Example 6-35)
Weight average molecular weight: 48,008, molecular weight distribution: 1.291 (Experimental Example 6-36)
Weight average molecular weight: 47,597, molecular weight distribution: 1.301 (Experimental Example 6-37)
Weight average molecular weight: 46,227, molecular weight distribution: 1.318 (Experimental Example 6-38)
Weight average molecular weight: 46,231, molecular weight distribution: 1.317 (Experimental Example 6-39)
Weight average molecular weight: 46,266, molecular weight distribution: 1.322 (Experimental Example 6-40)
Weight average molecular weight: 47,934, molecular weight distribution: 1.299 (Experimental Example 6-41)
Weight average molecular weight: 47,165, molecular weight distribution: 1.306 (Experimental Example 6-42)
Weight average molecular weight: 45,937, molecular weight distribution: 1.318 (Experimental Example 6-43)
Weight average molecular weight: 45,743, molecular weight distribution: 1.329 (Experimental Example 6-44)
(iii) Retention rate of weight average molecular weight of polymer in resist film formed through pre-baking
Retention rate: 103.6%, Retention rate evaluation result: A (High retention rate: good) (Experimental Example 6-2)
Retention rate: 103.5%, Retention rate evaluation result: A (High retention rate: good) (Experimental Example 6-3)
Retention rate: 103.7%, Retention rate evaluation result: A (High retention rate: good) (Experimental Example 6-4)
Retention rate: 103.6%, Retention rate evaluation result: A (High retention rate: good) (Experimental Example 6-5)
Retention rate: 103.5%, Retention rate evaluation result: A (High retention rate: good) (Experimental Example 6-6)
Retention rate: 103.6%, Retention rate evaluation result: A (High retention rate: good) (Experimental Example 6-7)
Retention rate: 103.7%, Retention rate evaluation result: A (High retention rate: good) (Experimental Example 6-8)
Retention rate: 103.6%, Retention rate evaluation result: A (High retention rate: good) (Experimental Example 6-9)
Retention rate: 103.5%, Retention rate evaluation result: A (High retention rate: good) (Experimental Example 6-10)
Retention rate: 100.5%, Retention rate evaluation result: A (High retention rate: good) (Experimental Example 6-11)
Retention rate: 101.9%, Retention rate evaluation result: A (High retention rate: good) (Experimental Example 6-12)
Retention rate: 103.7%, Retention rate evaluation result: A (High retention rate: good) (Experimental Example 6-13)
Retention rate: 103.6%, Retention rate evaluation result: A (High retention rate: good) (Experimental Example 6-14)
Retention rate: 102.6%, Retention rate evaluation result: A (High retention rate: good) (Experimental Example 6-15)
Retention rate: 100.5%, Retention rate evaluation result: A (High retention rate: good) (Experimental Example 6-16)
Retention rate: 102.4%, Retention rate evaluation result: A (High retention rate: good) (Experimental Example 6-17)
Retention rate: 101.6%, Retention rate evaluation result: A (High retention rate: good) (Experimental Example 6-18)
Retention rate: 101.1%, Retention rate evaluation result: A (High retention rate: good) (Experimental Example 6-19)
Retention rate: 100.7%, Retention rate evaluation result: A (High retention rate: good) (Experimental Example 6-20)
Retention rate: 102.0%, Retention rate evaluation result: A (High retention rate: good) (Experimental Example 6-21)
Retention rate: 103.0%, Retention rate evaluation result: A (High retention rate: good) (Experimental Example 6-22)
Retention rate: 101.8%, Retention rate evaluation result: A (High retention rate: good) (Experimental Example 6-23)
Retention rate: 102.1%, Retention rate evaluation result: A (High retention rate: good) (Experimental Example 6-24)
Retention rate: 102.1%, Retention rate evaluation result: A (High retention rate: good) (Experimental Example 6-25)
Retention rate: 101.5%, Retention rate evaluation result: A (High retention rate: good) (Experimental Example 6-26)
Retention rate: 102.1%, Retention rate evaluation result: A (High retention rate: good) (Experimental Example 6-27)
Retention rate: 100.9%, Retention rate evaluation result: A (High retention rate: good) (Experimental Example 6-28)
Retention rate: 100.5%, Retention rate evaluation result: A (High retention rate: good) (Experimental Example 6-29)
Retention rate: 99.6%, Retention rate evaluation result: A (High retention rate: good) (Experimental Example 6-30)
Retention rate: 99.7%, Retention rate evaluation result: A (High retention rate: good) (Experimental Example 6-31)
Retention rate: 101.6%, Retention rate evaluation result: A (High retention rate: good) (Experimental Example 6-32)
Retention rate: 99.8%, Retention rate evaluation result: A (High retention rate: good) (Experimental Example 6-33)
Retention rate: 99.3%, Retention rate evaluation result: A (High retention rate: good) (Experimental Example 6-34)
Retention rate: 98.4%, Retention rate evaluation result: A (High retention rate: good) (Experimental Example 6-35)
Retention rate: 101.5%, Retention rate evaluation result: A (High retention rate: good) (Experimental Example 6-36)
Retention rate: 100.6%, Retention rate evaluation result: A (High retention rate: good) (Experimental Example 6-37)
Retention rate: 97.7%, Retention rate evaluation result: A (High retention rate: good) (Experimental Example 6-38)
Retention rate: 97.7%, Retention rate evaluation result: A (High retention rate: good) (Experimental Example 6-39)
Retention rate: 97.8%, Retention rate evaluation result: A (High retention rate: good) (Experimental Example 6-40)
Retention rate: 101.3%, Retention rate evaluation result: A (High retention rate: good) (Experimental Example 6-41)
Retention rate: 99.7%, Retention rate evaluation result: A (High retention rate: good) (Experimental Example 6-42)
Retention rate: 97.1%, Retention rate evaluation result: A (High retention rate: good) (Experimental Example 6-43)
Retention rate: 96.7%, Retention rate evaluation result: A (High retention rate: good) (Experimental Example 6-44)
(iv) Adhesion between resist film formed through pre-baking step and workpiece
Adhesion evaluation result: A (adhesion is good) (Experimental Examples 6-2 to 6-44)

Experimental Examples 6-45 to 6-48

"Preparation of Polymer (F6)", "Preparation of Positive Resist Composition", and "Formation of Resist Pattern" were performed and similar measurements and evaluations were made as in Experimental Example 6-1 except that the pre-baking step was performed at 90° C. for 7.5 minutes (Experimental Example 6-45); at 100° C. for 5 minutes (Experimental Example 6-46); at 110° C. for 3 minutes (Experimental Example 6-47); and at 120° C. for 1 minute (Experimental Example 6-48). The results are given below and in FIG. 3C.
(i) Weight average molecular weight and molecular weight distribution of prepared polymer
Weight average molecular weight: 47,311, molecular weight distribution: 1.284 (Experimental Examples 6-45 to 6-48)

(ii) Weight average molecular weight and molecular weight distribution of polymer in resist film formed through pre-baking step Weight average molecular weight: 49,001, molecular weight distribution: 1.283 (Experimental Example 6-45)

Weight average molecular weight: 49,055, molecular weight distribution: 1.286 (Experimental Example 6-46)

Weight average molecular weight: 48,999, molecular weight distribution: 1.288 (Experimental Example 6-47)

Weight average molecular weight: 47,314, molecular weight distribution: 1.285 (Experimental Example 6-48)

(iii) Retention rate of weight average molecular weight of polymer in resist film formed through pre-baking Retention rate: 103.6%, Retention rate evaluation result: A (High retention rate: good) (Experimental Example 6-45)

Retention rate: 103.7%, Retention rate evaluation result: A (High retention rate: good) (Experimental Example 6-46)

Retention rate: 103.6%, Retention rate evaluation result: A (High retention rate: good) (Experimental Example 6-47)

Retention rate: 100.0%, Retention rate evaluation result: A (High retention rate: good) (Experimental Example 6-48)

(iv) Adhesion between resist film formed through pre-baking step and workpiece

Adhesion evaluation result: B (low adhesion) (Experimental Examples 6-45 to 6-48)

Experimental Example 6-49

"Preparation of Polymer (F6)", "Preparation of Positive Resist Composition", and "Formation of Resist Pattern" were performed and similar measurements and evaluations were made as in Experimental Example 6-1 except that the pre-baking step was performed at 190° C. for 10 minutes. The results are given below and in FIG. 3C.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 44,504, molecular weight distribution: 1.347

(iii) Retention rate of weight average molecular weight of polymer in resist film formed through pre-baking Retention rate: 94.1%, Retention rate evaluation result: B (Retention rate: low)

(iv) Adhesion between resist film formed through pre-baking step and workpiece

Adhesion evaluation result: A (adhesion is good)

Example 7

Experimental Example 7-1

"Preparation of Polymer (F5)", "Preparation of Positive Resist Composition", and "Formation of Resist Pattern" were performed and similar measurements and evaluations were made as in Experimental Example 1-1 except that n-amyl formate was used instead of isoamyl acetate and that the pre-baking step was performed at 110° C. for 10 minutes. The results are given below and in FIG. 2D.

<Measurement Evaluation Result>

Figure 2D:
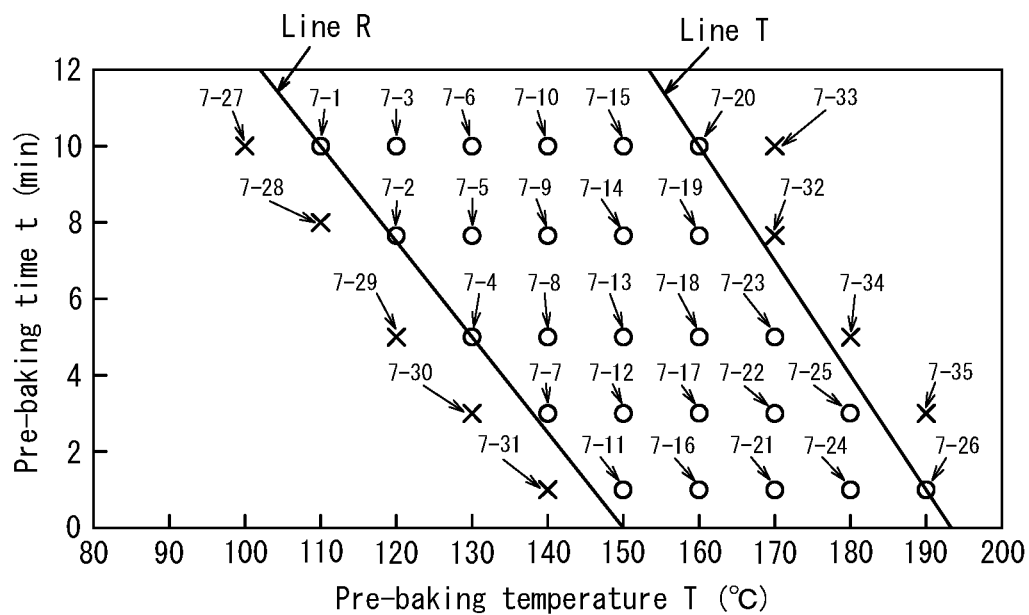
FIG. 2D shows a relationship between temperature T (° C.) and time t (min) in a pre-baking step in a resist film formation method using a positive resist composition containing polymer (F5) and n-amyl formate (upper graph), and, as a comparison, a relationship between temperature T (° C.) and time t (min) in a pre-baking step in a resist film formation method using a positive resist composition containing polymer (F5) and n-hexyl acetate (lower graph)
Figure 2D:
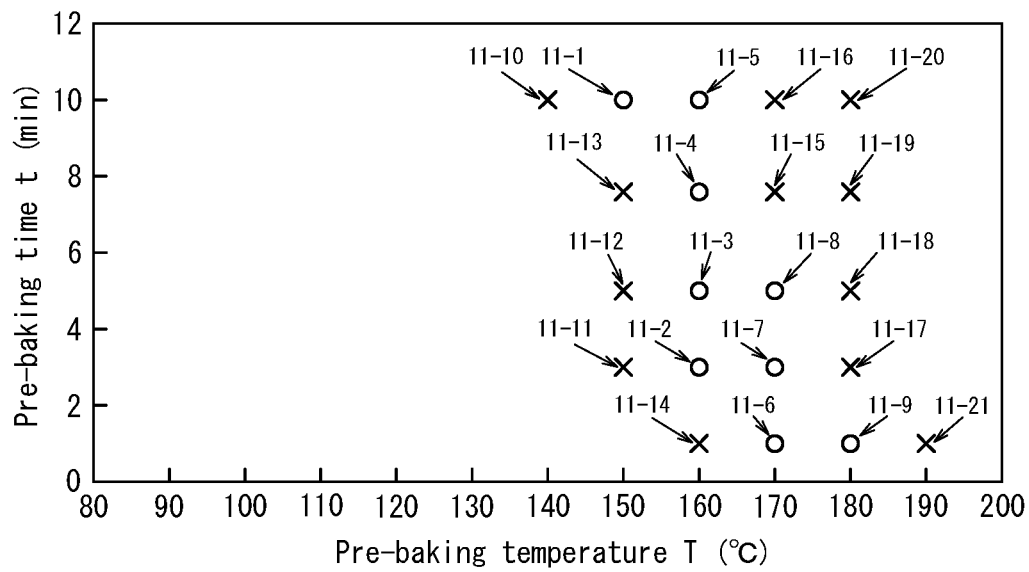
Figure 2E:
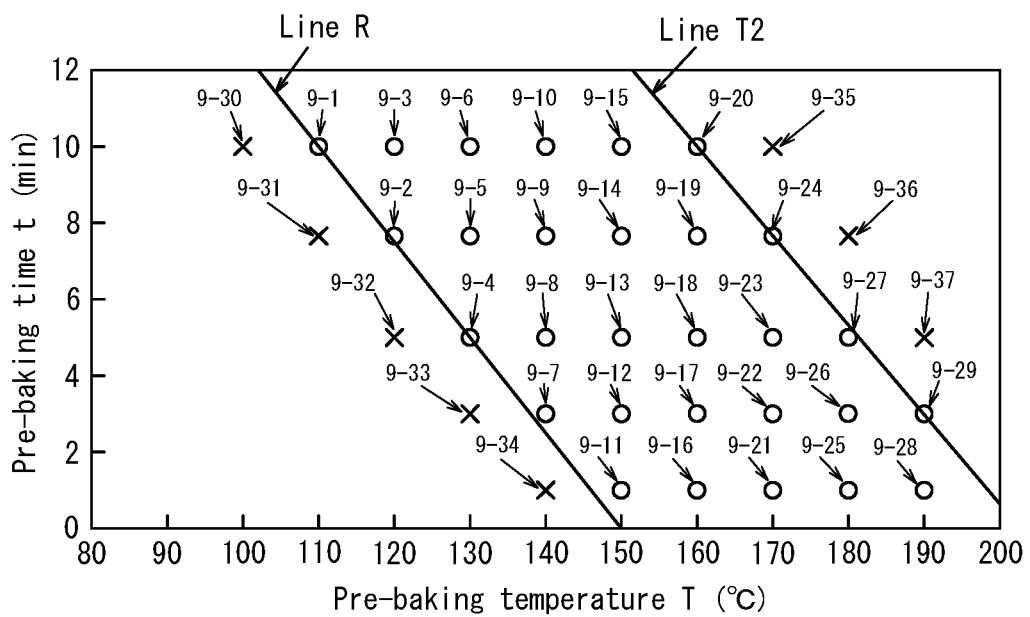
FIG. 2E shows a relationship between temperature T (° C.) and time t (min) in a pre-baking step in a resist film formation method using a positive resist composition containing polymer (F5) and isoamyl formate (upper graph), and, as a comparison, a relationship between temperature T (° C.) and time t (min) in a pre-baking step in a resist film formation method using a positive resist composition containing polymer (F5) and n-hexyl acetate (lower graph)
Figure 2E:
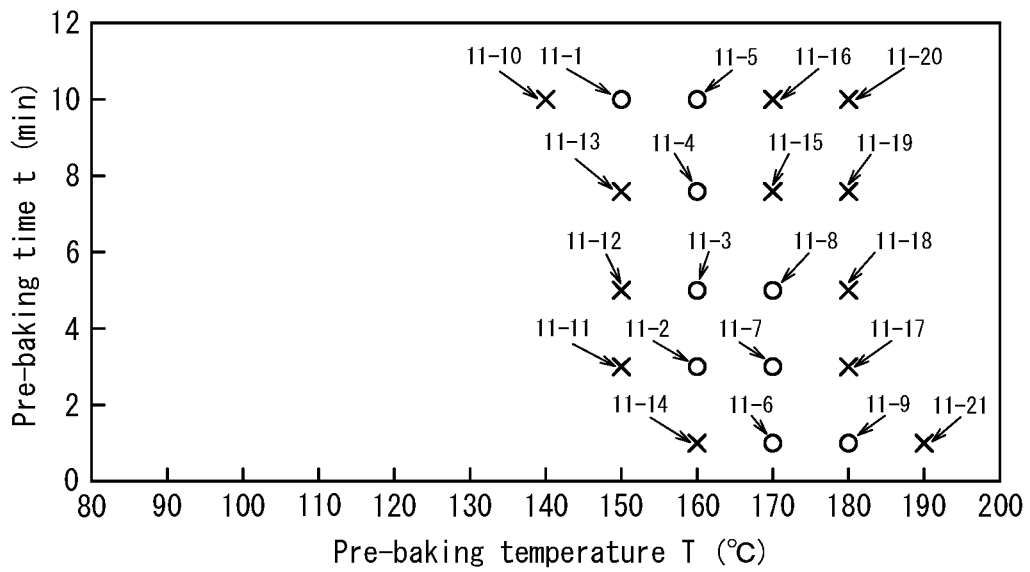

The measured weight average molecular weight and molecular weight distribution, the evaluation result of the retention rate of the weight average molecular weight, and the evaluation result of adhesion are given below and in FIG. 2D.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 51,690, molecular weight distribution: 1.400

(iii) Retention rate of weight average molecular weight of polymer in resist film formed through pre-baking Retention rate: 100.3%, Retention rate evaluation result: A (High retention rate: good)

(iv) Adhesion between resist film formed through pre-baking step and workpiece

Adhesion evaluation result: A (adhesion is good)

Experimental Examples 7-2 to 7-26

"Preparation of Polymer (F5)", "Preparation of Positive Resist Composition", and "Formation of Resist Pattern" were performed and similar measurements and evaluations were made as in Experimental Example 7-1 except the pre-baking step was performed at 120° C. for 7.5 minutes (Experimental Example 7-2); at 120° C. for 10 minutes (Experimental Example 7-3); at 130° C. for 5 minutes (Experimental Example 7-4); at 130° C. for 7.5 minutes (Experimental Example 7-5); at 130° C. for 10 minutes (Experimental Example 7-6); at 140° C. for 3 minutes (Experimental Example 7-7); at 140° C. for 5 minutes (Experimental Example 7-8); at 140° C. for 7.5 minutes (Experimental Example 7-9); at 140° C. for 10 minutes (Experimental Example 7-10); at 150° C. for 1 minute (Experimental Example 7-11); at 150° C. for 3 minutes (Experimental Example 7-12); at 150° C. for 5 minutes (Experimental Example 7-13); at 150° C. for 7.5 minutes (Experimental Example 7-14); at 150° C. for 10 minutes (Experimental Example 7-15); at 160° C. for 1 minute (Experimental Example 7-16); at 160° C. for 3 minutes (Experimental Example 7-17); at 160° C. for 5 minutes (Experimental Example 7-18); at 160° C. for 7.5 minutes (Experimental Example 7-19); at 160° C. for 10 minutes (Experimental Example 7-20); at 170° C. for 1 minute (Experimental Example 7-21); at 170° C. for 3 minutes (Experimental Example 7-22); at 170° C. for 5 minutes (Experimental Example 7-23); at 180° C. for 1 minute (Experimental Example 7-24); at 180° C. for 3 minutes (Experimental Example 7-25); and at 190° C. for 1 minute (Experimental Example 7-26). The results are given below and in FIG. 2D.

(i) Weight average molecular weight and molecular weight distribution of prepared polymer Weight average molecular weight: 51,522, molecular weight distribution: 1.403 (Experimental Examples 7-2 to 7-26)

(ii) Weight average molecular weight and molecular weight distribution of polymer in resist film formed through pre-baking step Weight average molecular weight: 51,808, molecular weight distribution: 1.400 (Experimental Example 7-2)

Weight average molecular weight: 51,690, molecular weight distribution: 1.400 (Experimental Example 7-3)

Weight average molecular weight: 50,620, molecular weight distribution: 1.404 (Experimental Example 7-4)

Weight average molecular weight: 51,098, molecular weight distribution: 1.406 (Experimental Example 7-5)
Weight average molecular weight: 50,829, molecular weight distribution: 1.402 (Experimental Example 7-6)
Weight average molecular weight: 50,014, molecular weight distribution: 1.400 (Experimental Example 7-7)
Weight average molecular weight: 50,762, molecular weight distribution: 1.404 (Experimental Example 7-8)
Weight average molecular weight: 50,681, molecular weight distribution: 1.407 (Experimental Example 7-9)
Weight average molecular weight: 50,518, molecular weight distribution: 1.410 (Experimental Example 7-10)
Weight average molecular weight: 51,429, molecular weight distribution: 1.403 (Experimental Example 7-11)
Weight average molecular weight: 50,806, molecular weight distribution: 1.401 (Experimental Example 7-12)
Weight average molecular weight: 50,926, molecular weight distribution: 1.412 (Experimental Example 7-13)
Weight average molecular weight: 50,902, molecular weight distribution: 1.436 (Experimental Example 7-14)
Weight average molecular weight: 50,616, molecular weight distribution: 1.432 (Experimental Example 7-15)
Weight average molecular weight: 51,429, molecular weight distribution: 1.403 (Experimental Example 7-16)
Weight average molecular weight: 50,572, molecular weight distribution: 1.413 (Experimental Example 7-17)
Weight average molecular weight: 50,484, molecular weight distribution: 1.414 (Experimental Example 7-18)
Weight average molecular weight: 50,498, molecular weight distribution: 1.417 (Experimental Example 7-19)
Weight average molecular weight: 50,414, molecular weight distribution: 1.416 (Experimental Example 7-20)
Weight average molecular weight: 51,429, molecular weight distribution: 1.403 (Experimental Example 7-21)
Weight average molecular weight: 49,662, molecular weight distribution: 1.418 (Experimental Example 7-22)
Weight average molecular weight: 50,400, molecular weight distribution: 1.415 (Experimental Example 7-23)
Weight average molecular weight: 51,429, molecular weight distribution: 1.403 (Experimental Example 7-24)
Weight average molecular weight: 50,140, molecular weight distribution: 1.417 (Experimental Example 7-25)
Weight average molecular weight: 51,429, molecular weight distribution: 1.403 (Experimental Example 7-26)
(iii) Retention rate of weight average molecular weight of polymer in resist film formed through pre-baking
Retention rate: 100.6%, Retention rate evaluation result: A (High retention rate: good) (Experimental Example 7-2)
Retention rate: 100.3%, Retention rate evaluation result: A (High retention rate: good) (Experimental Example 7-3)
Retention rate: 98.2%, Retention rate evaluation result: A (High retention rate: good) (Experimental Example 7-4)
Retention rate: 99.2%, Retention rate evaluation result: A (High retention rate: good) (Experimental Example 7-5)
Retention rate: 98.7%, Retention rate evaluation result: A (High retention rate: good) (Experimental Example 7-6)
Retention rate: 97.1%, Retention rate evaluation result: A (High retention rate: good) (Experimental Example 7-7)
Retention rate: 98.5%, Retention rate evaluation result: A (High retention rate: good) (Experimental Example 7-8)
Retention rate: 98.4%, Retention rate evaluation result: A (High retention rate: good) (Experimental Example 7-9)
Retention rate: 98.1%, Retention rate evaluation result: A (High retention rate: good) (Experimental Example 7-10)
Retention rate: 99.8%, Retention rate evaluation result: A (High retention rate: good) (Experimental Example 7-11)
Retention rate: 98.6%, Retention rate evaluation result: A (High retention rate: good) (Experimental Example 7-12)
Retention rate: 98.8%, Retention rate evaluation result: A (High retention rate: good) (Experimental Example 7-13)
Retention rate: 98.8%, Retention rate evaluation result: A (High retention rate: good) (Experimental Example 7-14)
Retention rate: 98.2%, Retention rate evaluation result: A (High retention rate: good) (Experimental Example 7-15)
Retention rate: 99.8%, Retention rate evaluation result: A (High retention rate: good) (Experimental Example 7-16)
Retention rate: 98.2%, Retention rate evaluation result: A (High retention rate: good) (Experimental Example 7-17)
Retention rate: 98.0%, Retention rate evaluation result: A (High retention rate: good) (Experimental Example 7-18)
Retention rate: 98.0%, Retention rate evaluation result: A (High retention rate: good) (Experimental Example 7-19)
Retention rate: 97.8%, Retention rate evaluation result: A (High retention rate: good) (Experimental Example 7-20)
Retention rate: 99.8%, Retention rate evaluation result: A (High retention rate: good) (Experimental Example 7-21)
Retention rate: 96.4%, Retention rate evaluation result: A (High retention rate: good) (Experimental Example 7-22)
Retention rate: 97.8%, Retention rate evaluation result: A (High retention rate: good) (Experimental Example 7-23)
Retention rate: 99.8%, Retention rate evaluation result: A (High retention rate: good) (Experimental Example 7-24)
Retention rate: 97.3%, Retention rate evaluation result: A (High retention rate: good) (Experimental Example 7-25)
Retention rate: 99.8%, Retention rate evaluation result: A (High retention rate: good) (Experimental Example 7-26)
(iv) Adhesion between resist film formed through pre-baking step and workpiece
Adhesion evaluation result: A (adhesion is good) (Experimental Examples 7-2 to 7-26)

Experimental Examples 7-27 to 7-31

"Preparation of Polymer (F5)", "Preparation of Positive Resist Composition", and "Formation of Resist Pattern" were performed and similar measurements and evaluations were made as in Experimental Example 7-1 except the pre-baking step was performed at 100° C. for 10 minutes (Experimental Example 7-27); at 110° C. for 7.5 minutes (Experimental Example 7-28); at 120° C. for 5 minutes (Experimental Example 7-29); at 130° C. for 3 minutes (Experimental Example 7-30); and at 140° C. for 1 minute (Experimental Example 7-31). The results are given below and in FIG. 2D.
(i) Weight average molecular weight and molecular weight distribution of prepared polymer
Weight average molecular weight: 51,522, molecular weight distribution: 1.403 (Experimental Examples 7-27 to 7-31)
(ii) Weight average molecular weight and molecular weight distribution of polymer in resist film formed through pre-baking step
Weight average molecular weight: 51,690, molecular weight distribution: 1.400 (Experimental Example 7-27)
Weight average molecular weight: 51,808, molecular weight distribution: 1.400 (Experimental Example 7-28)
Weight average molecular weight: 51,352, molecular weight distribution: 1.402 (Experimental Example 7-29)
Weight average molecular weight: 50,806, molecular weight distribution: 1.404 (Experimental Example 7-30)
Weight average molecular weight: 51,429, molecular weight distribution: 1.403 (Experimental Example 7-31)

(iii) Retention rate of weight average molecular weight of polymer in resist film formed through pre-baking Retention rate: 100.3%, Retention rate evaluation result: A (High retention rate: good) (Experimental Example 7-27)

Retention rate: 100.6%, Retention rate evaluation result: A (High retention rate: good) (Experimental Example 7-28)

Retention rate: 99.7%, Retention rate evaluation result: A (High retention rate: good) (Experimental Example 7-29)

Retention rate: 98.6%, Retention rate evaluation result: A (High retention rate: good) (Experimental Example 7-30)

Retention rate: 99.8%, Retention rate evaluation result: A (High retention rate: good) (Experimental Example 7-31)

(iv) Adhesion between resist film formed through pre-baking step and workpiece

Adhesion evaluation result: B (low adhesion) (Experimental Examples 7-27 to 7-31)

Experimental Examples 7-32 to 7-35

"Preparation of Polymer (F5)", "Preparation of Positive Resist Composition", and "Formation of Resist Pattern" were performed and similar measurements and evaluations were made as in Experimental Example 7-1 except the pre-baking step was performed at 170° C. for 7.5 minutes (Experimental Example 7-32); at 170° C. for 10 minutes (Experimental Example 7-33); at 180° C. for 5 minutes (Experimental Example 7-34); and at 190° C. for 3 minutes (Experimental Example 7-35). The results are given below and in FIG. 2D.

(i) Weight average molecular weight and molecular weight distribution of prepared polymer Weight average molecular weight: 51,522, molecular weight distribution: 1.403 (Experimental Examples 7-32 to 7-35)

(ii) Weight average molecular weight and molecular weight distribution of polymer in resist film formed through pre-baking step Weight average molecular weight: 49,206, molecular weight distribution: 1.437 (Experimental Example 7-32)

Weight average molecular weight: 48,735, molecular weight distribution: 1.452 (Experimental Example 7-33)

Weight average molecular weight: 47,836, molecular weight distribution: 1.448 (Experimental Example 7-34)

Weight average molecular weight: 48,297, molecular weight distribution: 1.437 (Experimental Example 7-35)

(iii) Retention rate of weight average molecular weight of polymer in resist film formed through pre-baking Retention rate: 95.5%, Retention rate evaluation result: B (Retention rate: low) (Example 7-32)

Retention rate: 94.6%, Retention rate evaluation result: B (Retention rate: low) (Example 7-33) Retention rate: 92.8%, Retention rate evaluation result: B (Retention rate: low) (Example 7-34)

Retention rate: 93.7%, Retention rate evaluation result: B (Retention rate: low) (Example 7-35)

(iv) Adhesion between resist film formed through pre-baking step and workpiece

Adhesion evaluation result: A (adhesion is good) (Experimental Examples 7-32 to 7-35)

Example 8

Experimental Example 8-1

"Preparation of Polymer (F6)", "Preparation of Positive Resist Composition", and "Formation of Resist Pattern" were performed and similar measurements and evaluations were made as in Experimental Example 2-1 except that n-amyl formate was used instead of isoamyl acetate and that the pre-baking step was performed at 110° C. for 10 minutes. The results are given below and in FIG. 3D.

<<Measurement Evaluation Result>

Figure 3D:
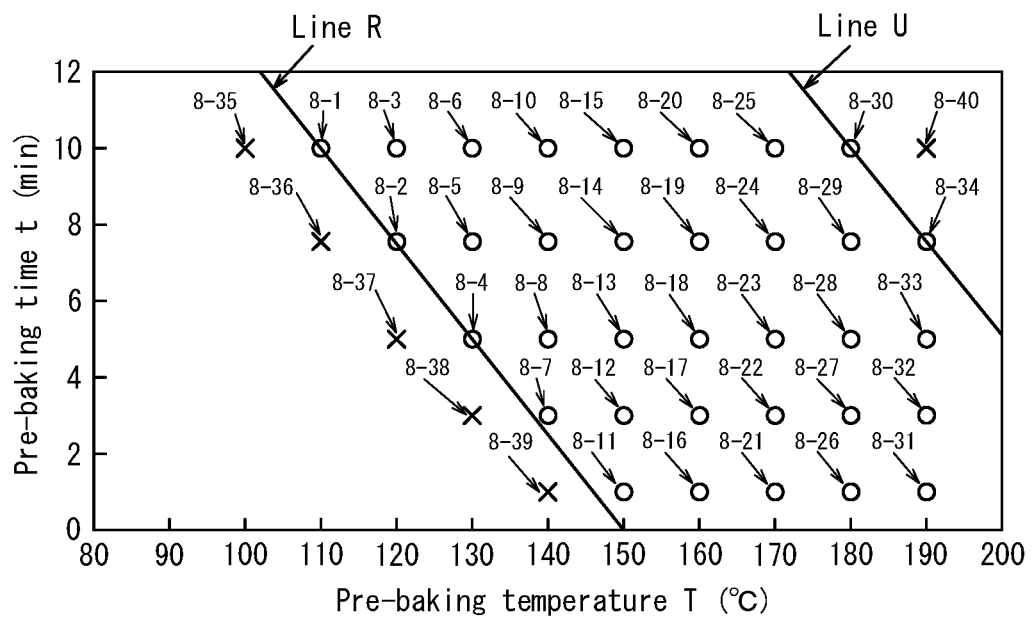
FIG. 3D shows a relationship between temperature T (° C.) and time t (min) in a pre-baking step in a resist film formation method using a positive resist composition containing polymer (F6) and n-amyl formate (upper graph), and, as a comparison, a relationship between temperature T (° C.) and time t (min) in a pre-baking step in a resist film formation method using a positive resist composition containing polymer (F6) and n-hexyl acetate (lower graph)
Figure 3D:
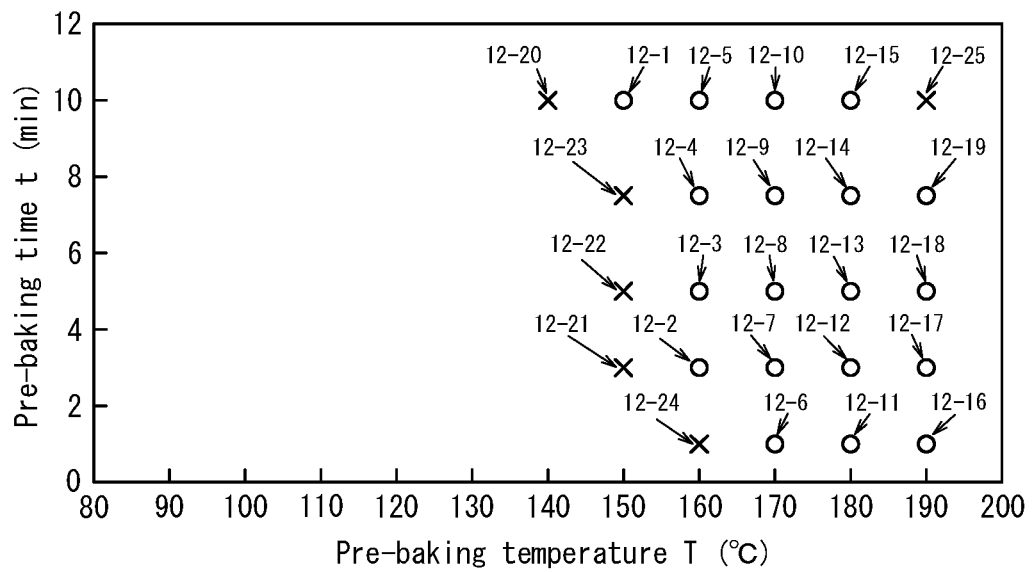

The measured weight average molecular weight and molecular weight distribution, the evaluation result of the retention rate of the weight average molecular weight, and the evaluation result of adhesion are given below and in FIG. 3D.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 48,614, molecular weight distribution: 1.283

(iii) Retention rate of weight average molecular weight of polymer in resist film formed through pre-baking Retention rate: 102.8%, Retention rate evaluation result: A (High retention rate: good)

(iv) Adhesion between resist film formed through pre-baking step and workpiece

Adhesion evaluation result: A (adhesion is good)

Experimental Examples 8-2 to 8-34

"Preparation of Polymer (F6)", "Preparation of Positive Resist Composition", and "Formation of Resist Pattern" were performed and similar measurements and evaluations were made as in Experimental Example 8-1 except the pre-baking step was performed at 120° C. for 7.5 minutes (Experimental Example 8-2); at 120° C. for 10 minutes (Experimental Example 8-3); at 130° C. for 5 minutes (Experimental Example 8-4); at 130° C. for 7.5 minutes (Experimental Example 8-5); at 130° C. for 10 minutes (Experimental Example 8-6); at 140° C. for 3 minutes (Experimental Example 8-7); at 140° C. for 5 minutes (Experimental Example 8-8); at 140° C. for 7.5 minutes (Experimental Example 8-9); at 140° C. for 10 minutes (Experimental Example 8-10); at 150° C. for 1 minute (Experimental Example 8-11); at 150° C. for 3 minutes (Experimental Example 8-12); at 150° C. for 5 minutes (Experimental Example 8-13); at 150° C. for 7.5 minutes (Experimental Example 8-14); at 150° C. for 10 minutes (Experimental Example 8-15); at 160° C. for 1 minute (Experimental Example 8-16); at 160° C. for 3 minutes (Experimental Example 8-17); at 160° C. for 5 minutes (Experimental Example 8-18); at 160° C. for 7.5 minutes (Experimental Example 8-19); at 160° C. for 10 minutes (Experimental Example 8-20); at 170° C. for 1 minute (Experimental Example 8-21); at 170° C. for 3 minutes (Experimental Example 8-22); at 170° C. for 5 minutes (Experimental Example 8-23); at 170° C. for 7.5 minutes (Experimental Example 8-24); at 170° C. for 10 minutes (Experimental Example 8-25); at 180° C. for 1 minute (Experimental Example 8-26); at 180° C. for 3 minutes (Experimental Example 8-27); at 180° C. for 5 minutes (Experimental Example 8-28); at 180° C. for 7.5 minutes (Experimental Example 8-29); at 180° C. for 10 minutes (Experimental Example 8-30); at 190° C. for 1 minute (Experimental Example 8-31); at 190° C. for 3 minutes (Experimental Example 8-32); at 190° C. for 5 minutes (Experimental Example 8-33); and at 190° C. for 7.5 minutes (Experimental Example 8-34). The results are given below and in FIG. 3D.

(i) Weight average molecular weight and molecular weight distribution of prepared polymer Weight average molecular weight: 47,311, molecular weight distribution: 1.284 (Experimental Examples 8-2 to 8-34)

(ii) Weight average molecular weight and molecular weight distribution of polymer in resist film formed through pre-baking step Weight average molecular weight: 48,775, molecular weight distribution: 1.286 (Experimental Example 8-2)
Weight average molecular weight: 48,614, molecular weight distribution: 1.283 (Experimental Example 8-3)
Weight average molecular weight: 47,824, molecular weight distribution: 1.285 (Experimental Example 8-4)
Weight average molecular weight: 48,794, molecular weight distribution: 1.285 (Experimental Example 8-5)
Weight average molecular weight: 48614, molecular weight distribution: 1.284 (Experimental Example 8-6)
Weight average molecular weight: 47,171, molecular weight distribution: 1.283 (Experimental Example 8-7)
Weight average molecular weight: 48,065, molecular weight distribution: 1.285 (Experimental Example 8-8)
Weight average molecular weight: 47,817, molecular weight distribution: 1.285 (Experimental Example 8-9)
Weight average molecular weight: 47,451, molecular weight distribution: 1.285 (Experimental Example 8-10)
Weight average molecular weight: 47,226, molecular weight distribution: 1.288 (Experimental Example 8-11)
Weight average molecular weight: 47,873, molecular weight distribution: 1.285 (Experimental Example 8-12)
Weight average molecular weight: 48,335, molecular weight distribution: 1.288 (Experimental Example 8-13)
Weight average molecular weight: 47,899, molecular weight distribution: 1.288 (Experimental Example 8-14)
Weight average molecular weight: 47,930, molecular weight distribution: 1.289 (Experimental Example 8-15)
Weight average molecular weight: 47,226, molecular weight distribution: 1.282 (Experimental Example 8-16)
Weight average molecular weight: 47,639, molecular weight distribution: 1.288 (Experimental Example 8-17)
Weight average molecular weight: 47,922, molecular weight distribution: 1.292 (Experimental Example 8-18)
Weight average molecular weight: 47,467, molecular weight distribution: 1.292 (Experimental Example 8-19)
Weight average molecular weight: 47,167, molecular weight distribution: 1.299 (Experimental Example 8-20)
Weight average molecular weight: 47,226, molecular weight distribution: 1.284 (Experimental Example 8-21)
Weight average molecular weight: 46,801, molecular weight distribution: 1.293 (Experimental Example 8-22)
Weight average molecular weight: 47,709, molecular weight distribution: 1.302 (Experimental Example 8-23)
Weight average molecular weight: 46,949, molecular weight distribution: 1.302 (Experimental Example 8-24)
Weight average molecular weight: 46,601, molecular weight distribution: 1.310 (Experimental Example 8-25)
Weight average molecular weight: 47,226, molecular weight distribution: 1.291 (Experimental Example 8-26)
Weight average molecular weight: 47,629, molecular weight distribution: 1.301 (Experimental Example 8-27)
Weight average molecular weight: 47,231, molecular weight distribution: 1.318 (Experimental Example 8-28)
Weight average molecular weight: 45,964, molecular weight distribution: 1.318 (Experimental Example 8-29)
Weight average molecular weight: 45,866, molecular weight distribution: 1.314 (Experimental Example 8-30)
Weight average molecular weight: 47,226, molecular weight distribution: 1.299 (Experimental Example 8-31)
Weight average molecular weight: 47,555, molecular weight distribution: 1.306 (Experimental Example 8-32)
Weight average molecular weight: 46,802, molecular weight distribution: 1.318 (Experimental Example 8-33)
Weight average molecular weight: 45,675, molecular weight distribution: 1.318 (Experimental Example 8-34)

(iii) Retention rate of weight average molecular weight of polymer in resist film formed through pre-baking Retention rate: 103.1%, Retention rate evaluation result: A (High retention rate: good) (Experimental Example 8-2)
Retention rate: 102.8%, Retention rate evaluation result: A (High retention rate: good) (Experimental Example 8-3)
Retention rate: 101.1%, Retention rate evaluation result: A (High retention rate: good) (Experimental Example 8-4)
Retention rate: 103.1%, Retention rate evaluation result: A (High retention rate: good) (Experimental Example 8-5)
Retention rate: 102.8%, Retention rate evaluation result: A (High retention rate: good) (Experimental Example 8-6)
Retention rate: 99.7%, Retention rate evaluation result: A (High retention rate: good) (Experimental Example 8-7)
Retention rate: 101.6%, Retention rate evaluation result: A (High retention rate: good) (Experimental Example 8-8)
Retention rate: 101.1%, Retention rate evaluation result: A (High retention rate: good) (Experimental Example 8-9)
Retention rate: 100.3%, Retention rate evaluation result: A (High retention rate: good) (Experimental Example 8-10)
Retention rate: 99.8%, Retention rate evaluation result: A (High retention rate: good) (Experimental Example 8-11)
Retention rate: 101.2%, Retention rate evaluation result: A (High retention rate: good) (Experimental Example 8-12)
Retention rate: 102.2%, Retention rate evaluation result: A (High retention rate: good) (Experimental Example 8-13)
Retention rate: 101.2%, Retention rate evaluation result: A (High retention rate: good) (Experimental Example 8-14)
Retention rate: 101.3%, Retention rate evaluation result: A (High retention rate: good) (Experimental Example 8-15)
Retention rate: 99.8%, Retention rate evaluation result: A (High retention rate: good) (Experimental Example 8-16)
Retention rate: 100.7%, Retention rate evaluation result: A (High retention rate: good) (Experimental Example 8-17)
Retention rate: 101.3%, Retention rate evaluation result: A (High retention rate: good) (Experimental Example 8-18)
Retention rate: 100.3%, Retention rate evaluation result: A (High retention rate: good) (Experimental Example 8-19)
Retention rate: 99.7%, Retention rate evaluation result: A (High retention rate: good) (Experimental Example 8-20)
Retention rate: 99.8%, Retention rate evaluation result: A (High retention rate: good) (Experimental Example 8-21)
Retention rate: 98.9%, Retention rate evaluation result: A (High retention rate: good) (Experimental Example 8-22)
Retention rate: 100.8%, Retention rate evaluation result: A (High retention rate: good) (Experimental Example 8-23)
Retention rate: 99.2%, Retention rate evaluation result: A (High retention rate: good) (Experimental Example 8-24)
Retention rate: 98.5%, Retention rate evaluation result: A (High retention rate: good) (Experimental Example 8-25)
Retention rate: 99.8%, Retention rate evaluation result: A (High retention rate: good) (Experimental Example 8-26)
Retention rate: 100.7%, Retention rate evaluation result: A (High retention rate: good) (Experimental Example 8-27)
Retention rate: 99.8%, Retention rate evaluation result: A (High retention rate: good) (Experimental Example 8-28)

Retention rate: 97.2%, Retention rate evaluation result: A (High retention rate: good) (Experimental Example 8-29)
Retention rate: 96.9%, Retention rate evaluation result: A (High retention rate: good) (Experimental Example 8-30)
Retention rate: 99.8%, Retention rate evaluation result: A (High retention rate: good) (Experimental Example 8-31)
Retention rate: 100.5%, Retention rate evaluation result: A (High retention rate: good) (Experimental Example 8-32)
Retention rate: 98.9%, Retention rate evaluation result: A (High retention rate: good) (Experimental Example 8-33)
Retention rate: 96.5%, Retention rate evaluation result: A (High retention rate: good) (Experimental Example 8-34)
(iv) Adhesion between resist film formed through pre-baking step and workpiece
Adhesion evaluation result: A (adhesion is good) (Experimental Examples 8-2 to 8-34)

Experimental Examples 8-35 to 8-39

"Preparation of Polymer (F6)", "Preparation of Positive Resist Composition", and "Formation of Resist Pattern" were performed and similar measurements and evaluations were made as in Experimental Example 8-1 except the pre-baking step was performed at 100° C. for 10 minutes (Experimental Example 8-35); at 110° C. for 7.5 minutes (Experimental Example 8-36); at 120° C. for 5 minutes (Experimental Example 8-37); at 130° C. for 3 minutes (Experimental Example 8-38); and at 140° C. for 1 minute (Experimental Example 8-39). The results are given below and in FIG. 3D.
(i) Weight average molecular weight and molecular weight distribution of prepared polymer
Weight average molecular weight: 47,311, molecular weight distribution: 1.284 (Experimental Example 8-35 to 8-39)
(ii) Weight average molecular weight and molecular weight distribution of polymer in resist film formed through pre-baking step
Weight average molecular weight: 48,614, molecular weight distribution: 1.283 (Experimental Example 8-35)
Weight average molecular weight: 48,775, molecular weight distribution: 1.286 (Experimental Example 8-36)
Weight average molecular weight: 48,622, molecular weight distribution: 1.286 (Experimental Example 8-37)
Weight average molecular weight: 47,171, molecular weight distribution: 1.276 (Experimental Example 8-38)
Weight average molecular weight: 47,226, molecular weight distribution: 1.285 (Experimental Example 8-39)
(iii) Retention rate of weight average molecular weight of polymer in resist film formed through pre-baking
Retention rate: 102.8%, Retention rate evaluation result: A (High retention rate: good) (Experimental Example 8-35)
Retention rate: 103.1%, Retention rate evaluation result: A (High retention rate: good) (Experimental Example 8-36)
Retention rate: 102.8%, Retention rate evaluation result: A (High retention rate: good) (Experimental Example 8-37)
Retention rate: 99.7%, Retention rate evaluation result: A (High retention rate: good) (Experimental Example 8-38)
Retention rate: 99.8%, Retention rate evaluation result: A (High retention rate: good) (Experimental Example 8-39)
(iv) Adhesion between resist film formed through pre-baking step and workpiece
Adhesion evaluation result: B (adhesion is low) (Experimental Examples 8-35 to 8-39)

Experimental Example 8-40

"Preparation of Polymer (F6)", "Preparation of Positive Resist Composition", and "Formation of Resist Pattern" were performed and similar measurements and evaluations were made as in Experimental Example 8-1 except that the pre-baking step was performed at 190° C. for 10 minutes. The results are given below and in FIG. 3D.
(i) Weight average molecular weight and molecular weight distribution of prepared polymer
Weight average molecular weight: 47,311, molecular weight distribution: 1.284
(ii) Weight average molecular weight and molecular weight distribution of polymer in resist film formed through pre-baking step
Weight average molecular weight: 45,182, molecular weight distribution: 1.323
(iii) Retention rate of weight average molecular weight of polymer in resist film formed through pre-baking
Retention rate: 95.5%, Retention rate evaluation result: B (Retention rate: low)
(iv) Adhesion between resist film formed through pre-baking step and workpiece
Adhesion evaluation result: A (adhesion is good)

Example 9

Experimental Example 9-1

"Preparation of Polymer (F5)", "Preparation of Positive Resist Composition", and "Formation of Resist Pattern" were performed and similar measurements and evaluations were made as in Experimental Example 1-1 except that isoamyl formate was used instead of isoamyl acetate and that the pre-baking step was performed at 110° C. for 10 minutes. The results are given below and in FIG. 2E.
<Measurement Evaluation Result>
The measured weight average molecular weight and molecular weight distribution, the evaluation result of the retention rate of the weight average molecular weight, and the evaluation result of adhesion are given below and in FIG. 2E.
(i) Weight average molecular weight and molecular weight distribution of prepared polymer
Weight average molecular weight: 51,522, molecular weight distribution: 1.403
(ii) Weight average molecular weight and molecular weight distribution of polymer in resist film formed through pre-baking step
Weight average molecular weight: 51,347, molecular weight distribution: 1.400
(iii) Retention rate of weight average molecular weight of polymer in resist film formed through pre-baking
Retention rate: 99.7%, Retention rate evaluation result: A (High retention rate: good)
(iv) Adhesion between resist film formed through pre-baking step and workpiece
Adhesion evaluation result: A (adhesion is good)

Experimental Examples 9-2 to 9-29

"Preparation of Polymer (F5)", "Preparation of Positive Resist Composition", and "Formation of Resist Pattern" were performed and similar measurements and evaluations were made as in Experimental Example 9-1 except that the pre-baking step was performed at 120° C. for 7.5 minutes (Experimental Example 9-2); at 120° C. for 10 minutes (Experimental Example 9-3); at 130° C. for 5 minutes (Experimental Example 9-4); at 130° C. for 7.5 minutes (Experimental Example 9-5); at 130° C. for 10 minutes (Experimental Example 9-6); at 140° C. for 3 minutes (Experimental Example 9-7); at 140° C. for 5 minutes (Experimental Example 9-8); at 140° C. for 7.5 minutes (Experimental Example 9-9); at 140° C. for 10 minutes (Experimental Example 9-10); at 150° C. for 1 minute (Experimental Example 9-11); at 150° C. for 3 minutes (Experimental Example 9-12); at 150° C. for 5 minutes (Experimental Example 9-13); at 150° C. for 7.5 minutes (Experimental Example 9-14); at 150° C. for 10 minutes (Experimental Example 9-15); at 160° C. for 1 minute (Experimental Example 9-16); at 160° C. for 3 minutes (Experimental Example 9-17); at 160° C. for 5 minutes (Experimental Example 9-18); at 160° C. for 7.5 minutes (Experimental Example 9-19); at 160° C. for 10 minutes (Experimental Example 9-20); at 170° C. for 1 minute (Experimental Example 9-21); at 170° C. for 3 minutes (Experimental Example 9-22); at 170° C. for 5 minutes (Experimental Example 9-23); at 170° C. for 7.5 minutes (Experimental Example 9-24); at 180° C. for 1 minute (Experimental Example 9-25); at 180° C. for 3 minutes (Experimental Example 9-26); at 180° C. for 5 minutes (Experimental Example 9-27); at 190° C. for 1 minute (Experimental Example 9-28); and at 190° C. for 3 minutes (Experimental Example 9-29). The results are given below and in FIG. 2E.

(i) Weight average molecular weight and molecular weight distribution of prepared polymer Weight average molecular weight: 51,522, molecular weight distribution: 1.403 (Experimental Examples 9-2 to 9-29)

(ii) Weight average molecular weight and molecular weight distribution of polymer in resist film formed through pre-baking step Weight average molecular weight: 51,002, molecular weight distribution: 1.402 (Experimental Example 9-2)

Weight average molecular weight: 51,347, molecular weight distribution: 1.400 (Experimental Example 9-3)

Weight average molecular weight: 50,471, molecular weight distribution: 1.404 (Experimental Example 9-4)

Weight average molecular weight: 50,276, molecular weight distribution: 1.404 (Experimental Example 9-5)

Weight average molecular weight: 50,643, molecular weight distribution: 1.406 (Experimental Example 9-6)

Weight average molecular weight: 51,033, molecular weight distribution: 1.403 (Experimental Example 9-7)

Weight average molecular weight: 49,684, molecular weight distribution: 1.400 (Experimental Example 9-8)

Weight average molecular weight: 50,417, molecular weight distribution: 1.404 (Experimental Example 9-9)

Weight average molecular weight: 50,230, molecular weight distribution: 1.407 (Experimental Example 9-10)

Weight average molecular weight: 51,115, molecular weight distribution: 1.403 (Experimental Example 9-11)

Weight average molecular weight: 51,033, molecular weight distribution: 1.403 (Experimental Example 9-12)

Weight average molecular weight: 50,471, molecular weight distribution: 1.401 (Experimental Example 9-13)

Weight average molecular weight: 50,580, molecular weight distribution: 1.412 (Experimental Example 9-14)

Weight average molecular weight: 50,449, molecular weight distribution: 1.436 (Experimental Example 9-15)

Weight average molecular weight: 51,115, molecular weight distribution: 1.403 (Experimental Example 9-16)

Weight average molecular weight: 51,033, molecular weight distribution: 1.403 (Experimental Example 9-17)

Weight average molecular weight: 50,239, molecular weight distribution: 1.413 (Experimental Example 9-18)

Weight average molecular weight: 50,141, molecular weight distribution: 1.414 (Experimental Example 9-19)

Weight average molecular weight: 50,048, molecular weight distribution: 1.417 (Experimental Example 9-20)

Weight average molecular weight: 51,115, molecular weight distribution: 1.403 (Experimental Example 9-21)

Weight average molecular weight: 51,033, molecular weight distribution: 1.403 (Experimental Example 9-22)

Weight average molecular weight: 49,334, molecular weight distribution: 1.418 (Experimental Example 9-23)

Weight average molecular weight: 50,057, molecular weight distribution: 1.415 (Experimental Example 9-24)

Weight average molecular weight: 51,115, molecular weight distribution: 1.403 (Experimental Example 9-25)

Weight average molecular weight: 51,033, molecular weight distribution: 1.403 (Experimental Example 9-26)

Weight average molecular weight: 49,809, molecular weight distribution: 1.417 (Experimental Example 9-27)

Weight average molecular weight: 51,115, molecular weight distribution: 1.403 (Experimental Example 9-28)

Weight average molecular weight: 51,033, molecular weight distribution: 1.403 (Experimental Example 9-29)

(iii) Retention rate of weight average molecular weight of polymer in resist film formed through pre-baking Retention rate: 99.0%, Retention rate evaluation result: A (High retention rate: good) (Experimental Example 9-2)

Retention rate: 99.7%, Retention rate evaluation result: A (High retention rate: good) (Experimental Example 9-3)

Retention rate: 98.0%, Retention rate evaluation result: A (High retention rate: good) (Experimental Example 9-4)

Retention rate: 97.6%, Retention rate evaluation result: A (High retention rate: good) (Experimental Example 9-5)

Retention rate: 98.3%, Retention rate evaluation result: A (High retention rate: good) (Experimental Example 9-6)

Retention rate: 99.1%, Retention rate evaluation result: A (High retention rate: good) (Experimental Example 9-7)

Retention rate: 96.4%, Retention rate evaluation result: A (High retention rate: good) (Experimental Example 9-8)

Retention rate: 97.9%, Retention rate evaluation result: A (High retention rate: good) (Experimental Example 9-9)

Retention rate: 97.5%, Retention rate evaluation result: A (High retention rate: good) (Experimental Example 9-10)

Retention rate: 99.2%, Retention rate evaluation result: A (High retention rate: good) (Experimental Example 9-11)

Retention rate: 99.1%, Retention rate evaluation result: A (High retention rate: good) (Experimental Example 9-12)

Retention rate: 98.0%, Retention rate evaluation result: A (High retention rate: good) (Experimental Example 9-13)

Retention rate: 98.2%, Retention rate evaluation result: A (High retention rate: good) (Experimental Example 9-14)

Retention rate: 97.9%, Retention rate evaluation result: A (High retention rate: good) (Experimental Example 9-15)

Retention rate: 99.2%, Retention rate evaluation result: A (High retention rate: good) (Experimental Example 9-16)

Retention rate: 99.1%, Retention rate evaluation result: A (High retention rate: good) (Experimental Example 9-17)

Retention rate: 97.5%, Retention rate evaluation result: A (High retention rate: good) (Experimental Example 9-18)

Retention rate: 97.3%, Retention rate evaluation result: A (High retention rate: good) (Experimental Example 9-19)

Retention rate: 97.1%, Retention rate evaluation result: A (High retention rate: good) (Experimental Example 9-20)

Retention rate: 99.2%, Retention rate evaluation result: A (High retention rate: good) (Experimental Example 9-21)

Retention rate: 99.1%, Retention rate evaluation result: A (High retention rate: good) (Experimental Example 9-22)

Retention rate: 95.8%, Retention rate evaluation result: A (High retention rate: good) (Experimental Example 9-23)

Retention rate: 97.2%, Retention rate evaluation result: A (High retention rate: good) (Experimental Example 9-24)

Retention rate: 99.2%, Retention rate evaluation result: A (High retention rate: good) (Experimental Example 9-25)

Retention rate: 99.1%, Retention rate evaluation result: A (High retention rate: good) (Experimental Example 9-26)

Retention rate: 96.7%, Retention rate evaluation result: A (High retention rate: good) (Experimental Example 9-27)

Retention rate: 99.2%, Retention rate evaluation result: A (High retention rate: good) (Experimental Example 9-28)

Retention rate: 99.1%, Retention rate evaluation result: A (High retention rate: good) (Experimental Example 9-29)

(iv) Adhesion between resist film formed through pre-baking step and workpiece

Adhesion evaluation result: A (adhesion is good) (Experimental Examples 9-2 to 9-29)

Experimental Examples 9-30 to 9-34

"Preparation of Polymer (F5)", "Preparation of Positive Resist Composition", and "Formation of Resist Pattern" were performed and similar measurements and evaluations were made as in Experimental Example 9-1 except the pre-baking step was performed at 100° C. for 10 minutes (Experimental Example 9-30); at 110° C. for 7.5 minutes (Experimental Example 9-31); at 120° C. for 5 minutes (Experimental Example 9-32); at 130° C. for 3 minutes (Experimental Example 9-33); and at 140° C. for 1 minute (Experimental Example 9-34). The results are given below and in FIG. 2E.

(i) Weight average molecular weight and molecular weight distribution of prepared polymer Weight average molecular weight: 51,522, molecular weight distribution: 1.403 (Experimental Examples 9-30 to 9-34)

(ii) Weight average molecular weight and molecular weight distribution of polymer in resist film formed through pre-baking step Weight average molecular weight: 51,347, molecular weight distribution: 1.400 (Experimental Example 9-30)

Weight average molecular weight: 51,002, molecular weight distribution: 1.402 (Experimental Example 9-31)

Weight average molecular weight: 50,734, molecular weight distribution: 1.409 (Experimental Example 9-32)

Weight average molecular weight: 51,033, molecular weight distribution: 1.403 (Experimental Example 9-33)

Weight average molecular weight: 51,115, molecular weight distribution: 1.403 (Experimental Example 9-34)

(iii) Retention rate of weight average molecular weight of polymer in resist film formed through pre-baking Retention rate: 99.7%, Retention rate evaluation result: A (High retention rate: good) (Experimental Example 9-30)

Retention rate: 99.0%, Retention rate evaluation result: A (High retention rate: good) (Experimental Example 9-31)

Retention rate: 98.5%, Retention rate evaluation result: A (High retention rate: good) (Experimental Example 9-32)

Retention rate: 99.1%, Retention rate evaluation result: A (High retention rate: good) (Experimental Example 9-33)

Retention rate: 99.2%, Retention rate evaluation result: A (High retention rate: good) (Experimental Example 9-34)

(iv) Adhesion between resist film formed through pre-baking step and workpiece

Adhesion evaluation result: B (adhesion is low) (Experimental Examples 9-30 to 9-34)

Experimental Examples 9-35 to 9-37

"Preparation of Polymer (F5)", "Preparation of Positive Resist Composition", and "Formation of Resist Pattern" were performed and similar measurements and evaluations were made as in Experimental Example 9-1 except the pre-baking step was performed at 170° C. for 10 minutes (Experimental Example 9-35); at 180° C. for 7.5 minutes (Experimental Example 9-36); and at 190° C. for 5 minutes (Experimental Example 9-37). The results are given below and in FIG. 2E.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 48,768, molecular weight distribution: 1.437 (Experimental Example 9-35)

Weight average molecular weight: 47,511, molecular weight distribution: 1.448 (Experimental Example 9-36)

Weight average molecular weight: 47,979, molecular weight distribution: 1.437 (Experimental Example 9-37)

(iii) Retention rate of weight average molecular weight of polymer in resist film formed through pre-baking Retention rate: 94.7%, Retention rate evaluation result: B (Retention rate: low) (Experimental Example 9-35)

Retention rate: 92.2%, Retention rate evaluation result: B (Retention rate: low) (Experimental Example 9-36)

Retention rate: 93.1%, Retention rate evaluation result: B (Retention rate: low) (Experimental Example 9-37)

(iv) Adhesion between resist film formed through pre-baking step and workpiece

Adhesion evaluation result: A (adhesion is good) (Experimental Examples 9-35 to 9-37)

Example 10

Experimental Example 10-1

"Preparation of Polymer (F6)", "Preparation of Positive Resist Composition", and "Formation of Resist Pattern" were performed and similar measurements and evaluations were made as in Experimental Example 2-1 except that isoamyl formate was used instead of isoamyl acetate and that the pre-baking step was performed at 110° C. for 10 minutes. The results are given below and in FIG. 3E.

<<Measurement Evaluation Result>

Figure 3E:
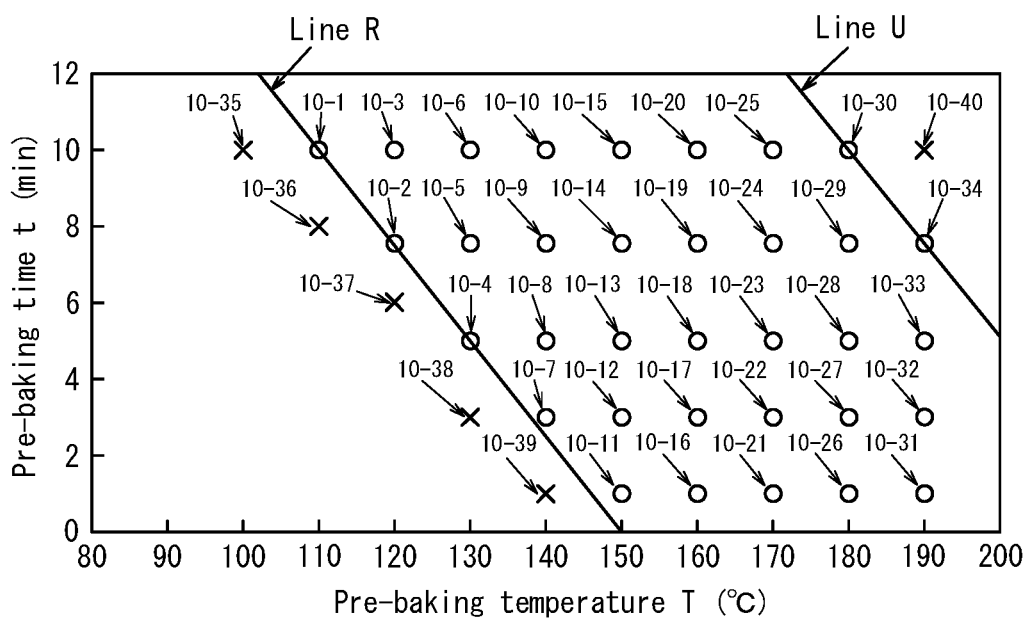
FIG. 3E shows a relationship between temperature T (° C.) and time t (min) in a pre-baking step in a resist film formation method using a positive resist composition containing polymer (F6) and isoamyl formate (upper graph), and, as a comparison, a relationship between temperature T (° C.) and time t (min) in a pre-baking step in a resist film formation method using a positive resist composition containing polymer (F6) and n-hexyl acetate (lower graph).
Figure 3E:
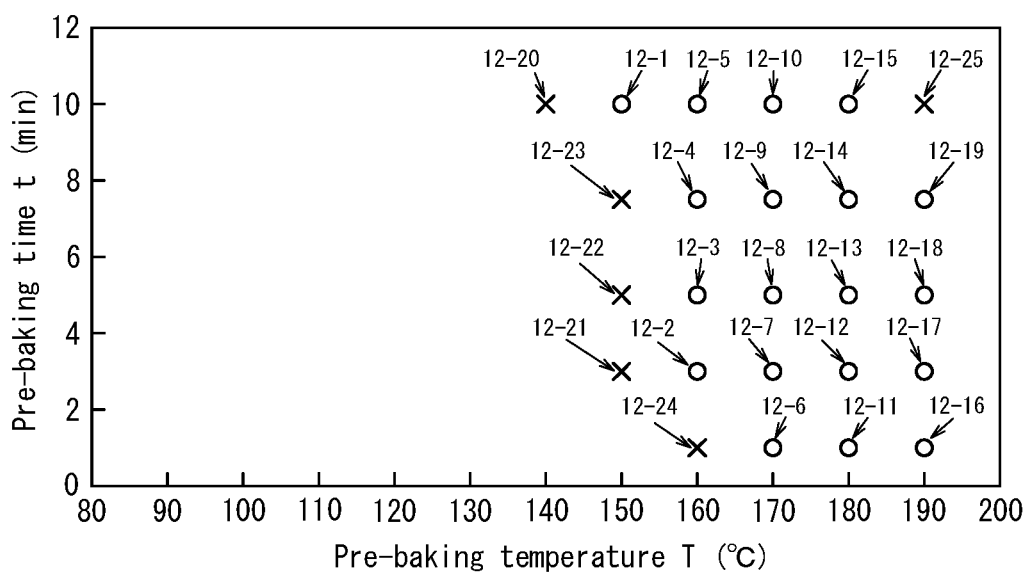

The measured weight average molecular weight and molecular weight distribution, the evaluation result of the retention rate of the weight average molecular weight, and the evaluation result of adhesion are given below and in FIG. 3E.

(i) Weight average molecular weight and molecular weight distribution of prepared polymer Weight average molecular weight: 47,311, molecular weight distribution: 1.284

(ii) Polymer weight average molecular weight and molecular weight distribution in resist film formed through pre-baking Weight average molecular weight: 48,341, molecular weight distribution: 1.283

(iii) Retention rate of weight average molecular weight of polymer in resist film formed through pre-baking Retention rate: 102.2%, Retention rate evaluation result: A (High retention rate: good)

(iv) Adhesion between resist film formed through pre-baking step and workpiece

Adhesion evaluation result: A (adhesion is good)

Experimental Examples 10-2 to 10-34

"Preparation of Polymer (F6)", "Preparation of Positive Resist Composition", and "Formation of Resist Pattern" were performed and similar measurements and evaluations were made as in Experimental Example 10-1 except the pre-baking step was performed at 120° C. for 7.5 minutes (Experimental Example 10-2); at 120° C. for 10 minutes (Experimental Example 10-3); at 130° C. for 5 minutes (Experimental Example 10-4); at 130° C. for 7.5 minutes (Experimental Example 10-5); at 130° C. for 10 minutes (Experimental Example 10-6); at 140° C. for 3 minutes (Experimental Example 10-7); at 140° C. for 5 minutes (Experimental Example 10-8); at 140° C. for 7.5 minutes (Experimental Example 10-9); at 140° C. for 10 minutes (Experimental Example 10-10); at 150° C. for 1 minute (Experimental Example 10-11); at 150° C. for 3 minutes (Experimental Example 10-12); at 150° C. for 5 minutes (Experimental Example 10-13); at 150° C. for 7.5 minutes (Experimental Example 10-14); at 150° C. for 10 minutes (Experimental Example 10-15); at 160° C. for 1 minute (Experimental Example 10-16); at 160° C. for 3 minutes (Experimental Example 10-17); at 160° C. for 5 minutes (Experimental Example 10-18); at 160° C. for 7.5 minutes (Experimental Example 10-19); at 160° C. for 10 minutes (Experimental Example 10-20); at 170° C. for 1 minute (Experimental Example 10-21); at 170° C. for 3 minutes (Experimental Example 10-22); at 170° C. for 5 minutes (Experimental Example 10-23); at 170° C. for 7.5 minutes (Experimental Example 10-24); at 170° C. for 10 minutes (Experimental Example 10-25); at 180° C. for 1 minute (Experimental Example 10-26); at 180° C. for 3 minutes (Experimental Example 10-27); at 180° C. for 5 minutes (Experimental Example 10-28); at 180° C. for 7.5 minutes (Experimental Example 10-29); at 180° C. for 10 minutes (Experimental Example 10-30); at 190° C. for 1 minute (Experimental Example 10-31); at 190° C. for 3 minutes (Experimental Example 10-32); at 190° C. for 5 minutes (Experimental Example 10-33); and at 190° C. for 7.5 minutes (Experimental Example 10-34). The results are given below and in FIG. 3E.

(i) Weight average molecular weight and molecular weight distribution of prepared polymer Weight average molecular weight: 47,311, molecular weight distribution: 1.284 (Experimental Examples 10-2 to 10-34)

(ii) Weight average molecular weight and molecular weight distribution of polymer in resist film formed through pre-baking step Weight average molecular weight: 48,291, molecular weight distribution: 1.288 (Experimental Example 10-2)

Weight average molecular weight: 48,341, molecular weight distribution: 1.283 (Experimental Example 10-3)

Weight average molecular weight: 46,860, molecular weight distribution: 1.285 (Experimental Example 10-4)

Weight average molecular weight: 47,499, molecular weight distribution: 1.276 (Experimental Example 10-5)

Weight average molecular weight: 48,360, molecular weight distribution: 1.284 (Experimental Example 10-6)

Weight average molecular weight: 46,862, molecular weight distribution: 1.283 (Experimental Example 10-7)

Weight average molecular weight: 46,860, molecular weight distribution: 1.285 (Experimental Example 10-8)

Weight average molecular weight: 47,738, molecular weight distribution: 1.283 (Experimental Example 10-9)

Weight average molecular weight: 47,391, molecular weight distribution: 1.285 (Experimental Example 10-10)

Weight average molecular weight: 46,937, molecular weight distribution: 1.288 (Experimental Example 10-11)

Weight average molecular weight: 46,862, molecular weight distribution: 1.285 (Experimental Example 10-12)

Weight average molecular weight: 47,557, molecular weight distribution: 1.288 (Experimental Example 10-13)

Weight average molecular weight: 48,006, molecular weight distribution: 1.285 (Experimental Example 10-14)

Weight average molecular weight: 47,473, molecular weight distribution: 1.289 (Experimental Example 10-15)

Weight average molecular weight: 46,937, molecular weight distribution: 1.282 (Experimental Example 10-16)

Weight average molecular weight: 46,862, molecular weight distribution: 1.288 (Experimental Example 10-17)

Weight average molecular weight: 47,324, molecular weight distribution: 1.292 (Experimental Example 10-18)

Weight average molecular weight: 47,596, molecular weight distribution: 1.288 (Experimental Example 10-19)

Weight average molecular weight: 47,044, molecular weight distribution: 1.299 (Experimental Example 10-20)

Weight average molecular weight: 46,937, molecular weight distribution: 1.284 (Experimental Example 10-21)

Weight average molecular weight: 46,862, molecular weight distribution: 1.293 (Experimental Example 10-22)

Weight average molecular weight: 46,492, molecular weight distribution: 1.302 (Experimental Example 10-23)

Weight average molecular weight: 47,384, molecular weight distribution: 1.293 (Experimental Example 10-24)

Weight average molecular weight: 46,531, molecular weight distribution: 1.310 (Experimental Example 10-25)

Weight average molecular weight: 46,937, molecular weight distribution: 1.291 (Experimental Example 10-26)

Weight average molecular weight: 46,862, molecular weight distribution: 1.301 (Experimental Example 10-27)

Weight average molecular weight: 47,314, molecular weight distribution: 1.318 (Experimental Example 10-28)

Weight average molecular weight: 46,909, molecular weight distribution: 1.301 (Experimental Example 10-29)

Weight average molecular weight: 45,554, molecular weight distribution: 1.314 (Experimental Example 10-30)

Weight average molecular weight: 46,937, molecular weight distribution: 1.299 (Experimental Example 10-31)

Weight average molecular weight: 46,862, molecular weight distribution: 1.306 (Experimental Example 10-32)

Weight average molecular weight: 47,241, molecular weight distribution: 1.318 (Experimental Example 10-33)

Weight average molecular weight: 46,943, molecular weight distribution: 1.319 (Experimental Example 10-34)

(iii) Retention rate of weight average molecular weight of polymer in resist film formed through pre-baking Retention rate: 102.1%, Retention rate evaluation result: A (High retention rate: good) (Experimental Example 10-2)

Retention rate: 102.2%, Retention rate evaluation result: A (High retention rate: good) (Experimental Example 10-3)

Retention rate: 99.0%, Retention rate evaluation result: A (High retention rate: good) (Experimental Example 10-4)

Retention rate: 100.4%, Retention rate evaluation result: A (High retention rate: good) (Experimental Example 10-5)

Retention rate: 102.2%, Retention rate evaluation result: A (High retention rate: good) (Experimental Example 10-6)
Retention rate: 99.1%, Retention rate evaluation result: A (High retention rate: good) (Experimental Example 10-7)
Retention rate: 99.0%, Retention rate evaluation result: A (High retention rate: good) (Experimental Example 10-8)
Retention rate: 100.9%, Retention rate evaluation result: A (High retention rate: good) (Experimental Example 10-9)
Retention rate: 100.2%, Retention rate evaluation result: A (High retention rate: good) (Experimental Example 10-10)
Retention rate: 99.2%, Retention rate evaluation result: A (High retention rate: good) (Experimental Example 10-11)
Retention rate: 99.1%, Retention rate evaluation result: A (High retention rate: good) (Experimental Example 10-12)
Retention rate: 100.5%, Retention rate evaluation result: A (High retention rate: good) (Experimental Example 10-13)
Retention rate: 101.5%, Retention rate evaluation result: A (High retention rate: good) (Experimental Example 10-14)
Retention rate: 100.3%, Retention rate evaluation result: A (High retention rate: good) (Experimental Example 10-15)
Retention rate: 99.2%, Retention rate evaluation result: A (High retention rate: good) (Experimental Example 10-16)
Retention rate: 99.1%, Retention rate evaluation result: A (High retention rate: good) (Experimental Example 10-17)
Retention rate: 100.0%, Retention rate evaluation result: A (High retention rate: good) (Experimental Example 10-18)
Retention rate: 100.6%, Retention rate evaluation result: A (High retention rate: good) (Experimental Example 10-19)
Retention rate: 99.4%, Retention rate evaluation result: A (High retention rate: good) (Experimental Example 10-20)
Retention rate: 99.2%, Retention rate evaluation result: A (High retention rate: good) (Experimental Example 10-21)
Retention rate: 99.1%, Retention rate evaluation result: A (High retention rate: good) (Experimental Example 10-22)
Retention rate: 98.3%, Retention rate evaluation result: A (High retention rate: good) (Experimental Example 10-23)
Retention rate: 100.2%, Retention rate evaluation result: A (High retention rate: good) (Experimental Example 10-24)
Retention rate: 98.4%, Retention rate evaluation result: A (High retention rate: good) (Experimental Example 10-25)
Retention rate: 99.2%, Retention rate evaluation result: A (High retention rate: good) (Experimental Example 10-26)
Retention rate: 99.1%, Retention rate evaluation result: A (High retention rate: good) (Experimental Example 10-27)
Retention rate: 100.0%, Retention rate evaluation result: A (High retention rate: good) (Experimental Example 10-28)
Retention rate: 99.2%, Retention rate evaluation result: A (High retention rate: good) (Experimental Example 10-29)
Retention rate: 96.3%, Retention rate evaluation result: A (High retention rate: good) (Experimental Example 10-30)
Retention rate: 99.2%, Retention rate evaluation result: A (High retention rate: good) (Experimental Example 10-31)
Retention rate: 99.1%, Retention rate evaluation result: A (High retention rate: good) (Experimental Example 10-32)
Retention rate: 99.9%, Retention rate evaluation result: A (High retention rate: good) (Experimental Example 10-33)
Retention rate: 99.2%, Retention rate evaluation result: A (High retention rate: good) (Experimental Example 10-34)
(iv) Adhesion between resist film formed through pre-baking step and workpiece
Adhesion evaluation result: A (adhesion is good) (Experimental Examples 10-2 to 10-34)

Experimental Examples 10-35 to 10-39

"Preparation of Polymer (F6)", "Preparation of Positive Resist Composition", and "Formation of Resist Pattern" were performed and similar measurements and evaluations were made as in Experimental Example 10-1 except the pre-baking step was performed at 100° C. for 10 minutes (Experimental Example 10-35); at 110° C. for 7.5 minutes (Experimental Example 10-36); at 120° C. for 5 minutes (Experimental Example 10-37); at 130° C. for 3 minutes (Experimental Example 10-38); and at 140° C. for 1 minute (Experimental Example 10-39). The results are given below and in FIG. 3E.

(i) Weight average molecular weight and molecular weight distribution of prepared polymer Weight average molecular weight: 47,311, molecular weight distribution: 1.284 (Experimental Examples 10-35 to 10-39)

(ii) Weight average molecular weight and molecular weight distribution of polymer in resist film formed through pre-baking step Weight average molecular weight: 48,341, molecular weight distribution: 1.283 (Experimental Example 10-35)
Weight average molecular weight: 48,291, molecular weight distribution: 1.288 (Experimental Example 10-36)
Weight average molecular weight: 46,630, molecular weight distribution: 1.286 (Experimental Example 10-37)
Weight average molecular weight: 46,862, molecular weight distribution: 1.276 (Experimental Example 10-38)
Weight average molecular weight: 46,937, molecular weight distribution: 1.285 (Experimental Example 10-39)

(iii) Retention rate of weight average molecular weight of polymer in resist film formed through pre-baking Retention rate: 102.2%, Retention rate evaluation result: A (High retention rate: good) (Experimental Example 10-35)
Retention rate: 102.1%, Retention rate evaluation result: A (High retention rate: good) (Experimental Example 10-36)
Retention rate: 98.6%, Retention rate evaluation result: A (High retention rate: good) (Experimental Example 10-37)
Retention rate: 99.1%, Retention rate evaluation result: A (High retention rate: good) (Experimental Example 10-38)
Retention rate: 99.2%, Retention rate evaluation result: A (High retention rate: good) (Experimental Example 10-39)

(iv) Adhesion between resist film formed through pre-baking step and workpiece
Adhesion evaluation result: B (adhesion is low) (Experimental Examples 10-35 to 10-39)

Experimental Example 10-40

"Preparation of Polymer (F6)", "Preparation of Positive Resist Composition", and "Formation of Resist Pattern" were performed and similar measurements and evaluations were made as in Experimental Example 10-1 except that the pre-baking step was performed at 190° C. for 10 minutes. The results are given below and in FIG. 3E.

(i) Weight average molecular weight and molecular weight distribution of prepared polymer
Weight average molecular weight: 47,311, molecular weight distribution: 1.284

(ii) Weight average molecular weight and molecular weight distribution of polymer in resist film formed through pre-baking step
Weight average molecular weight: 45,269, molecular weight distribution: 1.323

(iii) Retention rate of weight average molecular weight of polymer in resist film formed through pre-baking Retention rate: 95.7%, Retention rate evaluation result: B (Retention rate: low)

(iv) Adhesion between resist film formed through pre-baking step and workpiece

Adhesion evaluation result: A (adhesion is good)

Example 11

Experimental Example 11-1

"Preparation of Polymer (F5)", "Preparation of Positive Resist Composition", and "Formation of Resist Pattern" were performed and similar measurements and evaluations were made as in Experimental Example 1-1 except that n-hexyl acetate was used instead of isoamyl acetate and that the pre-baking step was performed at 150° C. for 10 minutes. The results are given below and in the lower graphs of FIGS. 2A to 2E.

<Measurement Evaluation Result>

The measured weight average molecular weight and molecular weight distribution, the evaluation result of the retention rate of the weight average molecular weight, and the evaluation result of adhesion are given below and in the lower graphs of FIGS. 2A to 2E.

(i) Weight average molecular weight and molecular weight distribution of prepared polymer Weight average molecular weight: 51,522, molecular weight distribution: 1.403

(ii) Weight average molecular weight and molecular weight distribution of polymer in resist film formed through pre-baking step Weight average molecular weight: 50,473, molecular weight distribution: 1.416

(iii) Retention rate of weight average molecular weight of polymer in resist film formed through pre-baking Retention rate: 98.0%, Retention rate evaluation result: A (High retention rate: good)

(iv) Adhesion between resist film formed through pre-baking step and workpiece

Adhesion evaluation result: A (adhesion is good)

Experimental Examples 11-2 to 11-9

"Preparation of Polymer (F5)", "Preparation of Positive Resist Composition", and "Formation of Resist Pattern" were performed and similar measurements and evaluations were made as in Experimental Example 11-1 except the pre-baking step was performed at 160° C. for 3 minutes (Experimental Example 11-2); at 160° C. for 5 minutes (Experimental Example 11-3); at 160° C. for 7.5 minutes (Experimental Example 11-4); at 160° C. for 10 minutes (Experimental Example 11-5); at 170° C. for 1 minute (Experimental Example 11-6); at 170° C. for 3 minutes (Experimental Example 11-7); at 170° C. for 5 minutes (Experimental Example 11-8); and at 180° C. for 1 minute (Experimental Example 11-9). The results are given below and in the lower graphs of FIGS. 2A to 2E.

(i) Weight average molecular weight and molecular weight distribution of prepared polymer Weight average molecular weight: 51,522, molecular weight distribution: 1.403 (Experimental Example 11-2 to 11-9)

(ii) Weight average molecular weight and molecular weight distribution of polymer in resist film formed through pre-baking step Weight average molecular weight: 50,876, molecular weight distribution: 1.414 (Experimental Example 11-2)

Weight average molecular weight: 50,787, molecular weight distribution: 1.417 (Experimental Example 11-3)

Weight average molecular weight: 50,815, molecular weight distribution: 1.416 (Experimental Example 11-4)

Weight average molecular weight: 50,146, molecular weight distribution: 1.422 (Experimental Example 11-5)

Weight average molecular weight: 50,057, molecular weight distribution: 1.418 (Experimental Example 11-6)

Weight average molecular weight: 50,791, molecular weight distribution: 1.415 (Experimental Example 11-7)

Weight average molecular weight: 49,488, molecular weight distribution: 1.437 (Experimental Example 11-8)

Weight average molecular weight: 50,539, molecular weight distribution: 1.417 (Experimental Example 11-9)

(iii) Retention rate of weight average molecular weight of polymer in resist film formed through pre-baking Retention rate: 98.7%, Retention rate evaluation result: A (High retention rate: good) (Experimental Example 11-2)

Retention rate: 98.6%, Retention rate evaluation result: A (High retention rate: good) (Experimental Example 11-3)

Retention rate: 98.6%, Retention rate evaluation result: A (High retention rate: good) (Experimental Example 11-4)

Retention rate: 97.3%, Retention rate evaluation result: A (High retention rate: good) (Experimental Example 11-5)

Retention rate: 97.2%, Retention rate evaluation result: A (High retention rate: good) (Experimental Example 11-6)

Retention rate: 98.6%, Retention rate evaluation result: A (High retention rate: good) (Experimental Example 11-7)

Retention rate: 96.1%, Retention rate evaluation result: A (High retention rate: good) (Experimental Example 11-8)

Retention rate: 98.1%, Retention rate evaluation result: A (High retention rate: good) (Experimental Example 11-9)

(iv) Adhesion between resist film formed through pre-baking step and workpiece

Adhesion evaluation result: A (adhesion is good) (Experimental Examples 11-2 to 11-9)

Experimental Examples 11-10 to 11-14

"Preparation of Polymer (F5)", "Preparation of Positive Resist Composition", and "Formation of Resist Pattern" were performed and similar measurements and evaluations were made as in Experimental Example 11-1 except that the pre-baking step was performed at 140° C. for 10 minutes (Experimental Example 11-10); at 150° C. for 3 minutes (Experimental Example 11-11); at 150° C. for 5 minutes (Experimental Example 11-12); at 150° C. for 7.5 minutes (Experimental Example 11-13); and at 160° C. for 1 minute (Experimental Example 11-14). The results are given below and in the lower graphs FIGS. 2A to 2E.

(i) Weight average molecular weight and molecular weight distribution of prepared polymer Weight average molecular weight: 51,522, molecular weight distribution: 1.403 (Experimental Examples 11-10 to 11-14)

(ii) Weight average molecular weight and molecular weight distribution of polymer in resist film formed through pre-baking step Weight average molecular weight: 50,032, molecular weight distribution: 1.405 (Experimental Example 11-10)

Weight average molecular weight: 51,321, molecular weight distribution: 1.412 (Experimental Example 11-11)

Weight average molecular weight: 51,194, molecular weight distribution: 1.436 (Experimental Example 11-12)

Weight average molecular weight: 51,019, molecular weight distribution: 1.432 (Experimental Example 11-13)

Weight average molecular weight: 50,975, molecular weight distribution: 1.413 (Experimental Example 11-14)

(iii) Retention rate of weight average molecular weight of polymer in resist film formed through pre-baking Retention rate: 97.1%, Retention rate evaluation result: A (High retention rate: good) (Experimental Example 11-10)

Retention rate: 99.6%, Retention rate evaluation result: A (High retention rate: good) (Experimental Example 11-11)

Retention rate: 99.4%, Retention rate evaluation result: A (High retention rate: good) (Experimental Example 11-12)

Retention rate: 99.0%, Retention rate evaluation result: A (High retention rate: good) (Experimental Example 11-13)

Retention rate: 98.9%, Retention rate evaluation result: A (High retention rate: good) (Experimental Example 11-14)

(iv) Adhesion between resist film formed through pre-baking step and workpiece

Adhesion evaluation result: B (adhesion is low) (Experimental Examples 11-10 to 11-14)

Experimental Examples 11-15 to 11-21

"Preparation of Polymer (F5)", "Preparation of Positive Resist Composition", and "Formation of Resist Pattern" were performed and similar measurements and evaluations were made as in Experimental Example 11-1 except that the pre-baking step was performed at 170° C. for 7.5 minutes (Experimental Example 11-15); at 170° C. for 10 minutes (Experimental Example 11-16); at 180° C. for 3 minutes (Experimental Example 11-17); at 180° C. for 5 minutes (Experimental Example 11-18); at 180° C. for 7.5 minutes (Experimental Example 11-19); at 180° C. for 10 minutes (Experimental Example 11-20); and at 190° C. for 1 minute (Experimental Example 11-21). The results are given below and in the lower graphs FIGS. 2A to 2E.

(i) Weight average molecular weight and molecular weight distribution of prepared polymer Weight average molecular weight: 51,522, molecular weight distribution: 1.403 (Experimental Examples 11-15 to 11-21)

(ii) Weight average molecular weight and molecular weight distribution of polymer in resist film formed through pre-baking step Weight average molecular weight: 49,123, molecular weight distribution: 1.452 (Experimental Example 11-15)

Weight average molecular weight: 47,611, molecular weight distribution: 1.451 (Experimental Example 11-16)

Weight average molecular weight: 48,207, molecular weight distribution: 1.448 (Experimental Example 11-17)

Weight average molecular weight: 47,986, molecular weight distribution: 1.456 (Experimental Example 11-18)

Weight average molecular weight: 47,234, molecular weight distribution: 1.451 (Experimental Example 11-19)

Weight average molecular weight: 46,987, molecular weight distribution: 1.463 (Experimental Example 11-20)

Weight average molecular weight: 48,682, molecular weight distribution: 1.437 (Experimental Example 11-21)

(iii) Retention rate of weight average molecular weight of polymer in resist film formed through pre-baking Retention rate: 95.3%, Retention rate evaluation result: B (Retention rate: low) (Example 11-15)

Retention rate: 92.4%, Retention rate evaluation result: B (Retention rate: low) (Example 11-16)

Retention rate: 93.6%, Retention rate evaluation result: B (Retention rate: low) (Example 11-17)

Retention rate: 93.1%, Retention rate evaluation result: B (Retention rate: low) (Example 11-18)

Retention rate: 91.7%, Retention rate evaluation result: B (Retention rate: low) (Example 11-19)

Retention rate: 91.2%, Retention rate evaluation result: B (Retention rate: low) (Example 11-20)

Retention rate: 94.5%, Retention rate evaluation result: B (Retention rate: low) (Example 11-21)

(iv) Adhesion between resist film formed through pre-baking step and workpiece

Adhesion evaluation result: A (adhesion is good) (Experimental Examples 11-15 to 11-21)

Example 12

Experimental Example 12-1

"Preparation of Polymer (F6)", "Preparation of Positive Resist Composition", and "Formation of Resist Pattern" were performed and similar measurements and evaluations were made as in Experimental Example 2-1 except that n-hexyl acetate was used instead of isoamyl acetate and that the pre-baking step was performed at 150° C. for 10 minutes. The results are given below and in the lower graphs of FIGS. 3A to 3E.

<Measurement Evaluation Result>

The measured weight average molecular weight and molecular weight distribution, the evaluation result of the retention rate of the weight average molecular weight, and the evaluation result of adhesion are given below and in the lower graphs of FIGS. 3A to 3E.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 48,317, molecular weight distribution: 1.289

(iii) Retention rate of weight average molecular weight of polymer in resist film formed through pre-baking Retention rate: 102.1%, Retention rate evaluation result: A (High retention rate: good)

(iv) Adhesion between resist film formed through pre-baking step and workpiece

Adhesion evaluation result: A (adhesion is good)

Experimental Examples 12-2 to 12-19

"Preparation of Polymer (F6)", "Preparation of Positive Resist Composition", and "Formation of Resist Pattern" were performed and similar measurements and evaluations were made as in Experimental Example 12-1 except the pre-baking step was performed at 160° C. for 3 minutes (Experimental Example 12-2); at 160° C. for 5 minutes (Experimental Example 12-3); at 160° C. for 7.5 minutes (Experimental Example 12-4); at 160° C. for 10 minutes (Experimental Example 12-5); at 170° C. for 1 minute (Experimental Example 12-6); at 170° C. for 3 minutes (Experimental Example 12-7); at 170° C. for 5 minutes (Experimental Example 12-8); at 170° C. for 7.5 minutes (Experimental Example 12-9); at 170° C. for 10 minutes (Experimental Example 12-10); at 180° C. for 1 minute (Experimental Example 12-11); at 180° C. for 3 minutes (Experimental Example 12-12); at 180° C. for 5 minutes (Experimental Example 12-13); at 180° C. for 7.5 minutes (Experimental Example 12-14); at 180° C. for 10 minutes (Experimental Example 12-15); at 190° C. for 1 minute (Experimental Example 12-16); at 190° C. for 3 minutes (Experimental Example 12-17); at 190° C. for 5 minutes (Experimental Example 12-18); and at 190° C. for 7.5 minutes (Experimental Example 12-19).

The results are given below and in the lower graphs FIGS. 3A to 3E.

(i) Weight average molecular weight and molecular weight distribution of prepared polymer Weight average molecular weight: 47,311, molecular weight distribution: 1.284 (Experimental Examples 12-2 to 12-19)

(ii) Weight average molecular weight and molecular weight distribution of polymer in resist film formed through pre-baking step Weight average molecular weight: 48,294, molecular weight distribution: 1.288 (Experimental Example 12-2)

Weight average molecular weight: 47,739, molecular weight distribution: 1.292 (Experimental Example 12-3)

Weight average molecular weight: 47,543, molecular weight distribution: 1.300 (Experimental Example 12-4)

Weight average molecular weight: 47,127, molecular weight distribution: 1.299 (Experimental Example 12-5)

Weight average molecular weight: 47,174, molecular weight distribution: 1.284 (Experimental Example 12-6)

Weight average molecular weight: 48,079, molecular weight distribution: 1.293 (Experimental Example 12-7)

Weight average molecular weight: 47,218, molecular weight distribution: 1.302 (Experimental Example 12-8)

Weight average molecular weight: 46,972, molecular weight distribution: 1.313 (Experimental Example 12-9)

Weight average molecular weight: 46,546, molecular weight distribution: 1.310 (Experimental Example 12-10)

Weight average molecular weight: 48,008, molecular weight distribution: 1.291 (Experimental Example 12-11)

Weight average molecular weight: 47,597, molecular weight distribution: 1.301 (Experimental Example 12-12)

Weight average molecular weight: 46,227, molecular weight distribution: 1.318 (Experimental Example 12-13)

Weight average molecular weight: 46,231, molecular weight distribution: 1.317 (Experimental Example 12-14)

Weight average molecular weight: 46,266, molecular weight distribution: 1.314 (Experimental Example 12-15)

Weight average molecular weight: 47,934, molecular weight distribution: 1.299 (Experimental Example 12-16)

Weight average molecular weight: 47,165, molecular weight distribution: 1.306 (Experimental Example 12-17)

Weight average molecular weight: 45,937, molecular weight distribution: 1.318 (Experimental Example 12-18)

Weight average molecular weight: 45,542, molecular weight distribution: 1.323 (Experimental Example 12-19)

(iii) Retention rate of weight average molecular weight of polymer in resist film formed through pre-baking Retention rate: 102.1%, Retention rate evaluation result: A (High retention rate: good) (Experimental Example 12-2)

Retention rate: 100.9%, Retention rate evaluation result: A (High retention rate: good) (Experimental Example 12-3)

Retention rate: 100.5%, Retention rate evaluation result: A (High retention rate: good) (Experimental Example 12-4)

Retention rate: 99.6%, Retention rate evaluation result: A (High retention rate: good) (Experimental Example 12-5)

Retention rate: 99.7%, Retention rate evaluation result: A (High retention rate: good) (Experimental Example 12-6)

Retention rate: 101.6%, Retention rate evaluation result: A (High retention rate: good) (Experimental Example 12-7)

Retention rate: 99.8%, Retention rate evaluation result: A (High retention rate: good) (Experimental Example 12-8)

Retention rate: 99.3%, Retention rate evaluation result: A (High retention rate: good) (Experimental Example 12-9)

Retention rate: 98.4%, Retention rate evaluation result: A (High retention rate: good) (Experimental Example 12-10)

Retention rate: 101.5%, Retention rate evaluation result: A (High retention rate: good) (Experimental Example 12-11)

Retention rate: 100.6%, Retention rate evaluation result: A (High retention rate: good) (Experimental Example 12-12)

Retention rate: 97.7%, Retention rate evaluation result: A (High retention rate: good) (Experimental Example 12-13)

Retention rate: 97.7%, Retention rate evaluation result: A (High retention rate: good) (Experimental Example 12-14)

Retention rate: 97.8%, Retention rate evaluation result: A (High retention rate: good) (Experimental Example 12-15)

Retention rate: 101.3%, Retention rate evaluation result: A (High retention rate: good) (Experimental Example 12-16)

Retention rate: 99.7%, Retention rate evaluation result: A (High retention rate: good) (Experimental Example 12-17)

Retention rate: 97.1%, Retention rate evaluation result: A (High retention rate: good) (Experimental Example 12-18)

Retention rate: 96.3%, Retention rate evaluation result: A (High retention rate: good) (Experimental Example 12-19)

(iv) Adhesion between resist film formed through pre-baking step and workpiece

Adhesion evaluation result: A (adhesion is good) (Experimental Examples 12-2 to 12-19)

Experimental Examples 12-20 to 12-24

"Preparation of Polymer (F6)", "Preparation of Positive Resist Composition", and "Formation of Resist Pattern" were performed and similar measurements and evaluations were made as in Experimental Example 12-1 except that the pre-baking step was performed at 140° C. for 10 minutes (Experimental Example 12-20); at 150° C. for 3 minutes (Experimental Example 12-21); at 150° C. for 5 minutes (Experimental Example 12-22); at 150° C. for 7.5 minutes (Experimental Example 12-23); and at 160° C. for 1 minute (Experimental Example 12-24). The results are given below and in the lower graphs FIGS. 3A to 3E.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 47,664, molecular weight distribution: 1.285 (Experimental Example 12-20)

Weight average molecular weight: 48,710, molecular weight distribution: 1.285 (Experimental Example 12-21)

Weight average molecular weight: 48,174, molecular weight distribution: 1.288 (Experimental Example 12-22)

Weight average molecular weight: 48,312, molecular weight distribution: 1.291 (Experimental Example 12-23)

Weight average molecular weight: 48,018, molecular weight distribution: 1.282 (Experimental Example 12-24)

(iii) Retention rate of weight average molecular weight of polymer in resist film formed through pre-baking Retention rate: 100.7%, Retention rate evaluation result: A (High retention rate: good) (Experimental Example 12-20)

Retention rate: 103.0%, Retention rate evaluation result: A (High retention rate: good) (Experimental Example 12-21)

Retention rate: 101.8%, Retention rate evaluation result: A (High retention rate: good) (Experimental Example 12-22)

Retention rate: 102.1%, Retention rate evaluation result: A (High retention rate: good) (Experimental Example 12-23)

Retention rate: 101.5%, Retention rate evaluation result: A (High retention rate: good) (Experimental Example 12-24)

(iv) Adhesion between resist film formed through pre-baking step and workpiece

Adhesion evaluation result: B (adhesion is low) (Experimental Examples 12-20 to 12-24)

Experimental Example 12-25

"Preparation of Polymer (F6)", "Preparation of Positive Resist Composition", and "Formation of Resist Pattern" were performed and similar measurements and evaluations were made as in Experimental Example 12-1 except that the pre-baking step was performed at 190° C. for 10 minutes. The results are given below and in the lower graphs FIGS. 3A to 3E.

(i) Weight average molecular weight and molecular weight distribution of prepared polymer Weight average molecular weight: 47,311, molecular weight distribution: 1.284

(ii) Weight average molecular weight and molecular weight distribution of polymer in resist film formed through pre-baking step Weight average molecular weight: 45,219, molecular weight distribution: 1.323

(iii) Retention rate of weight average molecular weight of polymer in resist film formed through pre-baking Retention rate: 95.6%, Retention rate evaluation result: B (Retention rate: low)

(iv) Adhesion between resist film formed through pre-baking step and workpiece

Adhesion evaluation result: A (adhesion is good)

From FIGS. 2A to 2E, it can be seen that the positive resist compositions containing a predetermined polymer (F5) having predetermined monomer units and at least one solvent selected from the group consisting of isoamyl acetate, n-butyl formate, isobutyl formate, n-amyl formate, and isoamyl formate (upper graphs in FIGS. 2A to 2E: Examples 1, 3, 5, 7, 9) can improve the adhesion between a resist film formed through pre-baking and a workpiece and reduce changes in the molecular weight of the polymer in the resist film before and after pre-baking over broader ranges of pre-baking temperature T and pre-baking time t (at lower heating temperatures T) compared to the positive resist compositions containing a predetermined polymer (F5) having predetermined monomers unit and n-hexyl acetate (lower graphs in FIGS. 2A to 2E: Comparative Example 1).

From FIGS. 3A to 3E, it can be seen that the positive resist compositions containing a predetermined polymer (F6) having predetermined monomer units and at least one solvent selected from the group consisting of isoamyl acetate, n-butyl formate, isobutyl formate, n-amyl formate, and isoamyl formate (upper graphs in FIGS. 3A to 3E: Examples 2, 4, 6, 8, 10) can improve the adhesion between a resist film formed through pre-baking and a workpiece and reduce changes in the molecular weight of the polymer in the resist film before and after pre-baking over broader ranges of pre-baking temperature T and pre-baking time t (at lower heating temperatures T) compared to the positive resist compositions containing a predetermined polymer (F5) having predetermined monomers unit and n-hexyl acetate (lower graphs in FIGS. 2A to 2E: Comparative Example 1).

INDUSTRIAL APPLICABILITY

According to the positive resist composition of the present disclosure, it is possible to improve the adhesion between a resist film formed through pre-baking and a workpiece and reduce changes in the molecular weight of the polymer in the resist film before and after pre-baking over broader ranges of heating temperature and heating time (at lower heating temperatures) during pre-baking.

According to the resist film formation method of the present disclosure, it is possible to improve the adhesion between a resist film formed through pre-baking and a workpiece and reducing changes in the molecular weight of the polymer in the resist film before and after pre-baking.

According to the laminate manufacturing method of the present disclosure, it is possible improve the adhesion between a resist film formed through pre-baking and a light-shielding layer and prevent reductions in the molecular weight of the polymer in the resist film.

The invention claimed is:

1. A resist film formation method for forming a resist film using a positive resist composition, the method comprising:
   a coating step wherein the positive resist composition is applied onto a workpiece; and
   a pre-baking step wherein the positive resist composition applied is heated,
   wherein heating in the pre-baking step is performed at temperature T (° C.) for time t (min) which meet the following Expression:

$(-\frac{1}{4}) \times T + 32.5 \leq t < (-\frac{7}{10}) \times T + 115$, where the time t is 5 minutes or more;
   the positive resist composition comprises a polymer and a solvent, the polymer comprising a monomer unit (A) represented by the following general formula (I) and a monomer unit (B) represented by the following general formula (II):

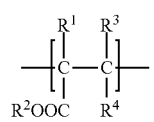

(I)

where $R^1$ is a chlorine atom, a fluorine atom or an alkyl group substituted with a fluorine atom, $R^2$ is an unsubstituted alkyl group or an alkyl group substituted with a fluorine atom, and $R^3$ and $R^4$ are a hydrogen atom, a fluorine atom, an unsubstituted alkyl group or an alkyl group substituted with a fluorine atom and may be the same or different,

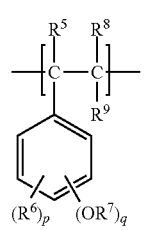

(II)

where $R^5$, $R^6$, $R^8$ and $R^9$ are a hydrogen atom, a fluorine atom, an unsubstituted alkyl group or an alkyl group substituted with a fluorine atom and may be the same or different, $R^7$ is a hydrogen atom, an unsubstituted alkyl group or an alkyl group substituted with a fluorine atom, p and q are an integer of 0 or more and 5 or less, and p+q=5;

at least one of the monomer unit (A) and the monomer unit (B) has one or more fluorine atoms; and the solvent is at least one selected from the group consisting of isoamyl acetate, n-butyl formate, isobutyl formate, n-amyl formate, and isoamyl formate.

2. The resist film formation method of claim 1, wherein the time is 30 minutes or less.

3. A laminate manufacturing method for manufacturing a laminate which comprises a substrate, a light-shielding layer formed on the substrate, and a resist film formed on the light-shielding layer, wherein the resist film is formed by the resist film formation method of claim 1.

4. The resist film formation method of claim 1, wherein $R^1$ is a chlorine atom.

5. The resist film formation method of claim 4, wherein $R^2$ is an alkyl group substituted with a fluorine atom, and $R^3$ and $R^4$ are a hydrogen atom or an unsubstituted alkyl group and may be the same or different.

6. The resist film formation method of claim 1, wherein p is an integer of 1 or more and 5 or less, $R^5$ and $R^7$ to $R^9$ are a hydrogen atom or an unsubstituted alkyl group, and the monomer unit (A) has one or more fluorine atoms.

7. The resist film formation method of claim 6, wherein the number of the fluorine atoms in the monomer unit (B) is 0 or 1.

8. The resist film formation method of claim 1, wherein $R^2$ is a pentafluoroalkyl group.

9. The resist film formation method of claim 8, wherein $R^2$ is 2,2,3,3,3-pentafluoropropyl group.

10. The resist film formation method of claim 1, wherein the monomer unit (B) is a structural unit derived from α-methylstyrene or a structural unit derived from 4-fluoro-α-methyl styrene.

* * * * *